(12) United States Patent
Matsubayashi

(10) Patent No.: US 10,068,906 B2
(45) Date of Patent: Sep. 4, 2018

(54) SEMICONDUCTOR DEVICE INCLUDING OXIDE SEMICONDUCTOR TRANSISTORS WITH LOW POWER CONSUMPTION

(71) Applicant: Semiconductor Energy Laboratory Co., Ltd., Atsugi-shi, Kanagawa-ken (JP)

(72) Inventor: Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/090,674

(22) Filed: Apr. 5, 2016

(65) Prior Publication Data

US 2016/0218106 A1 Jul. 28, 2016

Related U.S. Application Data

(63) Continuation of application No. 14/179,892, filed on Feb. 13, 2014, now Pat. No. 9,318,484.

(30) Foreign Application Priority Data

Feb. 20, 2013 (JP) .................................. 2013-030587

(51) Int. Cl.
*H01L 27/105* (2006.01)
*H01L 27/06* (2006.01)
(Continued)

(52) U.S. Cl.
CPC ........ *H01L 27/105* (2013.01); *H01L 27/0629* (2013.01); *H01L 27/1207* (2013.01);
(Continued)

(58) Field of Classification Search
CPC ............. H01L 27/1207; H01L 27/1225; H01L 27/1255; H01L 27/0629; H01L 29/7869; H01L 29/16; H01L 29/78; H01L 27/105
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid—Cholesteric Liquid Crystal Transition:The "Blue Phase"", Physics Letters, Sep. 10, 1973, vol. 45A, No. 2, pp. 115-116.

(Continued)

*Primary Examiner* — Benjamin Sandvik
*Assistant Examiner* — Farid Khan
(74) *Attorney, Agent, or Firm* — Fish & Richardson P.C.

(57) ABSTRACT

The semiconductor device of the present invention comprises first and second transistors and first and second capacitors. One of source and drain electrodes of the first transistor is electrically connected to a first wiring, the other is electrically connected to a second wiring, and a gate electrode of the first transistor is electrically connected to one of a source electrode and a drain electrode of the second transistor and one of electrodes of the first capacitor. The other of the source and drain electrodes of the second transistor is electrically connected to the first wiring, and a gate electrode of the second transistor is electrically connected to one of electrodes of a second capacitor and a fifth (Continued)

wiring. The other electrode of the first capacitor is electrically connected to a third wiring, and the other electrode of the second capacitor is eclectically connected to a fourth wiring.

14 Claims, 31 Drawing Sheets

(51) Int. Cl.
    *H01L 27/12*     (2006.01)
    *H01L 29/16*     (2006.01)
    *H01L 29/78*     (2006.01)
    *H01L 29/786*     (2006.01)

(52) U.S. Cl.
    CPC ...... *H01L 27/1225* (2013.01); *H01L 27/1255* (2013.01); *H01L 29/16* (2013.01); *H01L 29/78* (2013.01); *H01L 29/7869* (2013.01)

(56) References Cited

U.S. PATENT DOCUMENTS

| | | |
|---|---|---|
| 6,294,274 B1 | 9/2001 | Kawazoe et al. |
| 6,445,026 B1 | 9/2002 | Kubota et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,237,166 B2 | 8/2012 | Kumomi et al. |
| 8,385,105 B2 | 2/2013 | Saito |
| 8,537,600 B2 | 9/2013 | Matsubayashi |
| 8,692,252 B2 | 4/2014 | Takata et al. |
| 8,737,109 B2 | 5/2014 | Yamazaki et al. |
| 8,947,158 B2 | 2/2015 | Watanabe |
| 9,024,317 B2 | 5/2015 | Endo et al. |
| 9,443,880 B2 | 9/2016 | Saito et al. |
| 9,659,653 B2 | 5/2017 | Saito |
| 9,735,179 B2 | 8/2017 | Endo et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296660 A1 | 12/2007 | Kimura et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0090183 A1 | 4/2011 | Yamazaki et al. |
| 2011/0090184 A1* | 4/2011 | Yamazaki ............... G09G 3/20 345/204 |
| 2011/0176355 A1* | 7/2011 | Furutani ............... G11C 11/403 365/149 |
| 2011/0186837 A1* | 8/2011 | Takahashi .......... G11C 16/0433 257/43 |
| 2011/0194331 A1* | 8/2011 | Kawae ................ G11C 11/405 365/149 |
| 2011/0194332 A1 | 8/2011 | Saito |
| 2011/0199807 A1* | 8/2011 | Saito .................... G11C 11/405 365/72 |
| 2011/0204928 A1* | 8/2011 | Umezaki ............. H01L 27/1225 327/109 |
| 2011/0216571 A1 | 9/2011 | Yamazaki et al. |
| 2012/0032161 A1 | 2/2012 | Matsubayashi |
| 2012/0032164 A1* | 2/2012 | Ohnuki .............. G11C 16/0433 257/43 |
| 2012/0032171 A1 | 2/2012 | Saito et al. |
| 2012/0051118 A1* | 3/2012 | Yamazaki ............... G11C 16/02 365/149 |
| 2012/0104480 A1 | 5/2012 | Matsubayashi et al. |
| 2012/0161139 A1* | 6/2012 | Endo .................... G09G 3/3648 257/59 |

(56) References Cited

U.S. PATENT DOCUMENTS

| | | | |
|---|---|---|---|
| 2012/0228688 | A1 | 9/2012 | Matsubayashi |
| 2012/0236634 | A1* | 9/2012 | Matsubayashi ..... H01L 27/0688 365/182 |
| 2012/0262979 | A1 | 10/2012 | Matsubayashi |
| 2012/0292614 | A1* | 11/2012 | Matsubayashi ........ G11C 15/04 257/43 |
| 2012/0314470 | A1* | 12/2012 | Matsubayashi ........ G11C 15/04 365/72 |
| 2013/0134413 | A1 | 5/2013 | Yamazaki et al. |
| 2013/0161611 | A1 | 6/2013 | Yamazaki et al. |
| 2013/0181214 | A1 | 7/2013 | Yamazaki et al. |
| 2013/0187150 | A1 | 7/2013 | Yamazaki et al. |
| 2013/0200376 | A1 | 8/2013 | Yamazaki et al. |
| 2013/0264574 | A1 | 10/2013 | Kimura et al. |
| 2013/0270552 | A1 | 10/2013 | Yamazaki et al. |
| 2013/0285047 | A1 | 10/2013 | Yamazaki et al. |
| 2014/0151691 | A1 | 6/2014 | Matsubayashi et al. |
| 2014/0226401 | A1 | 8/2014 | Yamazaki et al. |
| 2015/0149795 | A1 | 5/2015 | Watanabe |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-044297 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-124360 A | 6/2011 |
| JP | 2011-141522 A | 7/2011 |
| JP | 2011-181905 A | 9/2011 |
| JP | 2012-146965 A | 8/2012 |
| JP | 2012-256817 A | 12/2012 |
| WO | WO-2004/114391 | 12/2004 |
| WO | WO-2011/096262 | 8/2011 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al.,"Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technolog", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE INCLUDING OXIDE SEMICONDUCTOR TRANSISTORS WITH LOW POWER CONSUMPTION

CROSS-REFERENCE TO RELATED APPLICATIONS

This application is a continuation of U.S. application Ser. No. 14/179,892, filed Feb. 13, 2014, now allowed, which claims the benefit of a foreign priority application filed in Japan as Serial No. 2013-030587 on Feb. 20, 2013, both of which are incorporated by reference.

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

In this specification, a semiconductor device generally means a device which can function by utilizing semiconductor characteristics. An electro-optical device, a semiconductor circuit, and an electric device may be included in a semiconductor device or may include a semiconductor device.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide semiconductor containing indium (In), gallium (Ga), and zinc (Zn) is disclosed in Patent Document 1.

In addition, as disclosed in Patent Document 2, a transistor including an oxide semiconductor has an advantage of extremely low off-state current.

REFERENCE

Patent Document

[Patent Document 1] Japanese Published Patent Application No. 2006-165528
[Patent Document 2] Japanese Published Patent Application No. 2011-141522

SUMMARY OF THE INVENTION

In general, formation of highly-integrated circuit requires miniaturization of a transistor. It is known that miniaturization of a transistor causes deterioration of electrical characteristics of the transistor, such as threshold voltage and an S value (subthreshold value). When the threshold voltage is lowered, a current at which the gate voltage is 0V (the current is also referred to as Icut) is increased, which might lead to an increase of power consumption of a semiconductor device or the loss of characteristics derived from the low Icut.

As measures against the above problem, the following structure is considered: an active layer is provided between an upper gate electrode and a lower gate electrode with insulating films provided between the active layer and the gate electrodes, and one gate electrode is used to control the operation and the other gate electrode is used to control the threshold voltage. In the case where the active layer is an oxide semiconductor layer, a thick oxide insulating film is preferably formed between the other gate electrode layer and the active layer in order to supply a larger amount of oxygen to the active layer. Thus, there has been a problem in that the absolute value of the potential of the other gate electrode is made high so as to adjust the threshold voltage to be a desired value.

In view of the above, an object of one embodiment of the present invention is to provide a semiconductor device having a structure which can prevent a reduction in electrical characteristics which becomes more significant with miniaturization of a transistor. Another object of one embodiment of the present invention is to provide a semiconductor device with low power consumption. Another object of one embodiment of the present invention is to provide a semiconductor device with high reliability. Another object of one embodiment of the present invention is to provide a semiconductor device in which a lowering in threshold voltage is suppressed. Another object of one embodiment of the present invention is to provide a semiconductor device which can retain data even when power supply is stopped. Another object of one embodiment of the present invention is to provide an eye-friendly semiconductor device or the like. Further, another object is to provide a novel semiconductor device or the like.

Note that the descriptions of these objects do not disprove the existence of other objects. In one embodiment of the present invention, there is no need to achieve all the objects. Other objects will be apparent from and can be derived from the description of the specification, the drawings, the claims, and the like.

One embodiment of the present invention relates to a semiconductor device in which a potential for controlling the threshold voltage is supplied to a capacitor electrically connected to a gate electrode of a transistor.

One embodiment of the present invention is a semiconductor device including a first transistor, a second transistor, a first capacitor, and a second capacitor. In the semiconductor device, one of a source electrode and a drain electrode of the first transistor is electrically connected to a first wiring, the other of the source electrode and the drain electrode of the first transistor is electrically connected to a second wiring, a gate electrode of the first transistor is electrically connected to one of a source electrode and a drain electrode of the second transistor and one of electrodes of the first capacitor, the other of the source electrode and the drain electrode of the second transistor is electrically connected to the first wiring, a gate electrode of the second transistor is electrically connected to one of electrodes of the second capacitor and a fifth wiring, the other electrode of the first capacitor is electrically connected to a third wiring, and the other electrode of the second capacitor is electrically connected to a fourth wiring.

Note that in this specification and the like, ordinal numbers such as "first" and "second" are used in order to avoid confusion among components and do not limit the components numerically.

The second transistor includes an oxide semiconductor layer, the source electrode and the drain electrode in contact with the oxide semiconductor layer, a gate insulating film in contact with the oxide semiconductor layer and the source and drain electrodes, and the gate electrode overlapping with the oxide semiconductor layer with the gate insulating film positioned therebetween.

Another embodiment of the present invention is a semiconductor device including a transistor, a first capacitor, and a second capacitor. In the semiconductor device, one of a source electrode and a drain electrode of the transistor is electrically connected to a first wiring, the other of the source electrode and the drain electrode of the transistor is electrically connected to one of electrodes of the first capacitor, a gate electrode of the transistor is electrically connected to one of electrodes of the second capacitor and a fourth wiring, the other electrode of the first capacitor is electrically connected to a second wiring, and the other electrode of the second capacitor is electrically connected to a third wiring.

The transistor includes an oxide semiconductor layer, the source electrode and the drain electrode in contact with the oxide semiconductor layer, a gate insulating film in contact with the oxide semiconductor layer and the source and drain electrodes, and the gate electrode overlapping with the oxide semiconductor layer with the gate insulating film positioned therebetween.

In the semiconductor devices according to the above two embodiments, the oxide semiconductor layer may be a stacked layer in which a third oxide semiconductor layer, a second oxide semiconductor layer, and a first oxide semiconductor layer are stacked in this order on the gate insulating film side.

In the above stacked oxide semiconductor layer, it is preferable that a bottom of a conduction band of each of the first oxide semiconductor layer and the third oxide semiconductor layer be closer to a vacuum level than a bottom of a conduction band of the second oxide semiconductor layer is, by 0.05 eV or more and 2 eV or less.

It is preferable that the first oxide semiconductor layer, the second oxide semiconductor layer, and the third oxide semiconductor layer each include In-M-Zn oxide (M is Al, Ti, Ga, Y, Zr, La, Ce, Nd, or Hf), and that an atomic ratio of M with respect to In in each of the first oxide semiconductor layer and the third oxide semiconductor layer be higher than an atomic ratio of M with respect to In in the second oxide semiconductor layer.

According to one embodiment of the present invention, a semiconductor device can be provided in which deterioration of electrical characteristics which becomes more noticeable as the transistor is miniaturized can be suppressed. Alternatively, a semiconductor device with low power consumption can be provided. Alternatively, a highly reliable semiconductor device can be provided. Alternatively, a semiconductor device in which a lowering in an S value (subthreshold value) is suppressed can be provided. Alternatively, a semiconductor device in which a lowering in a threshold voltage is suppressed can be provided. Alternatively, a semiconductor device which can retain data even when power supply is stopped can be provided. Alternatively, an eye-friendly semiconductor device or the like can be provided. Alternatively, a novel semiconductor device or the like can be provided.

Note that the descriptions of these effects do not disprove existence of other effects. Note that one embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1:
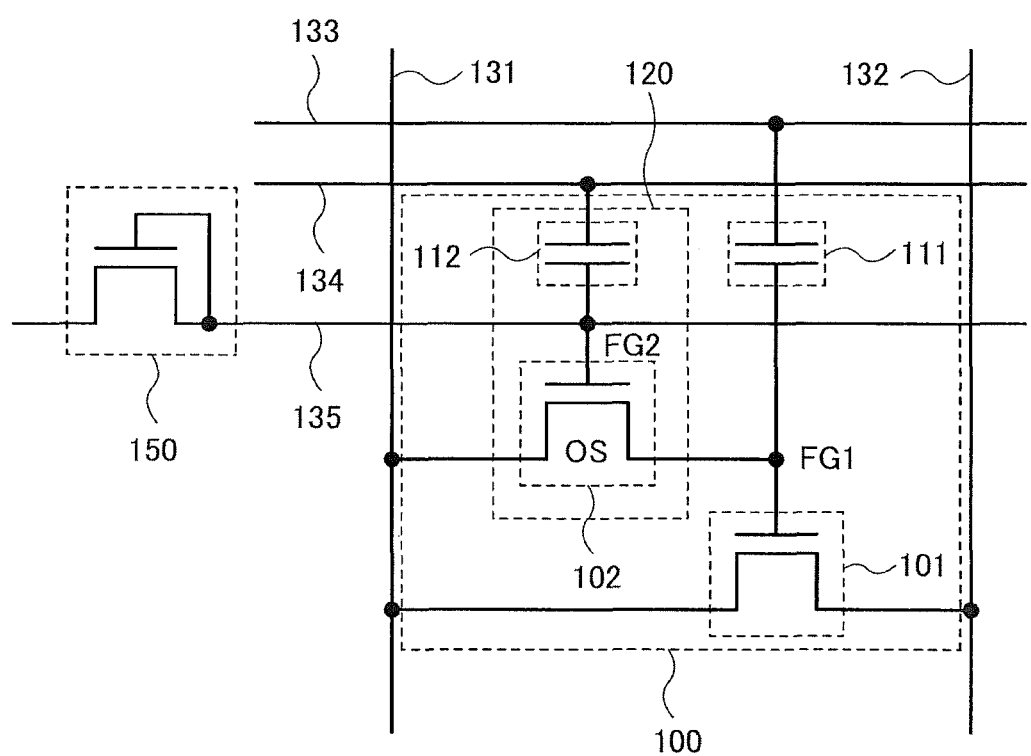
FIG. 1 is a circuit diagram of a semiconductor device.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that in this specification and the like, when it is explicitly described that X and Y are connected, the case where X and Y are electrically connected, the case where X and Y are functionally connected, and the case where X and Y are directly connected are included therein. Here, X and Y each denote an object (e.g., a device, an element, a circuit, a line, an electrode, a terminal, a conductive film, a layer, or the like). Accordingly, a connection relation other than connection relations illustrated in drawings and texts is also included, without limitation to a predetermined connection relation, for example, the connection relations illustrated in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, the switch has a function of determining whether current flows or not by being turning on or off (becoming an on state and an off state). Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that, for example, in the case where a signal output from X is transmitted to Y even when another circuit is interposed between X and Y, X and Y are functionally connected.

Note that when it is explicitly described that X and Y are connected, the case where X and Y are electrically connected (i.e., the case where X and Y are connected with another element or another circuit positioned therebetween), the case where X and Y are functionally connected (i.e., the case where X and Y are functionally connected with another circuit positioned therebetween), and the case where X and Y are directly connected (i.e., the case where X and Y are connected without another element or another circuit positioned therebetween) are included therein. That is, when it is explicitly described that "A and B are electrically connected", the description is the same as the case where it is explicitly only described that "A and B are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. For an attachment film, polypropylene, polyester, polyvinyl fluoride, polyvinyl chloride, or the like can be used, for example. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with use of such a transistor, power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability can be formed, heat resistance can be provided, or reduction in weight or thickness can be achieved.

Embodiment 1

In this embodiment, an example of a semiconductor device (memory device) which can hold stored data even when not powered, and which has an unlimited number of write cycles will be described with reference to drawings.

FIG. 1 is a circuit diagram of a semiconductor device of one embodiment of the present invention.

A semiconductor device 100 illustrated in FIG. 1 includes a first transistor 101, a second transistor 102, a first capacitor 111, and a second capacitor 112. One of a source electrode and a drain electrode of the first transistor 101 is electrically connected to a first wiring 131, the other of the source electrode and the drain electrode of the first transistor is electrically connected to a second wiring 132, and a gate electrode of the first transistor is electrically connected to one of a source electrode and a drain electrode of the second transistor 102 and one of electrodes of the first capacitor 111.

The other of the source electrode and the drain electrode of the second transistor 102 is electrically connected to the first wiring 131, and a gate electrode of the second transistor is electrically connected to one of electrodes of the second capacitor 112 and a fifth wiring 135. The other electrode of the first capacitor 111 is electrically connected to a third wiring 133. The other electrode of the second capacitor 112 is electrically connected to a fourth wiring 134.

The first transistor 101 and the second transistor 102 are preferably formed using materials of channel formation regions having band gaps different from each other. For example, the first transistor 101 can be formed using a semiconductor material other than an oxide semiconductor (the material is silicon or the like), and the second transistor 102 can be formed using an oxide semiconductor. The transistor including a material other than an oxide semiconductor (e.g., using crystalline silicon) can operate at high speed. On the other hand, a transistor including an oxide semiconductor enables charge to be held for a long time owing to its electrical characteristics, that is, the low off-state current. Note that both the first transistor 101 and the second transistor 102 may include an oxide semiconductor. Alternatively, both the first transistor 101 and the second transistor 102 may include a semiconductor material other than an oxide semiconductor (e.g., include silicon or the like).

Although all the transistors are n-channel transistors here, p-channel transistors can also be used. The specific structure of the semiconductor device, such as the material used for the semiconductor device and the structure of the semiconductor device, is not necessarily limited to those described here except for the use of the transistor, which is formed using an oxide semiconductor for holding data.

The first wiring 131 can have a function of a bit line. The second wiring 132 can have a function of a reference potential line. The third wiring 133 can have a function of a word line for reading data. The fourth wiring 134 can have a function of a word line for writing data. The fifth wiring 135 can have a function of supplying a potential to a node FG2.

Note that in this embodiment, the one of the source electrode and the drain electrode of the first transistor 101 and the other of the source electrode and the drain electrode of the second transistor 102 are connected to the first wiring 131. However, either one of the electrodes of the first transistor 101 and the second transistor 102 may be electrically connected to a sixth wiring (not shown). In this case, part of a function of the first wiring 131 is performed by the sixth wiring.

The semiconductor device illustrated in FIG. 1, which is one embodiment of the present invention, includes a circuit 120 including the second transistor 102 and the second capacitor 112.

Figure 2A:
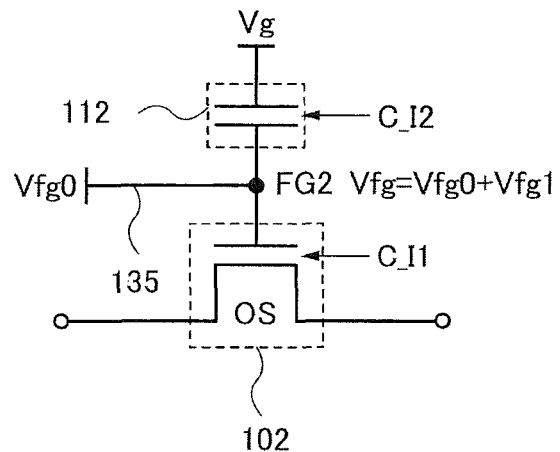
FIGS. 2A and 2B are a circuit diagram of a semiconductor device and a graph showing $I_d$-$V_g$ characteristics of the semiconductor device.

The circuit 120 is described with reference to FIG. 2A. In this embodiment, the second transistor 102 is a transistor whose channel formation region is formed using an oxide semiconductor and off-state current is extremely low. For example, in the case where the voltage between the source and the drain is set to about 0.1 V, 5 V, or 10 V, the off-state current standardized on the channel width of the transistor can be as low as several zeptoamperes per micrometer to several yoctoamperes per micrometer.

The gate electrode of the second transistor 102 is electrically connected to the one of electrodes of the second capacitor 112 and the fifth wiring 135. The fifth wiring 135 is a wiring having a function of injecting charge into the node FG2, and the potential of the node FG2 is represented as follows: $V_{fg}=V_{fg0}+V_{fg1}$. Here, $V_{fg0}$ is the potential due to the charge injection. In the case of the positive charge, $V_{fg}>0$ V, and in the case of the negative charge, $V_{fg}<0$ V. Further, $V_{fg1}$ is the potential by capacitive coupling with the potential $V_g$ applied to the other electrode of the second capacitor 112 and can be represented by the following formula: $V_{fg1}=(C\_I2/C\_T)V_g$. $C\_T$ is the sum of capacitances of the node FG2 and those of the portion around the node FG2 and represented by $C\_T=C\_I1+C\_I2+x$. $C\_I1$ is a capacitance of a gate insulating film between the node FG2 and an active layer (oxide semiconductor layer) of the second transistor 102, and $C\_I2$ is a capacitance between the node FG2 and the other electrode of the second capacitor 112. Further, x includes parasitic capacitance between the node FG2 and the source or drain electrode of the second transistor 102.

Figure 2B:
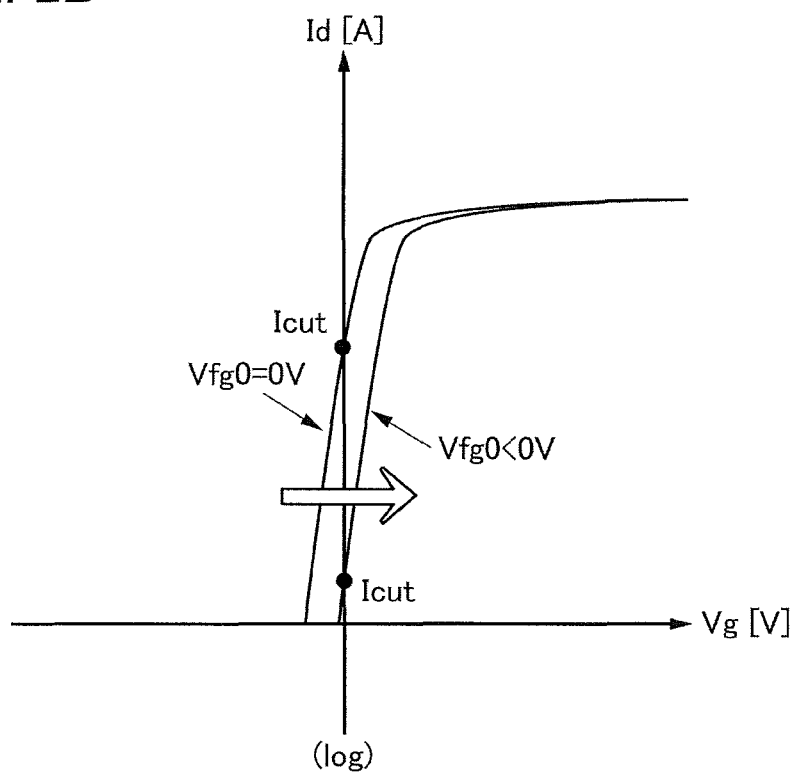

In the case where the Id-$V_g$ characteristics of the transistor are such that Icut at the time of supplying $V_{fg0}$ (0 V) to the fifth wiring 135 is high as shown in FIG. 2B, the threshold voltage can be shifted in the positive direction by supplying the negative voltage ($V_{fg0}<0$ V) to the fifth wiring 135, i.e., injecting a negative charge to the node FG2, and Icut can be reduced accordingly.

In order to inject charge to the node FG2 and fix the charge, any of the following methods may be used: a method for utilizing non-linear characteristics or switching characteristics of a semiconductor element 150 such as a diode, a transistor, or a diode-connected transistor, which is connected to the fifth wiring 135; a method for using the tunnel current through a gate insulating film as in a flash memory; and the like. Note that FIG. 1 shows an example in which as the semiconductor element 150, a diode-connected enhancement transistor is connected to the fifth wiring 135. In this case, the transistor is preferably a transistor in which a channel formation region is formed using an oxide semiconductor so that the amount of the off-state current is small. In addition, after the charge is injected to the node FG2, the semiconductor element 150 and the fifth wiring 135 may be electrically disconnected, so that the amount of leakage of charge from the node FG2 is suppressed.

As a conventional method for controlling the threshold voltage of a transistor, it is known that the transistor is formed to have a structure in which gate electrodes are provided over and below an active layer with insulating films positioned therebetween and that one of the gate electrodes is used to control the operation and the other gate electrode is used to control the threshold voltage.

In the case where the active layer is an oxide semiconductor layer, for an improvement in electrical characteristics and reliability of the transistor, it is important to supply oxygen to the oxide semiconductor layer which has been an n-type layer due to oxygen vacancy to be highly purified to be intrinsic. Thus, it is preferable that a thick oxide insulating film be formed between the other gate electrode and the active layer so as to supply more oxygen to the active layer. Therefore, in the case where the thick oxide insulating film is formed between the other gate electrode and the active layer, the potential with a large absolute value needs to be supplied to the other gate electrode in order to adjust the threshold voltage to be a desired value.

In one embodiment of the present invention, a structure for controlling the threshold voltage is provided on one side of the active layer of the transistor, accordingly, an oxide insulating film with a desired thickness can be formed on the other side of the active layer. Thus, in the case where an oxide semiconductor layer is used as the active layer, oxygen can be sufficiently added to the oxide semiconductor layer. Further, the gate insulating film can be formed to be thin; in the case where the amount of charges injected to the node FG2 is small, the threshold voltage can be sufficiently shifted.

A method for controlling the threshold voltage of the transistor in one embodiment of the present invention enables correction of a fluctuation in electric characteristics of the semiconductor device due to long-term use as well as correction of variation in electric characteristics of the semiconductor devices. In addition, the method for controlling the threshold voltage of the transistor in one embodiment of the present invention can be applied to all semiconductor devices in which field effect transistors are used as switching elements, regardless of the type of semiconductor devices.

The semiconductor device 100 in FIG. 1 utilizes a characteristic in which the potential of the gate electrode of the first transistor 101 can be held, and thus can write, hold, and read data as described below.

Writing and holding of data will be described. First, the potential of the fourth wiring 134 is set to a potential at which the second transistor 102 is turned on, so that the second transistor 102 is turned on. At this time, the potential of the fifth wiring 135 may be 0 V or a potential which makes the threshold voltage low, e.g., a negative potential. When the potential which makes the threshold voltage low is supplied to the fifth wiring 135, the potential supplied to the fourth wiring 134, at which the second transistor 102 is turned on, can be made low. Alternatively, the on-state current can be increased. Thus, a lowering of the operation voltage or an increase in the writing speed of the semiconductor device 100 can be achieved.

By the above operation, the potential of the first wiring 131 is supplied to the gate electrode of the first transistor 101 and the first capacitor 111. In other words, a predetermined charge is supplied to a node FG1 (data writing). Here, a charge for supplying either of two different potential levels (hereinafter referred to as low-level charge and high-level charge) is given.

After that, the potential of the fourth wiring 134 is set to a potential at which the second transistor 102 is turned off, so that the second transistor 102 is turned off. Thus, the charge given to the node FG1 is held (data holding). Since the amount of off-state current of the second transistor 102 in an off state is extremely small, the charge in the node FG1 is held for a long time. In this state, the potential of the fourth wiring 134 and the potential of the fifth wiring 135 are adjusted so that the current value of the second transistor 102 in an off state is much smaller, whereby the amount of leakage of charge from the node FG1 can be made smaller, which enables data to be held for a long time. For example, in the case where the potential of the fifth wiring 135 is adjusted so that Icut is low as much as possible, the potential of the fourth wiring 134 is preferably 0 V.

Next, reading of data will be described. When an appropriate potential (reading potential) is supplied to the third wiring 133 while a predetermined potential (fixed potential) is supplied to the second wiring 132, the potential of the first wiring 131 varies depending on the amount of charge held in the node FG1. This is generally because when the first transistor 101 is an n-channel transistor, apparent threshold voltage $V_{th\_H}$ in the case where a high-level charge is supplied to the gate electrode of the first transistor 101 (the node FG1) is lower than apparent threshold voltage $V_{th\_L}$ in the case where a low-level charge is supplied to the gate electrode of the first transistor 101 (the node FG1). Here, the apparent threshold voltage refers to the potential of the third wiring 133 needed to turn on the first transistor 101. Thus, the potential of the third wiring 133 is set to a potential $V_0$ that is between $V_{th\_H}$ and $V_{th\_L}$, whereby charge supplied to the gate electrode (node FG1) of the first transistor 101 can be determined. For example, in the case where the high-level electric charge is given in writing, when the potential of the third wiring 133 is set to $V_0$ ($>V_{th\_H}$), the first transistor 101 is turned on. In the case where a low level charge is given in writing, even when the potential of the third wiring 133 is set to $V_0$ ($<V_{th\_L}$), the first transistor 101 remains in an off state. Therefore, the stored data can be read by determining the potential of the first wiring 131.

Note that in the case where memory cells are arrayed to be used, only data of desired memory cells needs to be read. The third wiring 133 of memory cells from which data is not read may be supplied with a potential at which the first transistor 101 is turned off regardless of the state of the potential supplied to the gate electrode, that is, a potential lower than $V_{th\_H}$. Alternatively, the third wiring 133 is supplied with a potential at which the first transistor 101 is turned on regardless of the potential supplied to the gate electrode, that is, a potential higher than $V_{th\_L}$.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed). Note that power may be supplied while the stored data is held.

In the above driving method, a high voltage is not needed for wiring data to the node FG1, and a problem such as deterioration of the first transistor 101 does not occur. For example, unlike a conventional nonvolatile memory, it is not necessary to inject and extract electrons into and from a floating gate by application of high voltage, and thus a problem such as deterioration of a gate insulating film of the first transistor 101 or the like does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

Figure 3A:
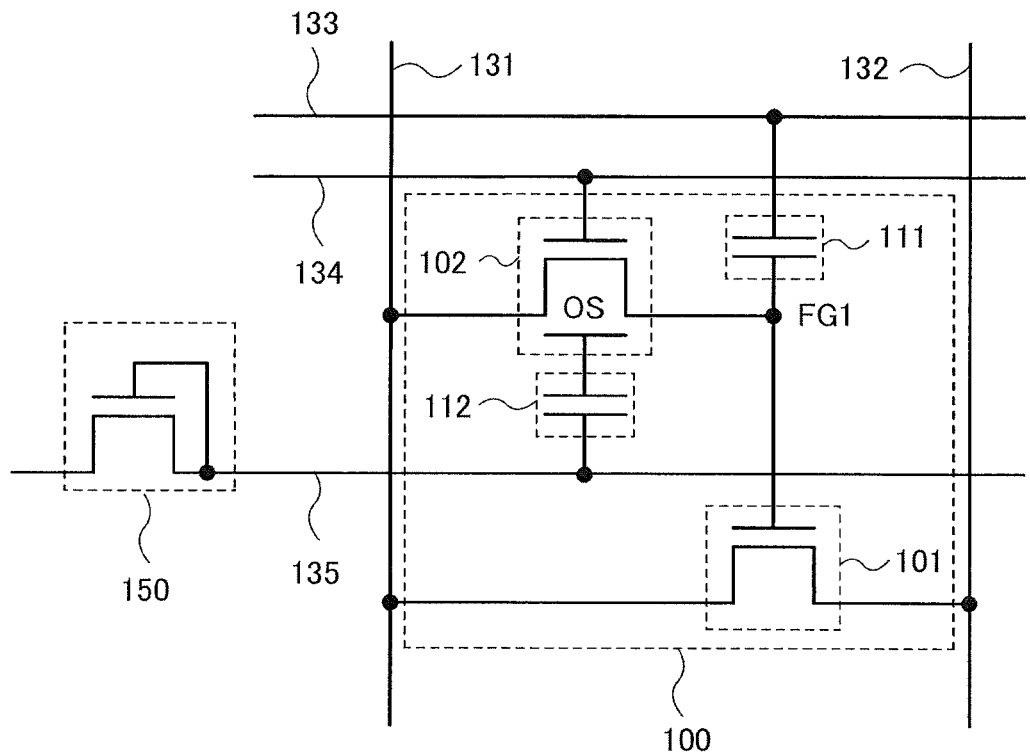
FIGS. 3A and 3B are each a circuit diagram of a semiconductor device.

Note that in terms of a control of the threshold voltage of the second transistor 102 by injecting charge to the gate electrode of the transistor, a structure illustrated in FIG. 3A may employed, in which a second gate electrode is provided on the back channel side of the second transistor 102, one of electrodes of the second capacitor 112 is electrically connected to the second gate electrode, and the other electrode of the second capacitor 112 is electrically connected to the fifth wiring 135. Alternatively, as illustrated in FIG. 3B, a structure in which the second gate electrode is electrically connected to the fifth wiring 135 without providing the second capacitor 112 may be employed.

Figure 4:
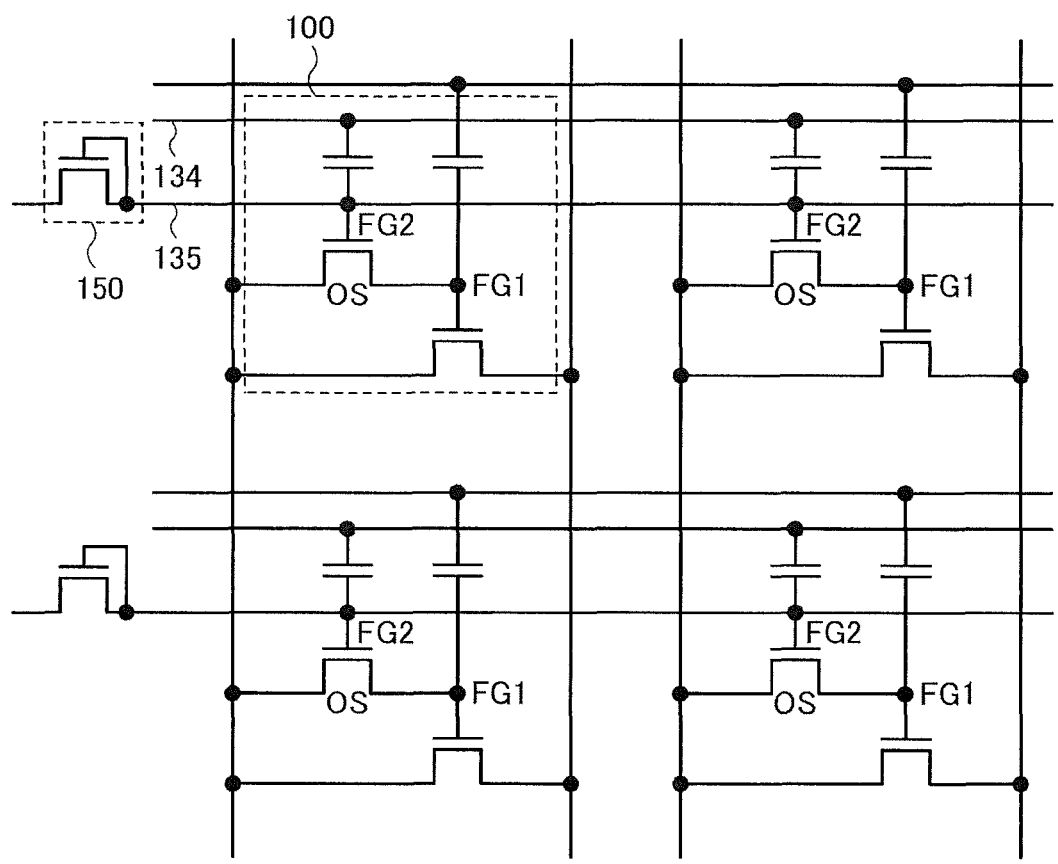
FIG. 4 is a circuit diagram of a semiconductor device.

Further, in the case where a plurality of semiconductor devices 100 are arranged in matrix, the semiconductor element 150 and the fifth wiring 135 are shared with the plurality of semiconductor devices 100 on each row as illustrated in FIG. 4, whereby the potentials of the nodes FG2 of the semiconductor devices 100 can be switched at approximately the same time on each row.

Figure 5:
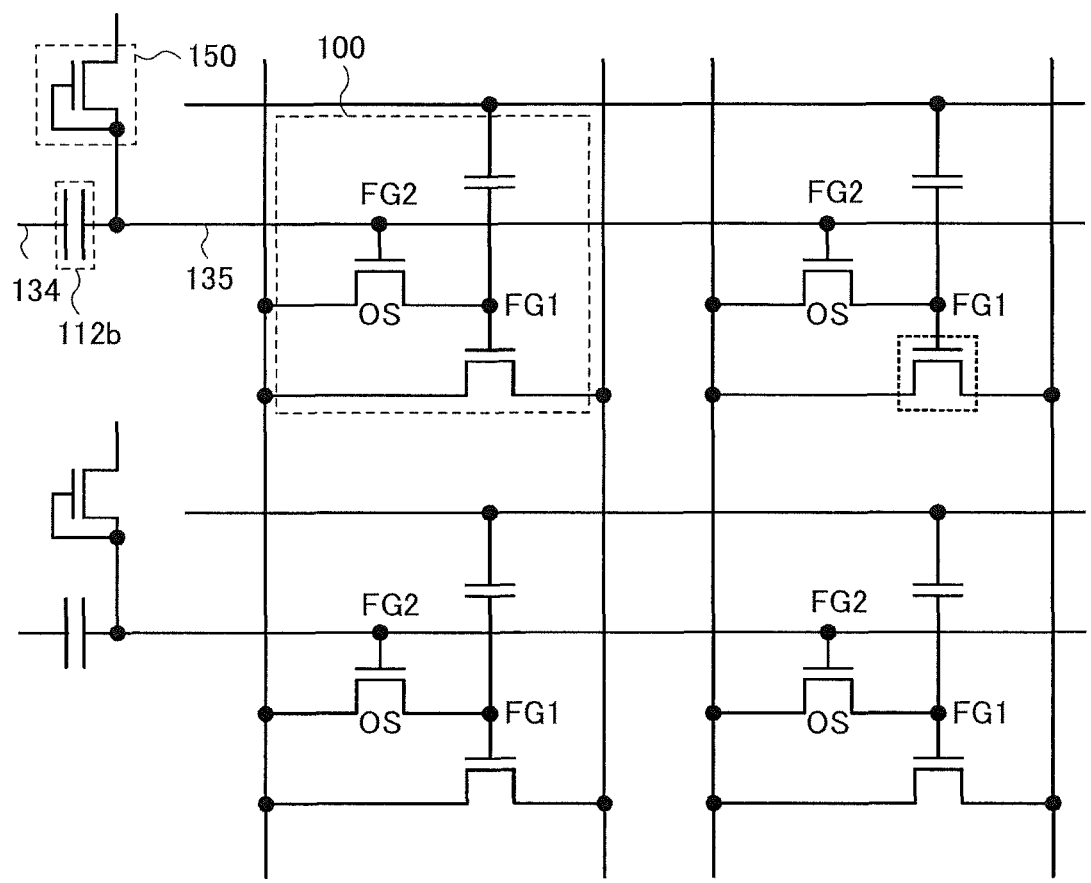
FIG. 5 is a circuit diagram of a semiconductor device.

Furthermore, as illustrated in FIG. 5, a capacitor 112b with higher capacitance than the second capacitor 112 may be electrically connected to the fifth wiring 135, and the semiconductor element 150 and the fifth wiring 135 may be shared with the plurality of semiconductor devices 100 on each row. In the above structure, the second capacitor 112 can be omitted from the semiconductor device 100, and the potentials of the nodes FG2 of the semiconductor devices 100 can be switched at approximately the same time on each row.

Figure 3B:
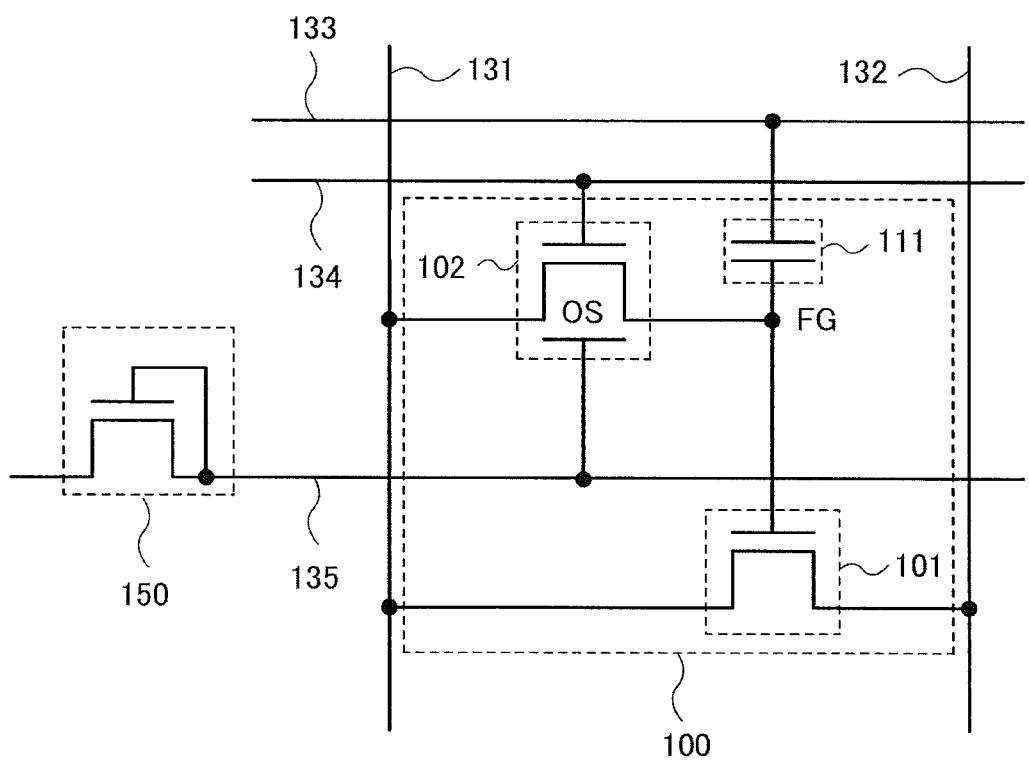

Note that any of the semiconductor devices in FIGS. 3A and 3B can employ the circuit configuration in FIG. 4 or FIG. 5.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one aspect of the present invention can be clear and it can be determined that one aspect of the present invention is disclosed in this specification and the like in some cases. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. Therefore, for example, in a diagram or a text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided.

This embodiment can be combined with any of the other embodiments in this specification as appropriate.

Embodiment 2

In this embodiment, a semiconductor device which can hold stored data even when not powered, which does not have a limitation on the number of write cycles, and which has a structure different from the structure described in Embodiment 1 will be described.

Figure 6:
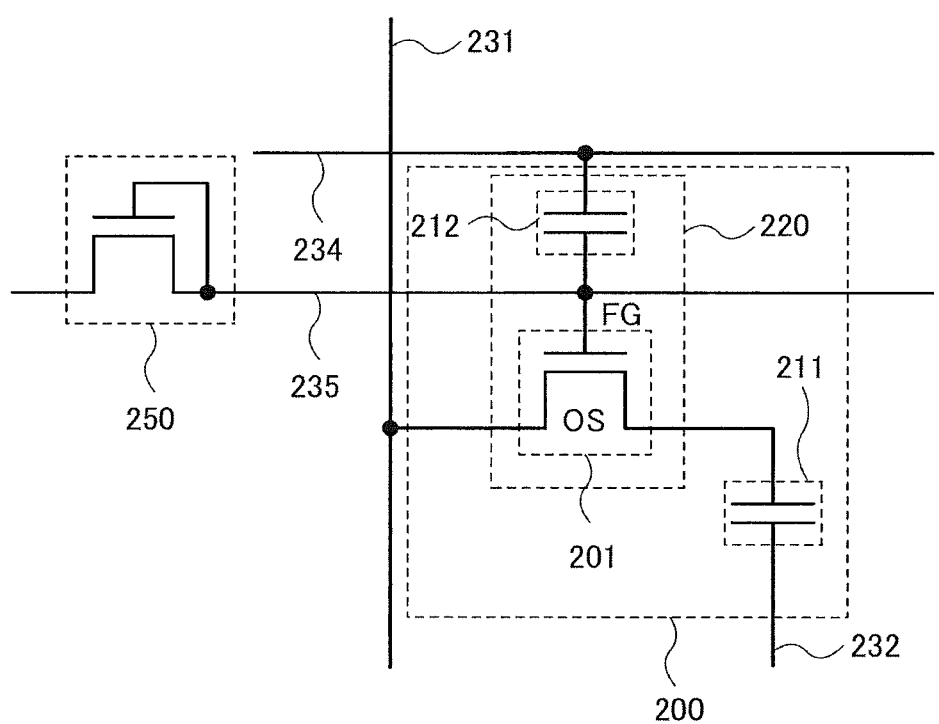
FIG. 6 is a circuit diagram of a semiconductor device.

FIG. 6 is a circuit diagram of a semiconductor device of one embodiment of the present invention.

A semiconductor device 200 illustrated in FIG. 6 includes a transistor 201, a first capacitor 211, and a second capacitor 212. One of a source electrode and a drain electrode of the transistor 201 is electrically connected to a first wiring 231, the other of the source electrode and the drain electrode is electrically connected to one of electrodes of the first capacitor 211, and a gate electrode of the transistor is electrically connected to one of electrodes of the second capacitor 212 and a fifth wiring 235. The other electrode of the first capacitor 211 is electrically connected to a second wiring 232, and the other electrode of the second capacitor 212 is electrically connected to a fourth wiring 234.

It is preferable that a channel formation region of the transistor 201 be formed using an oxide semiconductor. The transistor including an oxide semiconductor enables charge to be held for a long time owing to its electrical characteristics, that is, the low off-state current.

Although all the above transistors are n-channel transistors here, it is needless to say that p-channel transistors can be used. The specific structure of the semiconductor device, such as the material used for the semiconductor device and the structure of the semiconductor device, is not necessarily limited to those described here except for the use of the transistor which is formed using an oxide semiconductor for holding data.

The first wiring 231 can have a function of a bit line, the second wiring 232 can have a function of a reference potential line, the fourth wiring 234 can have a function of a word line, and the fifth wiring 235 can have a function of supplying potential to a node FG.

The semiconductor device illustrated in FIG. 6, which is one embodiment of the present invention, includes a circuit 220 including the transistor 201 and the second capacitor 212. The circuit 220 has the same structure as the circuit 120 described in Embodiment 1, and the description of FIGS. 2A and 2B in Embodiment 1 can be referred to for the details.

The semiconductor device 200 in FIG. 6 utilizes a characteristic in which the potential of the first capacitor 211 can be held, and thus can write, hold, and read data as described below.

Writing and holding of data will be described. First, a potential at which the transistor 201 is turned on is supplied to the fourth wiring 234, so that the transistor 201 is turned on. At this time, the potential of the fifth wiring 235 may be 0 V or a potential which makes the threshold voltage low, e.g., a negative potential. When the potential which makes the threshold voltage low is supplied to the fifth wiring 235, the potential supplied to the fourth wiring 234 to turn on the transistor 201 can be low. Further, the on-state current can be increased. Thus, a lowering of the operation voltage and an increase in the writing speed of the semiconductor device 200 can be improved.

By the above operation, the potential of the first wiring 231 is supplied to one of terminals (first terminal) of the first capacitor 211 (writing). Then, the fourth wiring 234 is set to have a potential at which the transistor 201 is turned off, and the transistor 201 is turned off, whereby charge accumulated in the first capacitor 211 is stored (holding). Since the amount of off-state current of the transistor 201 is extremely small, the potential of the first terminal of the first capacitor 211 can be held for a long time. At this time, the potential of the fourth wiring 234 and the potential of the fifth wiring 235 are adjusted so that the current value of the transistor 201 in an off state can be further reduced, whereby the amount of charge flowing out from the first capacitor 211 can be further reduced and accordingly data can be held for a longer time. For example, in the case where the fifth wiring 235 is set to have a potential to make Icut as small as possible, the potential of the fourth wiring 234 is preferably 0 V.

Next, operation of data reading will be described. When the transistor 201 is turned on, the first wiring 231 in a floating state and the first capacitor 211 are electrically connected, and charge is redistributed between the first wiring 231 and the first capacitor 211. As a result, the potential of the first wiring 231 is changed. A fluctuation of potential of the first wiring 231 varies depending on the potential of the first terminal of the first capacitor 211 or the charge stored in the first capacitor 211.

For example, the potential of the first wiring 231 after charge redistribution is represented as $(C_B \times V_{B0} + C \times V)/(C_B + C)$, where V is the potential of the first terminal of the first capacitor 211, C is the capacitance of the first capacitor 211, Ca is the capacitance component of the first wiring 231, and $V_{B0}$ is the potential of the first wiring 231 before the charge redistribution. Therefore, it can be found that assuming that the semiconductor device 200 (memory cell) is in either of two states in which the potentials of the first terminal of the first capacitor 211 are $V_1$ and $V_0$ ($V_1 > V_0$), the potential of the first wiring 231 in the case of holding the potential $V_1$ ($=(C_B \times V_{B0} + C \times V_1)/(C_B + C)$) is higher than the potential of the first wiring 231 in the case of holding the potential $V_0$ ($=(C_B \times V_{B0} + C \times V_0)/(C_B + C)$).

Then, by comparing the potential of the first wiring 231 with a predetermined potential, data can be read.

The semiconductor device 200 illustrated in FIG. 6 can hold charge that is accumulated in the first capacitor 211 for a long time because the amount of off-state current of the transistor 201 is significantly small. In other words, power consumption can be sufficiently reduced because refresh operation becomes unnecessary or the frequency of refresh operation can be extremely low. Moreover, stored data can be held for a long time even when power is not supplied. Note that power may be supplied while the stored data is being held.

Figure 7A:
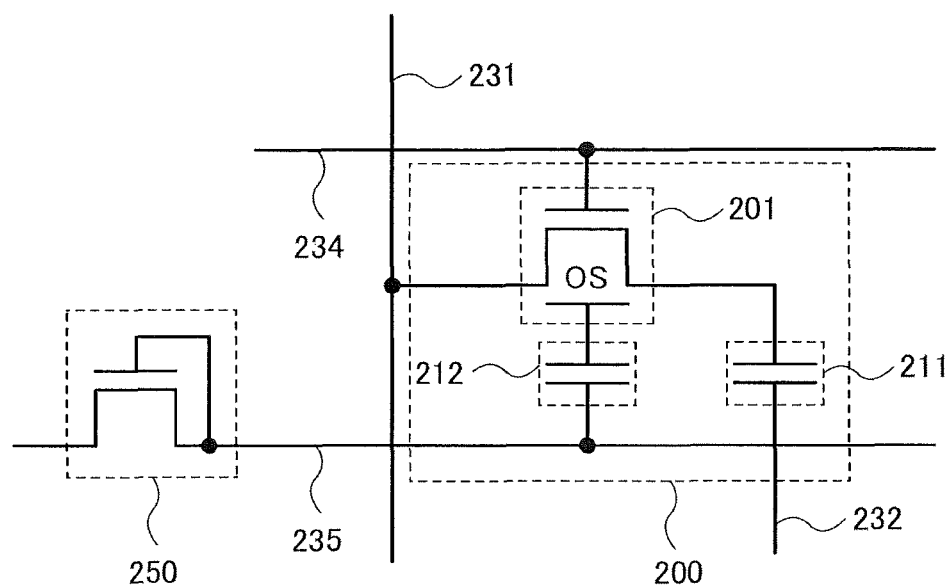
FIGS. 7A and 7B are each a circuit diagram of a semiconductor device.

In terms of a control of the threshold voltage of the transistor 201 by injecting charge to the gate electrode of the transistor, a structure illustrated in FIG. 7A may be employed, in which a second gate electrode is provided on a back channel side of the transistor 201, one of electrodes of the second capacitor 212 is electrically connected to the second gate electrode, and the other electrode of the second capacitor 212 is electrically connected to the fifth wiring 235. Alternatively, a structure in which the second gate electrode is electrically connected to the fifth wiring 235 without providing the second capacitor 212 as illustrated in FIG. 7B may be employed.

Figure 8:
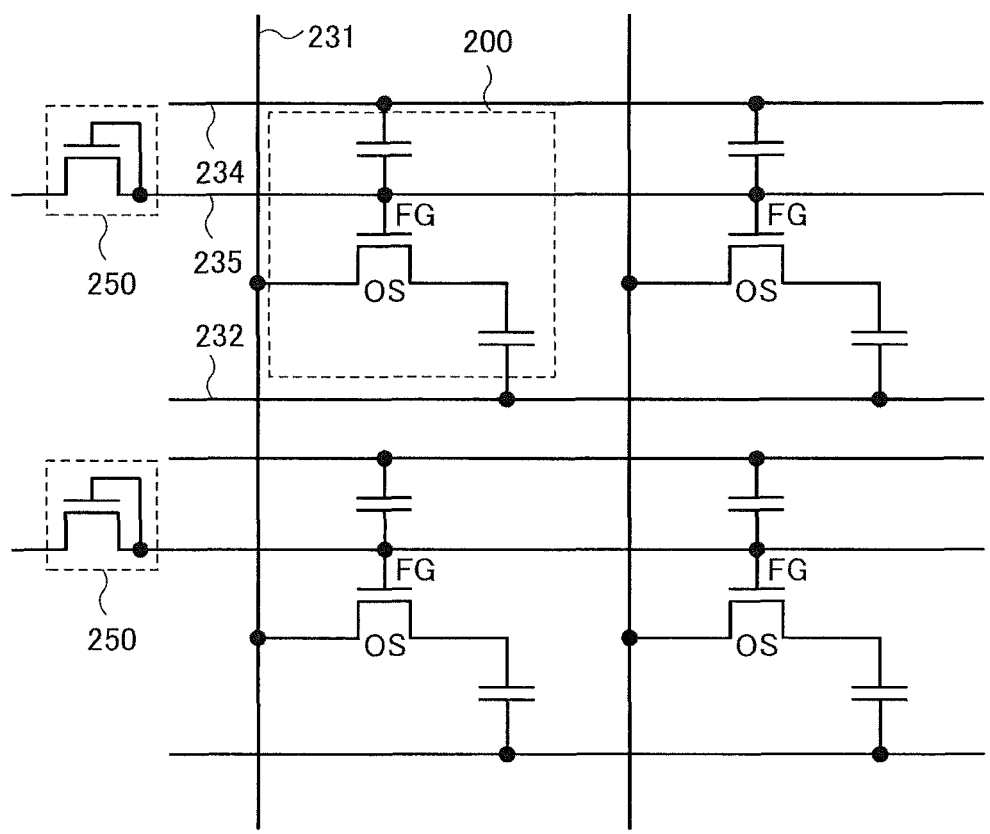
FIG. 8 is a circuit diagram of a semiconductor device.

In the case where a plurality of semiconductor devices 200 are arranged in matrix, a semiconductor element 250 and the fifth wiring 235 may be shared with the plurality of semiconductor devices 200 on each row as shown in FIG. 8. With such a structure, the potentials of nodes FG of the semiconductor devices 200 can be switched at approximately the same time on each row.

Figure 9:
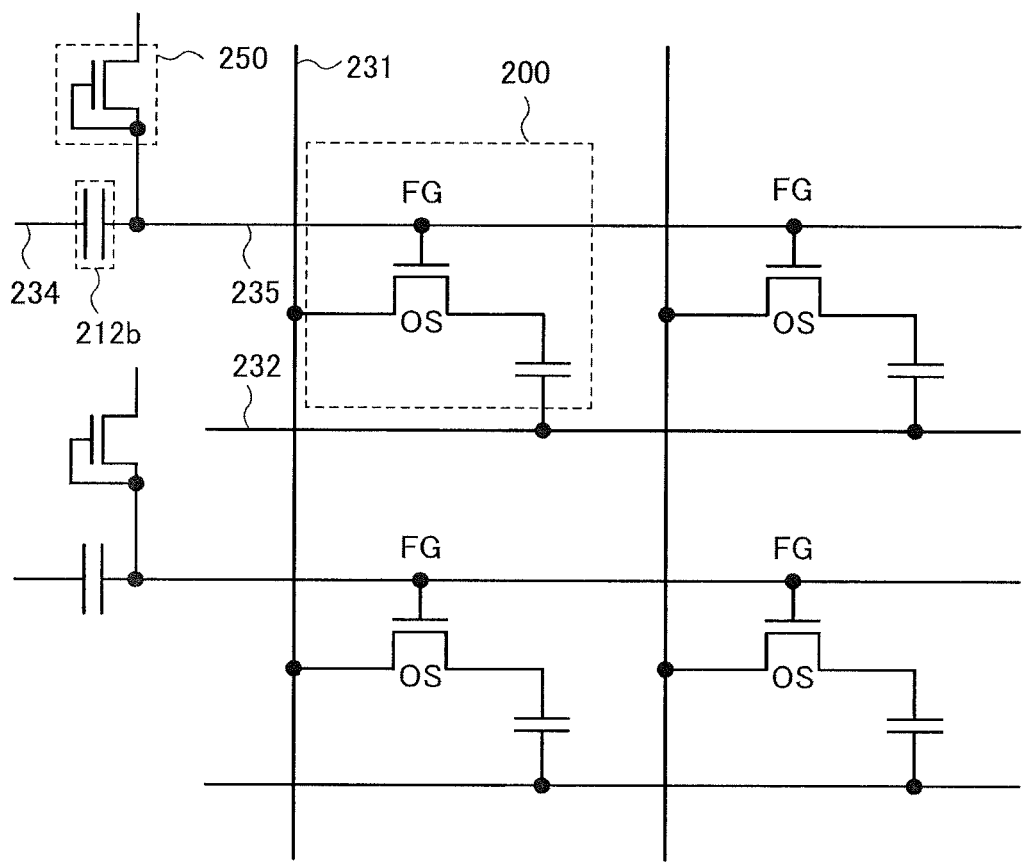
FIG. 9 is a circuit diagram of a semiconductor device.

Further, as illustrated in FIG. 9, a capacitor 212b with higher capacitance than the second capacitor 212 may be electrically connected to the fifth wiring 235, and the semiconductor element 250 and the fifth wiring 235 may be shared with the plurality of semiconductor devices 200 on each row. With such a structure, the second capacitor 212 is not necessary, and the potentials of the nodes FG of the semiconductor devices 200 can be switched at approximately the same time on each row.

Figure 7B:
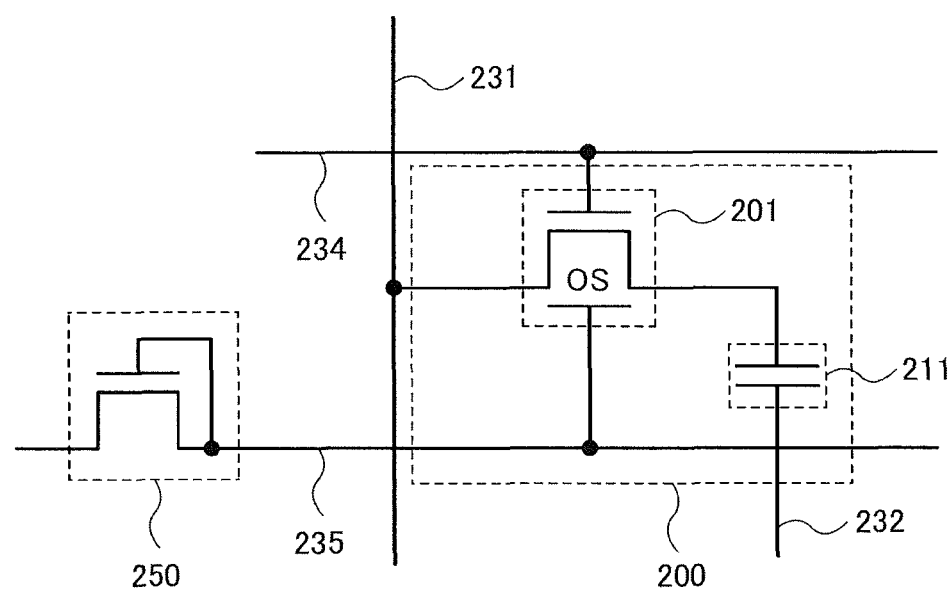

Furthermore, any of the semiconductor devices illustrated in FIGS. 7A and 7B can employ the circuit configuration illustrated in FIG. 8 or FIG. 9.

On each of the semiconductor devices 200 in FIGS. 6 to 9, a substrate provided with a driver circuit for driving the semiconductor device 200 is preferably mounted. When the semiconductor device 200 and the driver circuit are stacked, the size of the semiconductor device can be reduced. Note that there is no limitation on the number of semiconductor devices 200 and driver circuits which are stacked.

It is preferable that a semiconductor material of a transistor included in the driver circuit be different from that of the transistor 201. For example, silicon, germanium, silicon germanium, silicon carbide, gallium arsenide, or the like can be used, and a single crystal semiconductor is preferably used. A transistor formed using such a semiconductor material can operate at higher speed than a transistor formed using an oxide semiconductor and is suitable for the driver circuit for the semiconductor device 200. The driver circuit may be formed using an oxide semiconductor. Note that instead of being stacked, the driver circuit may be formed over the same substrate as the semiconductor device 200 is.

As described above, a miniaturized and highly integrated semiconductor device having favorable electrical characteristics can be provided.

This embodiment can be combined with any of the other embodiments in this specification as appropriate.

Embodiment 3

In this embodiment, a semiconductor device (display device) to which one embodiment of the present invention can be applied will be described.

As a display element provided in the display device, a liquid crystal element (also referred to as a liquid crystal display element), a light-emitting element (also referred to as a light-emitting display element), or the like can be used. The light-emitting element includes, in its category, an element whose luminance is controlled by current or voltage, specifically an inorganic electroluminescent (EL) element, an organic EL element, and the like. Furthermore, a display medium whose contrast is changed by an electric effect, such as electronic ink, can be used as the display element. A display device including an EL element and a display device including a liquid crystal element are described below as examples of the display device.

The display device described below includes, in its category, a panel in which a display element is sealed and a module in which an IC such as a controller is mounted on the panel.

The display device described below refers to an image display device or a light source (including a lighting device). The display device includes any of the following modules in its category: a module provided with a connector such as an FPC or TCP; a module in which a printed wiring board is provided at the end of TCP; and a module in which an integrated circuit (IC) is mounted directly on a display element by a COG method.

The display devices described below can be provided with an input means (a touch sensor) capable of contact or proximity sensing of an object. For example, as the input means capable of contact sensing, touch sensors of various types such as a resistive type, a capacitive type, an infrared ray type, an electromagnetic induction type, and a surface acoustic wave type can be used. As the input means capable of proximity sensing, an infrared camera or the like can be used.

The input means may be provided over a display device described below to form what is called an on-cell display device or may be provided integrally with a display device described below to form what is called an in-cell display device.

Figure 10:
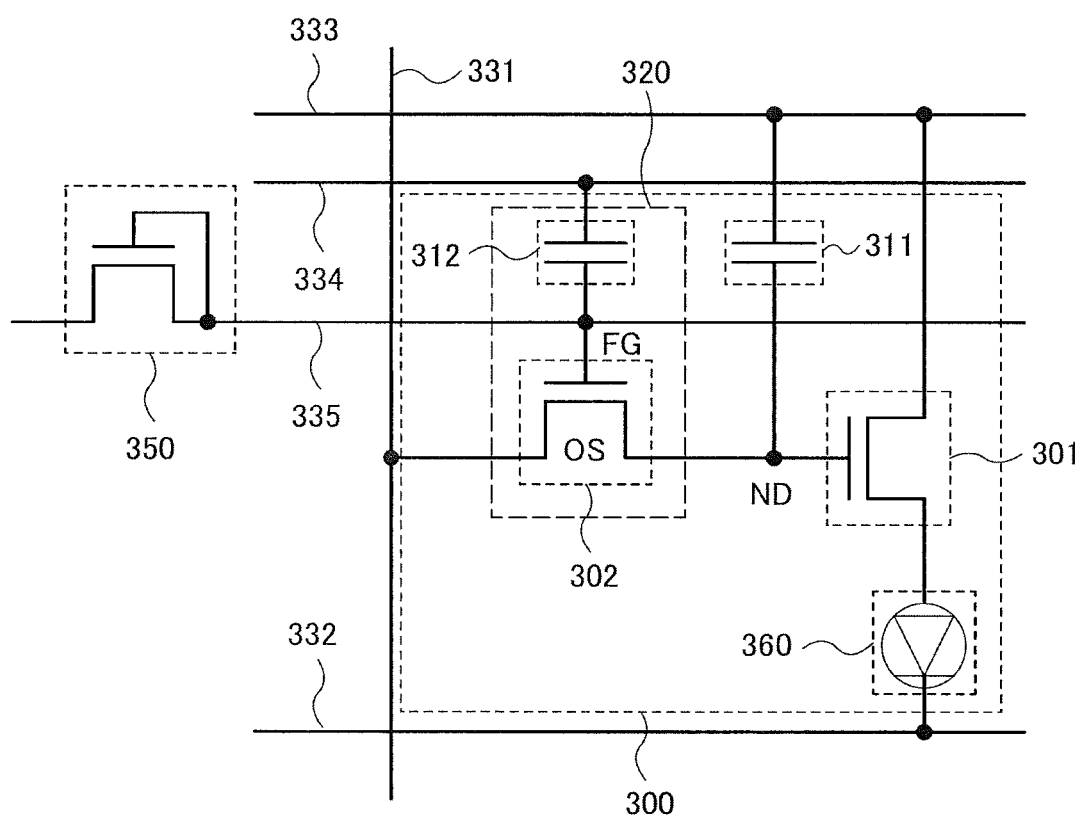
FIG. 10 is a circuit diagram of a semiconductor device.

FIG. 10 is an example of a circuit diagram of a pixel in a display device including an EL element. An EL display device 300 illustrated in FIG. 10 includes a first transistor 301, a second transistor 302, a first capacitor 311, a second capacitor 312, and a light-emitting element 360. One of a source electrode and a drain electrode of the first transistor 301 is electrically connected to an anode of the light-emitting element 360, the other of the source electrode and the drain electrode of the transistor is electrically connected to a third wiring 333, and a gate electrode of the transistor is electrically connected to one of a source electrode and a drain electrode of the second transistor 302 and one of electrodes of the first capacitor 311. The other electrode of the source electrode and the drain electrode of the second transistor 302 is electrically connected to a first wiring 331, a gate electrode of the second transistor 302 is electrically connected to one of electrodes of the second capacitor 312 and a fifth wiring 335. The other electrode of the first capacitor 311 is electrically connected to the third wiring 333. The other electrode of the second capacitor 312 is electrically connected to a fourth wiring 334. A cathode of the light-emitting element 360 is electrically connected to a second wiring 332.

The first wiring 331 can have a function of a signal line, the second wiring 332 can have a function of a reference potential line, the third wiring 333 can have a function of a power source line, the fourth wiring 334 can have a function of a scanning line, and the fifth wiring 335 can have a function of supplying potential to a node FG.

Figure 12:
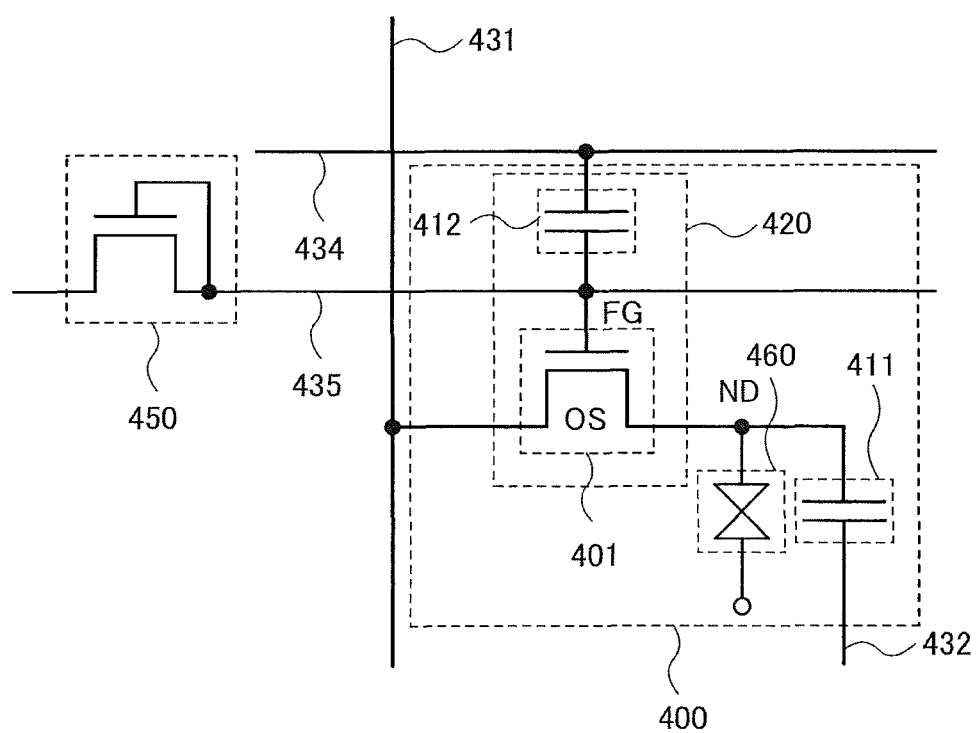
FIG. 12 is a circuit diagram of a semiconductor device.

FIG. 12 is an example of a circuit diagram of a pixel in a liquid crystal display device. A liquid crystal display device 400 illustrated in FIG. 12 includes a transistor 401, a first capacitor 411, a second capacitor 412, and a liquid crystal element 460. One of a source electrode and a drain electrode of the transistor 401 is electrically connected to one of electrodes of the liquid crystal element 460 and one of electrodes of the first capacitor 411, the other of the source electrode and the drain electrode of the transistor is electrically connected to a first wiring 431, and a gate electrode of the transistor is electrically connected to one of electrodes of the second capacitor 412 and a fifth wiring 435. The other electrode of the first capacitor 411 is electrically connected to a second wiring 432. The other electrode of the second capacitor 412 is electrically connected to a fourth wiring 434.

The first wiring 431 can have a function of a signal line. The second wiring 432 can have a function of a reference potential line. The fourth wiring 434 can have a function of a scanning line. The fifth wiring 435 can have a function of supplying potential to a node FG.

The above transistors, particularly, the second transistor 302 in the EL display device 300 and the transistor 401 in the liquid crystal display device 400 are preferably each formed using an oxide semiconductor. The transistor including an oxide semiconductor in a channel formation region enables charge in an node ND to be held for a long time owing to its electrical characteristics, that is, the low off-state current.

Although all the above transistors are n-channel transistors here, it is needless to say that p-channel transistors can be used. The specific structure of the display device, such as the material used for the display device and the structure of the display device, is not necessarily limited to those described here except for the use of the transistor, which is formed using an oxide semiconductor for holding data.

The EL display device 300 in FIG. 10 includes a circuit 320 including the second transistor 302 and the second capacitor 312. The liquid crystal display device 400 in FIG. 12 includes a circuit 420 including the transistor 401 and the second capacitor 412. The circuit 320 and the circuit 420 have the structure similar to that of the circuit 120 described in Embodiment 1, and the description relating to FIGS. 2A and 2B in Embodiment 1 can be referred to for the details.

Figure 11A:
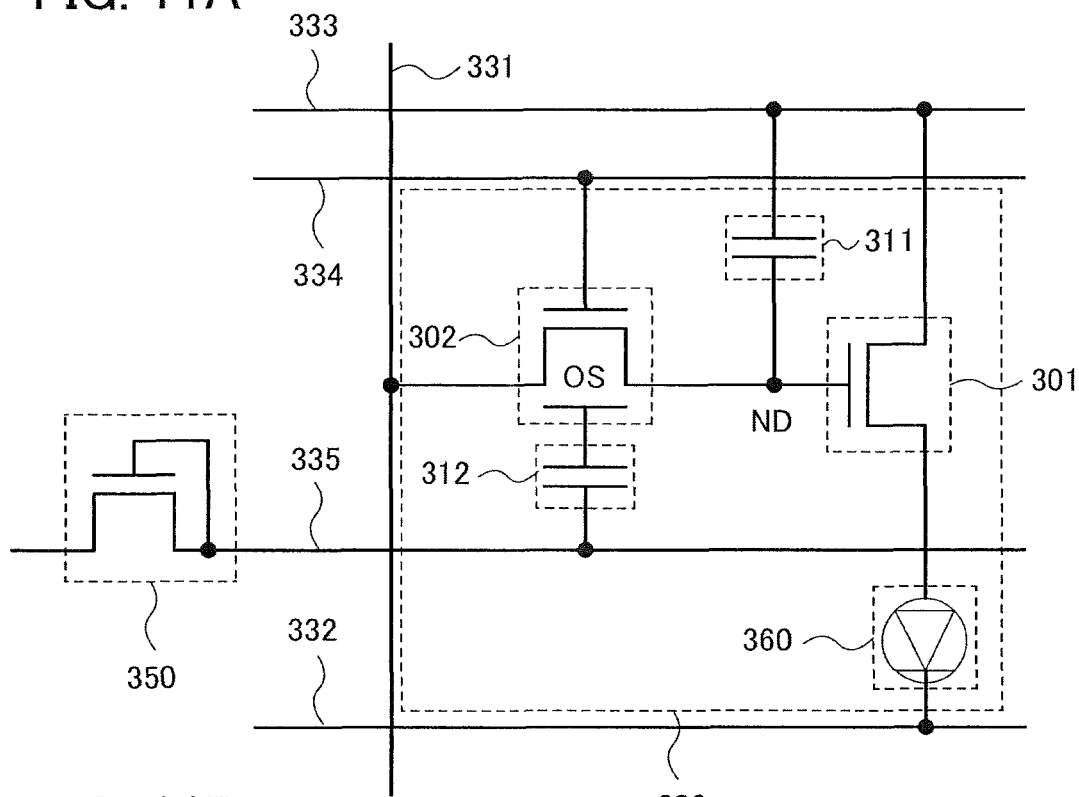
FIGS. 11A and 11B are each a circuit diagram of a semiconductor device.
Figure 11B:
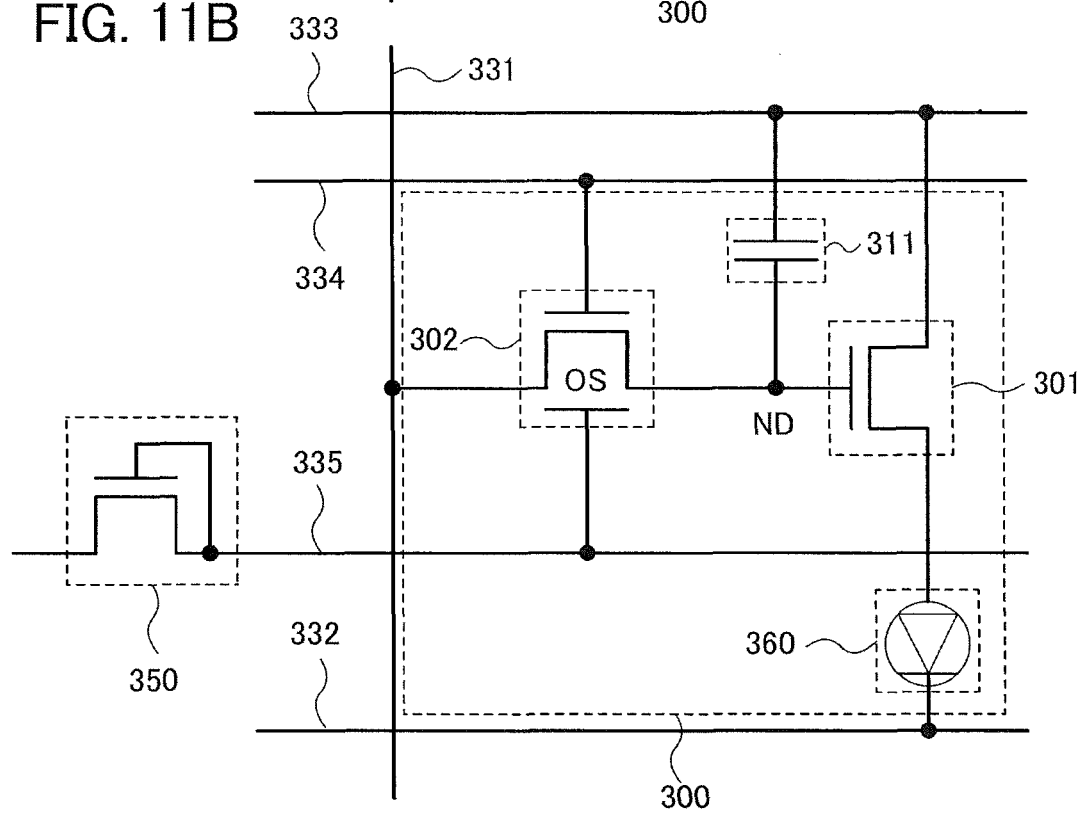

In terms of a control of the threshold voltage of the second transistor 302 by injecting charge to the gate electrode of the transistor in the EL display device 300, a structure illustrated in FIG. 11A can be employed, in which a second gate electrode is provided on a back channel side of the second transistor 302, one of the electrodes of the second capacitor 312 is electrically connected to the second gate electrode, and the other electrode of the second capacitor 312 is electrically connected to the fifth wiring 335. Alternatively, as illustrated in FIG. 11B, a structure in which the second gate electrode is electrically connected to the fifth wiring 335 without providing the second capacitor 312 may be employed.

Figure 13A:
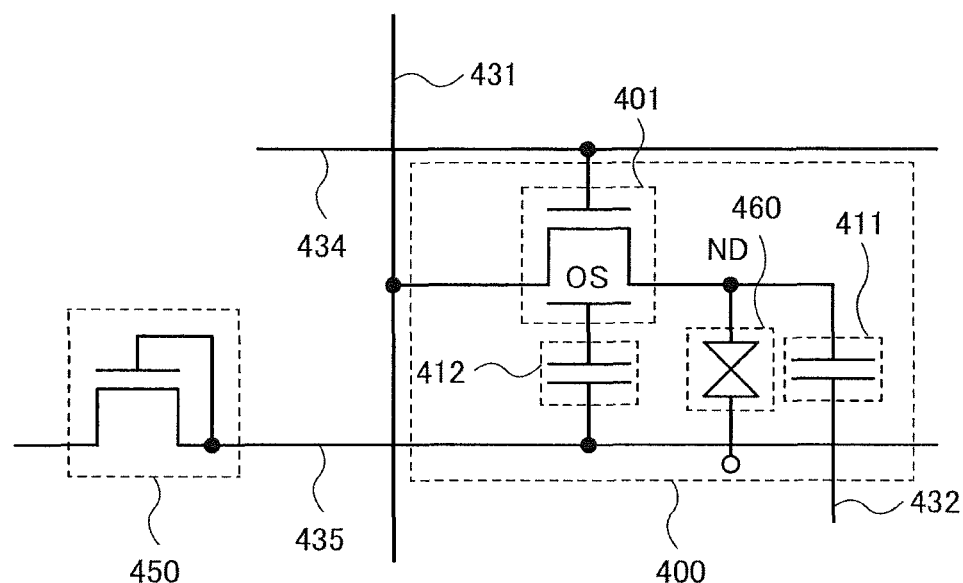
FIGS. 13A and 13B are each a circuit diagram of a semiconductor device.
Figure 13B:
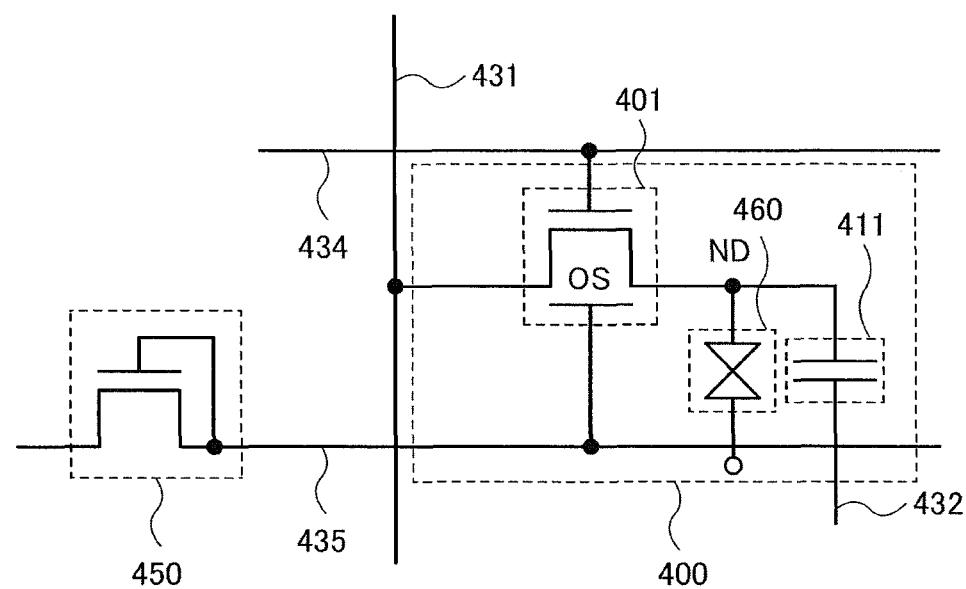

In terms of a control of the threshold voltage of the transistor 401 by injecting charge to the gate electrode of the transistor in the liquid crystal display device 400, a structure illustrated in FIG. 13A can be employed, in which a second gate electrode is provided on a back channel side of the transistor 401, one of electrodes of the second capacitor 412 is electrically connected to the second gate electrode, and the other electrode of the second capacitor 412 is eclectically connected to the fifth wiring 435. Alternatively, as illustrated in FIG. 13B, a structure in which the second gate electrode is electrically connected to the fifth wiring 435 without providing the second capacitor 412 may be employed.

Next, part of operation of the display device in one embodiment of the present invention is described. Note that the components of the EL display device 300 are used in the following description; the second transistor 302, the fourth wiring 334, and the fifth wiring 335 are replaced with the transistor 401, the fourth wiring 434, and the fifth wiring 435, respectively, whereby operation of the liquid crystal display device 400 can be described.

In the EL display device 300, the second transistor 302 functions as a switching element. When the second transistor 302 is turned on, data is written to the node ND. When the second transistor 302 is turned off, data in the node ND is held.

The potential at which the second transistor 302 is turned on is supplied to the fourth wiring 334. When the second transistor 302 is turned on, the potential of the fifth wiring 335 may be 0 V or a potential which makes the threshold voltage low, e.g., a negative potential. By supplying the potential which makes the threshold voltage low to the fifth wiring 335, the potential supplied to the fourth wiring 334 to turn on the second transistor 302 can be low. Alternatively, the on-state current can be increased. Thus, a lowering of the operation voltage or an increase in the writing speed of the display device can be achieved.

After that, the potential of the fourth wiring 334 is set to a potential at which the second transistor 302 is turned off, so that the second transistor 302 is turned off. Thus, the charge accumulated in the node ND is held (data holding). Since the amount of off-state current of the second transistor 302 is extremely small, the charge in the node ND is held for a long time. At this time, the potential of the fourth wiring 334 and the potential of the fifth wiring 335 are adjusted so that the current value of the second transistor 302 in an off state can be further reduced, whereby the amount of charge flowing out from the node ND can be further reduced, and accordingly data can be held for a long time. For example, in the case where the potential of the fifth wiring 335 is set to have a potential to make Icut small as much as possible, the potential of the fourth wiring 334 may be 0 V.

Thus, with one embodiment of the present invention, the frame rate can be reduced, leading to a reduction in power consumption of the display device. Further, the low frame rate (e.g., lower than 1 Hz) enables flicker on the screen and the like to be suppressed, leading to formation of an eye-friendly display device.

Figure 14:
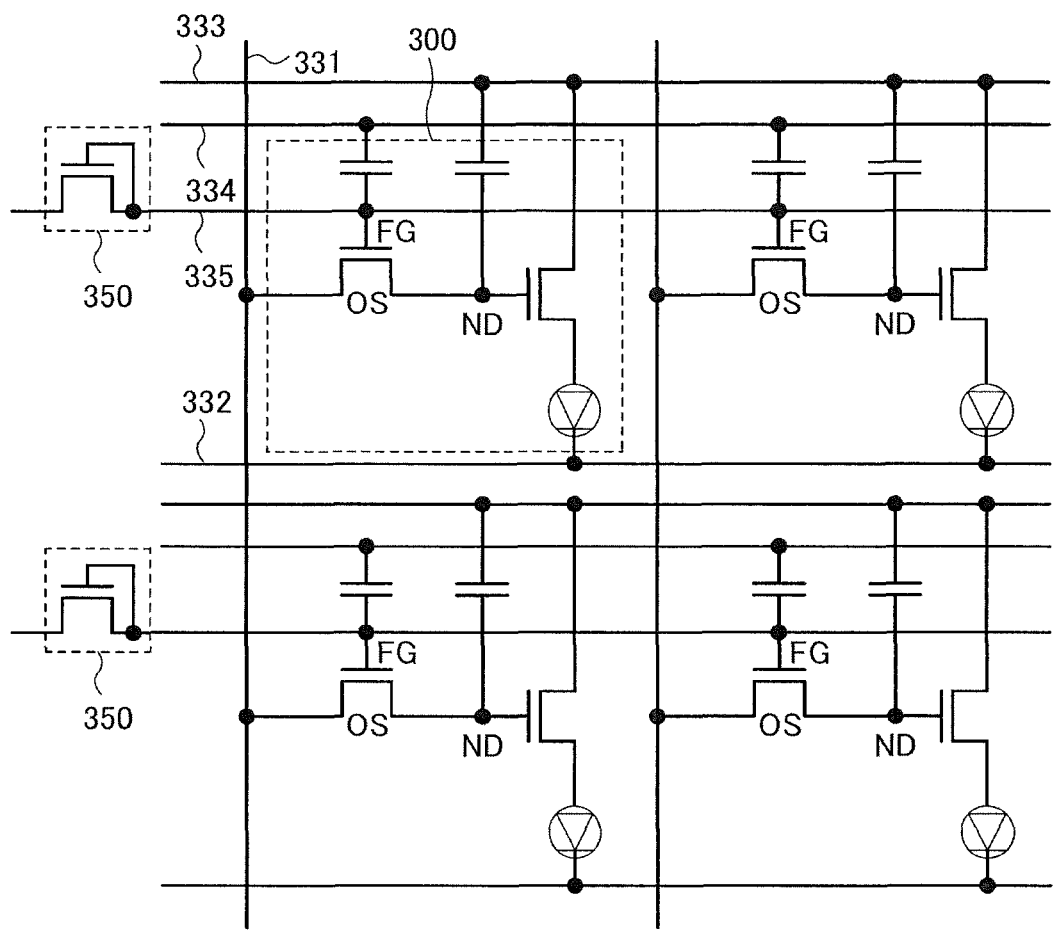
FIG. 14 is a circuit diagram of a semiconductor device.

In the case where a plurality of EL display devices 300 are arranged in matrix, a semiconductor element 350 and the fifth wiring 335 are shared with the plurality of EL display devices 300 on each row as shown in FIG. 14, whereby the potentials of nodes ND of the EL display devices 300 can be switched at approximately the same time on each row. Note that the above connection mode can be applied to a connection mode of a semiconductor device 450 and the fifth wiring 435 in the case where a plurality of liquid crystal display devices 400 are arranged in matrix.

Figure 15:
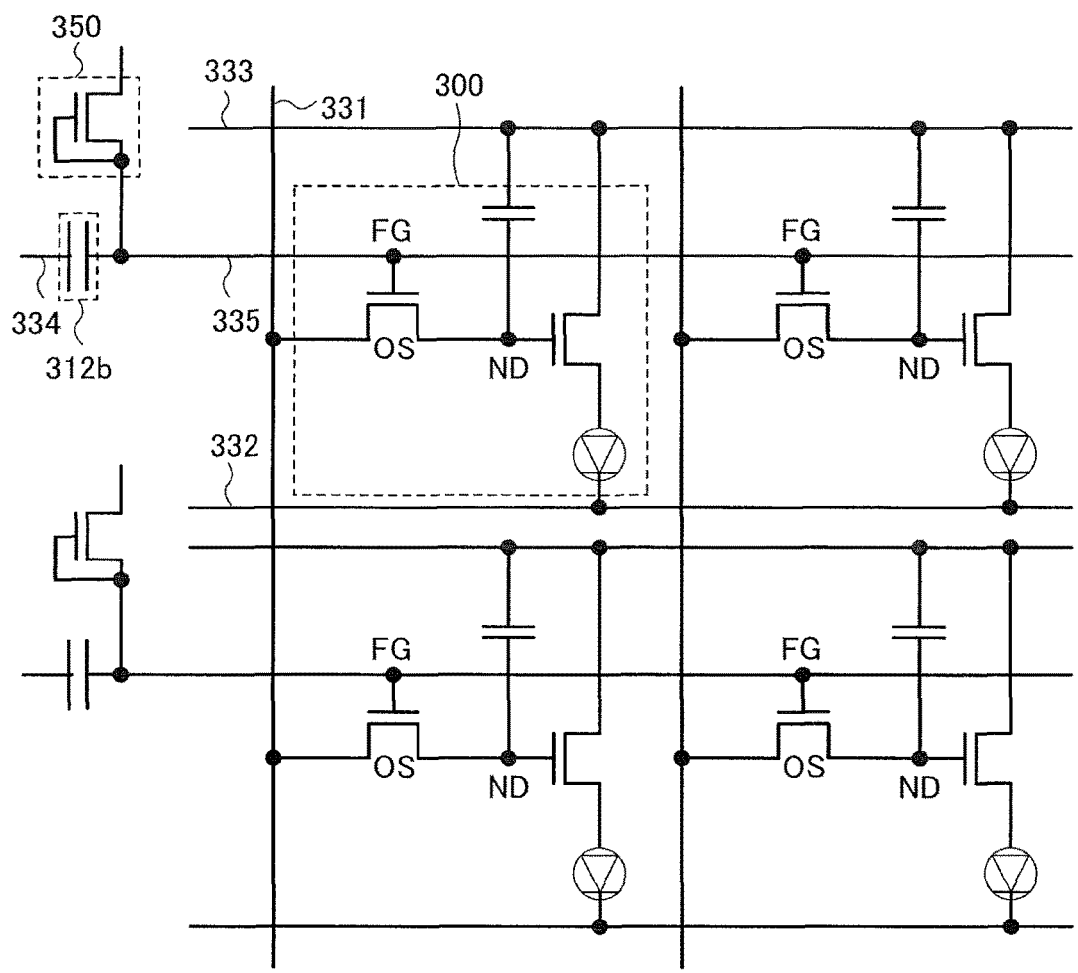
FIG. 15 is a circuit diagram of a semiconductor device.

Further, as illustrated in FIG. 15, a structure may be employed, in which a capacitor 312b with higher capacitance than the second capacitor 312 is electrically connected to the fifth wiring 335, and the semiconductor element 350 and the fifth wiring 335 are shared with the plurality of EL display devices 300 on each row. In the structure, the second capacitor 312 is not needed in the EL display device 300, and the potentials of the nodes ND of the EL display devices 300 on each row can be switched at the approximately same time. Note that the above connection mode and the change of the capacitor can be applied to the connection mode of the semiconductor device 450 and the fifth wiring 435 in the case where a plurality of liquid crystal display devices 400 are arranged in matrix.

The circuits configuration illustrated in FIG. 14 and FIG. 15 can be applied to the EL display devices 300 in FIGS. 11A and 11B and the liquid crystal display devices 400 in FIGS. 13A and 13B.

This embodiment can be combined with any of the other embodiments in this specification as appropriate.

Embodiment 4

In this embodiment, a semiconductor device applicable to the circuit 220 described in Embodiment 1 will be described with reference to drawings.

Figure 16A:
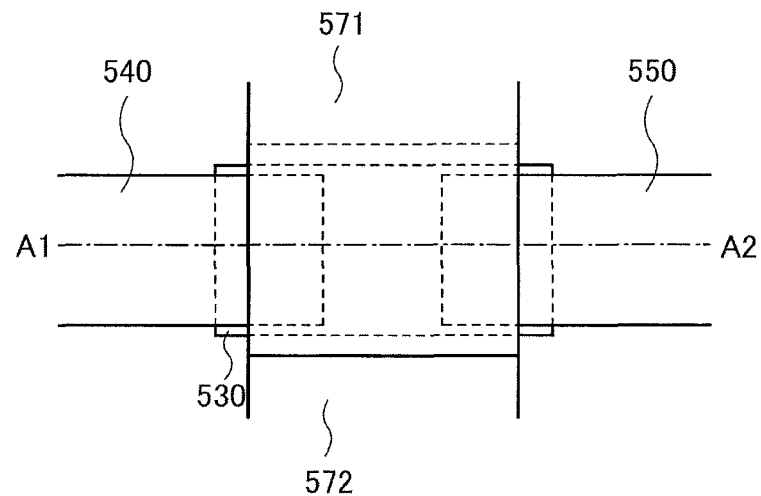
FIGS. 16A and 16B are a top view and a cross-sectional view, respectively, illustrating a transistor.
Figure 16B:
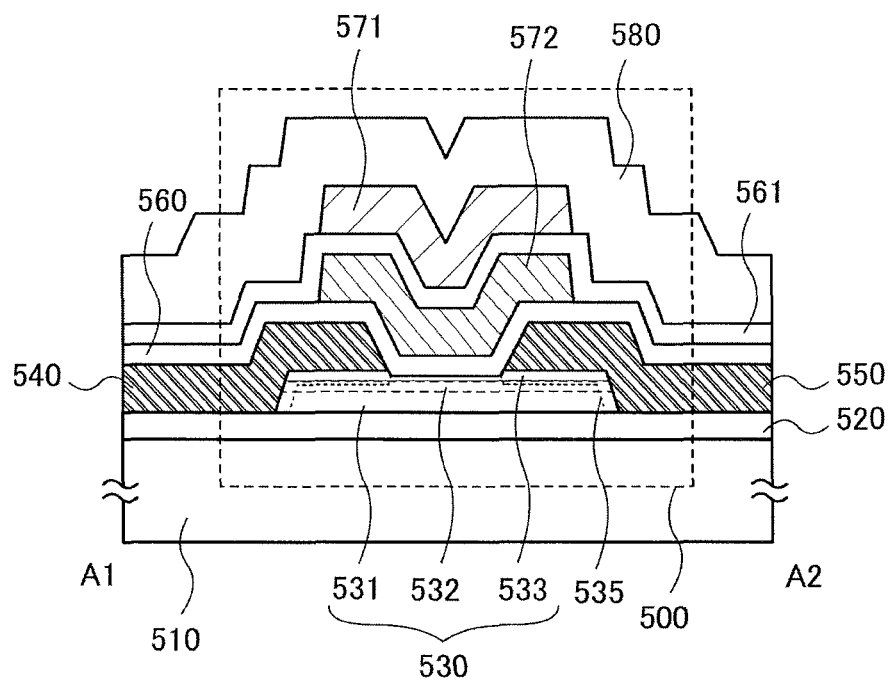

FIGS. 16A and 16B are a top view and a cross-sectional view which illustrate a transistor of one embodiment of the present invention. FIG. 16A is the top view, and a cross section taken along a dashed-dotted line A1-A2 in FIG. 16A is illustrated in FIG. 16B. Note that for simplification of the drawing, some components in the top view in FIG. 16A are not illustrated. Further, the direction in the dashed-dotted line A1-A2 is called a channel length direction in some cases.

A transistor 500 illustrated in FIGS. 16A and 16B includes a base insulating film 520 over a substrate 510, an oxide semiconductor layer 530 over the base insulating film, a source electrode 540 and a drain electrode 550 over the oxide semiconductor layer, a gate insulating film 560 over the source electrode, the drain electrode, and the oxide semiconductor layer 530, a second gate electrode 572 over the gate insulating film, an insulating film 561 over the gate insulating film 560 and the second gate electrode 572, and a first gate electrode 571 that is over the insulating film 561 and overlaps with the second gate electrode 572. In addition, an oxide insulating layer 580 may be formed over the insulating film 561 and the first gate electrode 571. Note that the oxide insulating layer may be provided as needed and another insulating layer may be further provided thereover.

The second gate electrode 572, the insulating film 561, and the first gate electrode 571 correspond to one of electrodes, a dielectric layer, and the other electrode of the second capacitor 112 illustrated in FIG. 1, respectively. Furthermore, the second gate electrode 572, the source electrode 540, and the drain electrode 550 correspond to the gate electrode, the source electrode, and the drain electrode of the second transistor 102 illustrated in FIG. 1, respectively.

Note that functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

The substrate 510 is not limited to a simple supporting substrate, and may be a substrate where a device such as a transistor is formed. In that case, at least one of the first gate electrode 571, the second gate electrode 572, the source electrode 540, and the drain electrode 550 of the transistor 500 may be electrically connected to the above device.

The base insulating film 520 can have a function of supplying oxygen to the oxide semiconductor layer 530 as well as a function of preventing diffusion of an impurity from the substrate 510; thus, the base insulating film 520 is preferably an insulating film containing oxygen, further preferably an insulating film containing excess oxygen. Note that in the case where the substrate 510 is a substrate where another device is formed as described above, the base insulating film 520 also has a function as an interlayer insulating film. In that case, the base insulating film 520 is preferably subjected to planarization treatment such as chemical mechanical polishing (CMP) treatment so as to have a flat surface.

Further, the oxide semiconductor layer 530 has a structure in which a first oxide semiconductor layer 531, a second oxide semiconductor layer 532, and a third oxide semiconductor layer 533 are stacked in this order from the substrate 510 side. Here, for the second oxide semiconductor layer 532, for example, an oxide semiconductor whose electron affinity (a difference in energy between a vacuum level and the bottom of a conduction band) is higher than those of the first oxide semiconductor layer 531 and the third oxide semiconductor layer 533 is used. The electron affinity can be obtained by subtracting an energy difference between a bottom of a conduction band and a top of a valence band (what is called an energy gap) from an energy difference between the vacuum level and the top of the valence band (what is called an ionization potential).

Although the case where the oxide semiconductor layer 530 is a stack of three layers is described in this embodiment, the oxide semiconductor layer 530 may be a single layer or a stack of two layers or four or more layers. In the case of a single layer, a layer corresponding to the second oxide semiconductor layer 532 is used, for example. In the case of the two-layer stacked structure, for example, a structure in which a layer corresponding to the second oxide semiconductor layer 532 is provided on the substrate 510 side and a layer corresponding to the first oxide semiconductor layer 531 or the third oxide semiconductor layer 533 is provided on the gate insulating film 560 side or a structure in which a layer corresponding to the first oxide semiconductor layer 531 or the third oxide semiconductor layer 533 is provided on the substrate 510 side and a layer corresponding to the second oxide semiconductor layer 532 is provided on the gate insulating film 560 side may be employed. In the case of the stacked structure including four or more layers, for example, a structure in which an oxide semiconductor layer is stacked over the three-layer stacked structure described in this embodiment or a structure in which an oxide semiconductor layer is provided between any of two layers in the three-layer stacked structure.

The first oxide semiconductor layer 531 and the third oxide semiconductor layer 533 each contain one or more kinds of metal elements forming the second oxide semiconductor layer 532. For example, the first oxide semiconductor layer 531 and the third oxide semiconductor layer 533 are preferably formed using an oxide semiconductor whose energy of the bottom of the conduction band is closer to a vacuum level than that of the second oxide semiconductor layer 532 by 0.05 eV or more, 0.07 eV or more, 0.1 eV or more, or 0.15 eV or more and 2 eV or less, 1 eV or less, 0.5 eV or less, or 0.4 eV or less is.

In such a structure, when an electric field is applied to the first gate electrode 571 or the second gate electrode 572, a channel is formed in the second oxide semiconductor layer 532 of the oxide semiconductor layer 530, whose energy at the bottom of the conduction band is the lowest. In other words, the third oxide semiconductor layer 533 is formed between the second oxide semiconductor layer 532 and the gate insulating film 560, whereby a structure in which the channel of the transistor is not in contact with the gate insulating film 560 can be obtained.

Further, since the first oxide semiconductor layer 531 includes one or more metal elements included in the second oxide semiconductor layer 532, an interface state is less likely to be formed at the interface between the second oxide semiconductor layer 532 and the first oxide semiconductor layer 531. The interface state sometimes forms a channel; therefore, the threshold voltage of the transistor is changed in some cases. Thus, with the first oxide semiconductor layer 531, fluctuation in electrical characteristics of the transistors, such as a threshold voltage, can be reduced.

Furthermore, since the third oxide semiconductor layer 533 includes one or more metal elements included in the second oxide semiconductor layer 532, scattering of carriers is less likely to occur at the interface between the second oxide semiconductor layer 532 and the third oxide semiconductor layer 533. Therefore, with the third oxide semiconductor layer 533, the field-effect mobility of the transistor can be increased.

For the first oxide semiconductor layer 531 and the third oxide semiconductor layer 533, for example, a material containing much Al, Ti, Ga, Ge, Y, Zr, Sn, La, Ce, or Hf at a higher proportion than a material of the second oxide semiconductor layer 532 can be used. Specifically, an atomic ratio of any of the above metal elements in the first oxide semiconductor layer 531 and the third oxide semiconductor layer 533 is 1.5 times or more, preferably 2 times or more, further preferably 3 times or more as much as that in the second oxide semiconductor layer 532 is contained. Any of the above metal elements is strongly bonded to oxygen and thus has a function of suppressing generation of an oxygen vacancy. That is, an oxygen vacancy is less likely to be generated in the first oxide semiconductor layer 531 and the third oxide semiconductor layer 533 than in the second oxide semiconductor layer 532.

Note that when each of the first oxide semiconductor layer 531, the second oxide semiconductor layer 532, and the third oxide semiconductor layer 533 is an In-M-Zn oxide containing at least indium, zinc, and M (M is a metal such as Al, Ti, Ga, Ge, Y, Zr, Sn, La, Ce, or Hf), and the first oxide semiconductor layer 531 has an atomic ratio of In to M and Zn which is $x_1:y_1:z_1$, the second oxide semiconductor layer 532 has an atomic ratio of In to M and Zn which is $x_2:y_2:z_2$, and the third oxide semiconductor layer 533 has an atomic ratio of In to M and Zn which is $x_3:y_3:z_3$, each of $y_1/x_1$ and $y_3/x_3$ is preferably larger than $y_2/x_2$. Each of $y_1/x$, and $y_3/x_3$ is 1.5 times or more as large as $y_2/x_2$, preferably twice or more as large as $y_2/x_2$, further preferably three times or more as large as $y_2/x_2$. At this time, when $y_2$ is larger than or equal to $x_2$ in the second oxide semiconductor layer 532, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

Further, it is preferable that, in the atomic ratio between In and M in each of the first oxide semiconductor layer 531 and the third oxide semiconductor layer 533 in the case where Zn and O are not taken into consideration, the proportion of In be less than 50 atomic % and the proportion of M be greater than or equal to 50 atomic %, and it is further preferable that, in the atomic ratio between In and M, the proportion of In be less than 25 atomic % and the proportion of M be greater than or equal to 75 atomic %. The atomic ratio of In to M in the second oxide semiconductor layer 532 in the case where Zn and O are not taken into consideration is preferably as follows: the proportion of In is higher than or equal to 25 atomic % and the proportion of M is lower than 75 atomic %; and it is further preferably as follows: the proportion of In is higher than or equal to 34 atomic % and the proportion of M is lower than 66 atomic %.

The thicknesses of the first oxide semiconductor layer 531 and the third oxide semiconductor layer 533 are each greater than or equal to 3 nm and less than or equal to 100 nm, preferably greater than or equal to 3 nm and less than or equal to 50 nm. The thickness of the second oxide semiconductor layer 532 is greater than or equal to 3 nm and less than or equal to 200 nm, preferably greater than or equal to 3 nm and less than or equal to 100 nm, further preferably greater than or equal to 3 nm and less than or equal to 50 nm.

For each of the first oxide semiconductor layer 531, the second oxide semiconductor layer 532, and the third oxide semiconductor layer 533, an oxide semiconductor containing indium, zinc, and gallium, for example, can be used. Note that the second oxide semiconductor layer 532 preferably contains indium because carrier mobility can be increased.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}/cm^3$, preferably lower than $1 \times 10^{15}/cm^3$, further preferably lower than $1 \times 10^{13}/cm^3$.

Further, in the oxide semiconductor layer, hydrogen, nitrogen, carbon, silicon, and metal elements except for main components are impurities. For example, hydrogen and nitrogen form donor levels to increase the carrier density. Silicon forms impurity levels in the oxide semiconductor layer. The impurity level becomes a trap, which might deteriorate the electric characteristics of the transistor. Therefore, it is preferable to reduce the concentration of the impurities in the first oxide semiconductor layer 531, the second oxide semiconductor layer 532, and the third oxide semiconductor layer 533 and at interfaces between the layers.

In order to make the oxide semiconductor layer intrinsic or substantially intrinsic, for example, the concentration of silicon at a certain depth of the oxide semiconductor layer or in a region of the oxide semiconductor layer, which is measured by secondary ion mass spectrometry (SIMS), is preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$. Further, the concentration of hydrogen at a certain depth of the oxide semiconductor layer or in a region of the oxide semiconductor layer is preferably lower than or equal to $2 \times 10^2$ atoms/$cm^3$, further preferably lower than or equal to $5 \times 10^{19}$ atoms/$cm^3$, still further preferably lower than or equal to $1 \times 10^{19}$ atoms/$cm^3$, yet still further preferably lower than or equal to $5 \times 10^{18}$ atoms/$cm^3$. Further, the concentration of nitrogen at a certain depth of the oxide semiconductor layer or in a region of the oxide semiconductor layer is preferably lower than $5 \times 10^{19}$ atoms/$cm^3$, further preferably lower than or equal to $5 \times 10^{18}$ atoms/$cm^3$, still further preferably lower than or equal to $1 \times 10^{18}$ atoms/$cm^3$, yet still further preferably lower than or equal to $5 \times 10^{17}$ atoms/$cm^3$.

In the case where the oxide semiconductor layer includes crystals, high concentration of silicon or carbon might reduce the crystallinity of the oxide semiconductor layer. In order not to lower the crystallinity of the oxide semiconductor layer, for example, the concentration of silicon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$. Further, the concentration of carbon at a certain depth of the oxide semiconductor layer or in a region of the oxide semiconductor layer may be lower than $1 \times 10^{19}$ atoms/$cm^3$, preferably lower than $5 \times 10^{18}$ atoms/$cm^3$, further preferably lower than $1 \times 10^{18}$ atoms/$cm^3$, for example.

A transistor in which a highly purified oxide semiconductor film is used for a channel formation region as described above has an extremely low off-state current, and the off-state current standardized on the channel width of the transistor can be as low as several yoctoamperes per micrometer to several zeptoamperes per micrometer. The voltage between the source and the drain in this case is, for example, about 0.1 V, 5 V, or 10 V.

Note that as the gate insulating film of the transistor, an insulating film containing silicon is used in many cases; therefore, it is preferable that a region of the oxide semiconductor layer, which serves as a channel, be not in contact with the gate insulating film for the above-described reason. In the case where a channel is formed at the interface between a gate insulating film and an oxide semiconductor layer, scattering of carriers occurs at the interface, whereby the field-effect mobility of a transistor is reduced in some cases. Also from the view of the above, it is preferable that a region of the oxide semiconductor layer, which serves as a channel, be separated from the gate insulating film.

Therefore, with the oxide semiconductor layer 530 having a stacked-layer structure including the first oxide semiconductor layer 531, the second oxide semiconductor layer 532, and the third oxide semiconductor layer 533, the second oxide semiconductor layer 532 where a channel of the transistor is formed can be separated from the gate insulating film; accordingly, the transistor can have a high field-effect mobility and stable electrical characteristics.

Next, the band structure of the oxide semiconductor layer 530 will be described. A stack corresponding to the oxide semiconductor layer 530 is formed, and in the stack, an In—Ga—Zn oxide having an energy gap of 3.5 eV is used as a layer corresponding to each of the first oxide layer 531 and the third oxide layer 533 and an In—Ga—Zn oxide having an energy gap of 3.15 eV is used as a layer corresponding to the second oxide semiconductor layer 532. The band structure thereof is analyzed. Note that the stack is referred to as the oxide semiconductor layer 530, and the layers included in the stack are referred to as the first oxide layer 531, the second oxide semiconductor layer 532, and the third oxide layer 533, for convenience.

The energy gap was measured with use of a spectroscopic ellipsometer (UT-300 manufactured by HORIBA Jobin Yvon) under the condition where the thicknesses of each of the first oxide layer 531, the second oxide semiconductor layer 532, and the third oxide layer 533 was 10 nm. The energy difference between the vacuum level and the top of the valence band was measured using an ultraviolet photoelectron spectroscopy (UPS) device (VersaProbe, ULVAC-PHI, Inc.).

Figure 17A:
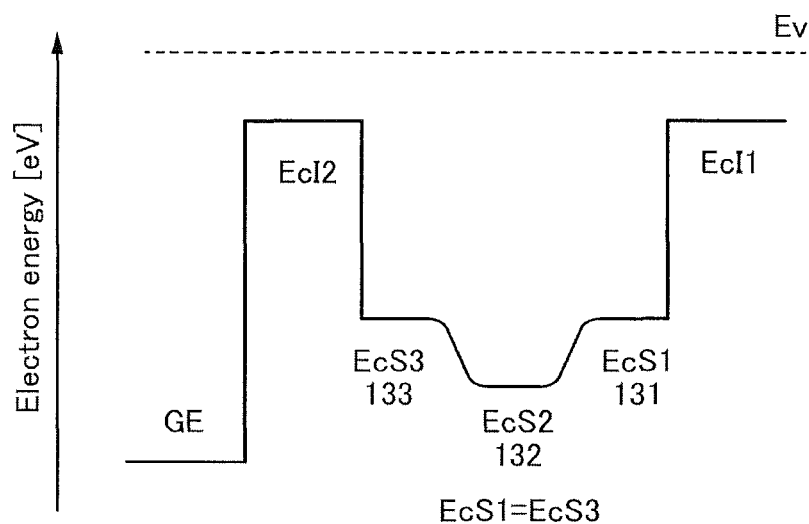
FIGS. 17A and 17B each show a band structure of oxide semiconductor layers.

FIG. 17A schematically shows part of a band structure of an energy gap (electron affinity) between the vacuum level and the bottom of the conduction band of each layer, which is calculated by subtracting the energy gap of each layer from the energy gap between the vacuum level and the top of the valence band. FIG. 17A is a band diagram showing the case where a silicon oxide film is provided in contact with the first oxide semiconductor layer 531 and the third oxide semiconductor layer 533. Here, $E_v$ represents energy of the vacuum level, EcI1 and EcI2 represent energy at the bottom of the conduction band of the silicon oxide film, EcS1 represents energy at the bottom of the conduction band of the first oxide semiconductor layer 531, EcS2 represents energy at the bottom of the conduction band of the second oxide semiconductor layer 532, and EcS3 represents energy at the bottom of the conduction band of the third oxide semiconductor layer 533. Further, in forming a transistor, a gate electrode (the second gate electrode 572 in the transistor 500) is to be in contact with a silicon oxide film having EcI2.

As shown in FIG. 17A, the energies of the bottoms of the conduction bands of the first oxide semiconductor layer 531, the second oxide semiconductor layer 532, and the third oxide semiconductor layer 533 are changed continuously. This can be understood also from the fact that the compositions of the first oxide semiconductor layer 531, the second oxide semiconductor layer 532, and the third oxide semiconductor layer 533 are close to one another and oxygen is easily diffused among the first oxide semiconductor layer 531, the second oxide semiconductor layer 532, and the third oxide semiconductor layer 533. Thus, the first oxide semiconductor layer 531, the second oxide semiconductor layer 532, and the third oxide semiconductor layer 533 have a continuous physical property although they are a stack of layers having different compositions. In the drawings in this specification, interfaces between the layers of the stack are indicated by dotted lines.

The oxide semiconductor layer 530 in which layers containing the same main components are stacked is formed to have not only a simple stacked-layer structure of the layers but also a continuous energy band (here, in particular, a well structure having a U shape in which energies of the bottoms of the conduction bands are changed continuously between layers). In other words, the stacked-layer structure is formed so that an impurity which forms a defect state serving as a trap canter or a recombination center in an oxide semiconductor does not exist at interfaces between the layers. If impurities are mixed between the stacked oxide semiconductor layers, the continuity of the energy band is lost and carriers disappear by a trap or recombination in some cases.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $1 \times 10^{-4}$ Pa to $5 \times 10^{-7}$ Pa) by an adsorption vacuum pump such as a cryopump and that the chamber be able to heat a substrate over which a film is to be deposited to 100° C. or higher, preferably 500° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evaporation in a chamber but also high purity of a sputtering gas is necessary to obtain a high-purity intrinsic oxide semiconductor. When a highly purified gas having a dew point of −40° C. or lower, preferably −80° C. or lower, further preferably −100° C. or lower is used as an oxygen gas or an argon gas used as a sputtering gas, moisture or the like can be prevented from entering an oxide semiconductor as much as possible.

Note that FIG. 17A shows the case where EcS1 and EcS3 are similar to each other, however, EcS1 and EcS3 may be different from each other. For example, FIG. 17B shows part of the band structure in which EcS1 is higher than EcS3.

For example, when EcS1 is equal to EcS3, an In—Ga—Zn oxide whose atomic ratio of In to Ga and Zn is 1:3:2, 1:6:4, or 1:9:6 can be used for the first oxide semiconductor layer 531 and the third oxide semiconductor layer 533 and an In—Ga—Zn oxide whose atomic ratio of In to Ga and Zn is 1:1:1 or 3:1:2 can be used for the second oxide semiconductor layer 532. Further, when EcS1 is higher than EcS3, an In—Ga—Zn oxide whose atomic ratio of In to Ga and Zn is 1:6:4 or 1:9:6 can be used for the first oxide semiconductor layer 531, an In—Ga—Zn oxide whose atomic ratio of In to Ga and Zn is 1:1:1 or 3:1:2 can be used for the second oxide semiconductor layer 532, and an In—Ga—Zn oxide whose atomic ratio of In to Ga and Zn is 1:3:2 can be used for the third oxide semiconductor layer 533, for example.

Figure 17B:
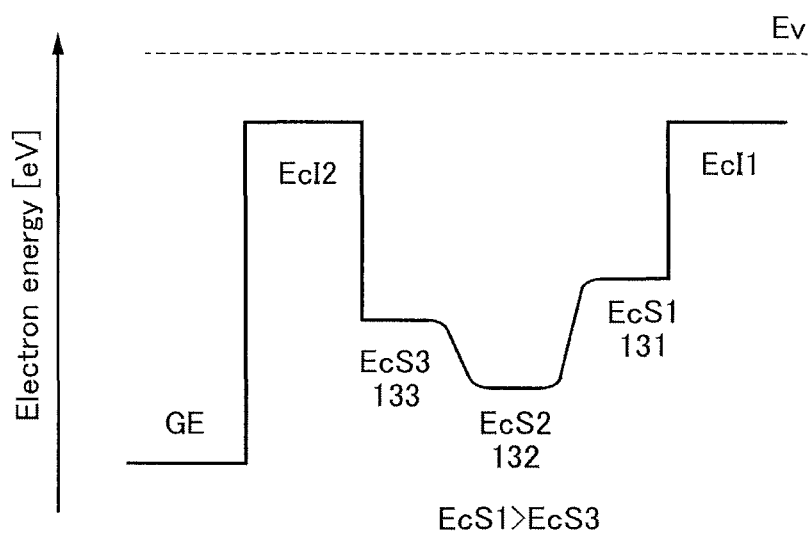

According to FIGS. 17A and 17B, the second oxide semiconductor layer 532 of the oxide semiconductor layer 530 serves as a well, so that a channel is formed in the second oxide semiconductor layer 532 in a transistor including the oxide semiconductor layer 530. Note that since the energies of the bottoms of the conduction bands are changed continuously, the oxide semiconductor layer 530 can also be referred to as a U-shaped well. Further, a channel formed to have such a structure can also be referred to as a buried channel.

Note that trap levels due to impurities or defects might be formed in the vicinity of the interface between an insulating film such as a silicon oxide film and each of the first oxide semiconductor layer 531 and the third oxide semiconductor layer 533. The second oxide semiconductor layer 532 can be distanced away from the trap levels owing to existence of the first oxide semiconductor layer 531 and the third oxide semiconductor layer 533. However, when the energy difference between EcS1 and EcS2 and the energy difference between EcS3 and EcS2 is small, an electron in the second oxide semiconductor layer 532 might reach the trap level by passing over the energy difference. When the electron is captured by the trap levels, negative charges are generated at the interface between the insulating film and the oxide semiconductor layer, so that the threshold voltage of the transistor is shifted in the positive direction.

Thus, the energy difference between EcS1 and EcS2 and the energy difference between EcS3 and EcS2 are each preferably greater than or equal to 0.1 eV, further preferably greater than or equal to 0.15 eV, so that the amount of change of the threshold voltage of the transistor is reduced and stable electrical characteristics can be obtained.

Note that at least one of the first oxide semiconductor layer 531, the second oxide semiconductor layer 532, and the third oxide semiconductor layer 533 preferably includes a crystal part. For example, the first oxide semiconductor layer 531 is amorphous, and the second oxide semiconductor layer 532 and the third oxide semiconductor layer 533 each include a crystal part. Since the second oxide semiconductor layer 532 where a channel is formed includes a crystal part, the transistor can have stable electrical characteristics.

It is particularly preferable that crystal parts included in the second oxide semiconductor layer 532 and the third oxide semiconductor layer 533 each include a crystal whose c-axis is aligned in a direction approximately perpendicular to its surface.

In the transistor having the structure in FIGS. 16A and 16B, the third oxide semiconductor layer 533 is in contact with the source electrode 540 and the drain electrode 550, and it is preferable that the energy gap of the third oxide semiconductor layer 533 be not large like an insulator and the film thickness of the third oxide semiconductor layer 533 be small in order that current can be extracted efficiently. Further, in the case where an In—Ga—Zn oxide is used for the oxide semiconductor layer 530, it is preferable that the third oxide semiconductor layer 533 contain less In than the second oxide semiconductor layer 532 so that diffusion of In to the gate insulating film can be prevented.

For the source electrode layer 540 and the drain electrode layer 550, a conductive material which is easily bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that a conductive material which easily reacts with oxygen includes a material where oxygen is easily diffused.

When a conductive material which easily reacts with oxygen is in contact with an oxide semiconductor layer, a phenomenon where oxygen in the oxide semiconductor layer is diffused into the conductive material which easily reacts with oxygen occurs. The phenomenon noticeably occurs when the temperature is high. Since the fabrication process of the transistor involves some heat treatment steps, the above phenomenon causes generation of oxygen vacancies in a region of the oxide semiconductor layer, which is in contact with the source electrode or the drain electrode, and the region is changed to an n-type. Accordingly, the n-type regions can serve as a source or a drain region of the transistor.

The n-type region is represented as a boundary 535 by a dotted line in the oxide semiconductor layer 530 of the transistor in FIGS. 16A and 16B. The boundary 535 is the boundary between an intrinsic semiconductor region and the n-type semiconductor region. In the oxide semiconductor layer 530, a region near and in contact with the source electrode 540 or the drain electrode 550 becomes the n-type region. The boundary 535 is schematically illustrated here, but actually the boundary is not clearly seen in some cases. Further, the boundary 535 extends in the lateral direction in the second oxide semiconductor layer 532 in FIGS. 16A and 16B; however, the boundary 535 may extend in the lateral direction in the first oxide semiconductor layer 531 or the third oxide semiconductor layer 533. In the oxide semiconductor layer 530, a region sandwiched between the base insulating film 520 and the source electrode layer 540 or between the base insulating film 520 and the drain electrode layer 550 may become n-type entirely in the film thickness direction.

However, in the case of forming a transistor with an extremely short channel length, the n-type region which is formed by the generation of the oxygen vacancies sometimes extends in the channel length direction of the transistor. In that case, electrical characteristics of the transistor change; for example, the threshold voltage shifts or on/off of the transistor cannot be controlled with the gate voltage (i.e., the transistor is on). Accordingly, when a transistor with an extremely short channel length is formed, it is not always preferable that the conductive material which is easily bonded to oxygen be used for a source electrode layer and a drain electrode layer.

Figure 18A:
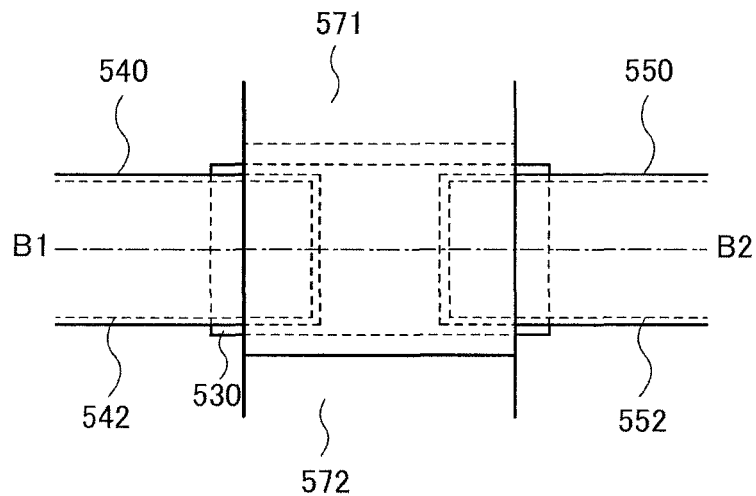
FIGS. 18A and 18B are a top view and a cross-sectional view, respectively, illustrating a transistor.
Figure 18B:
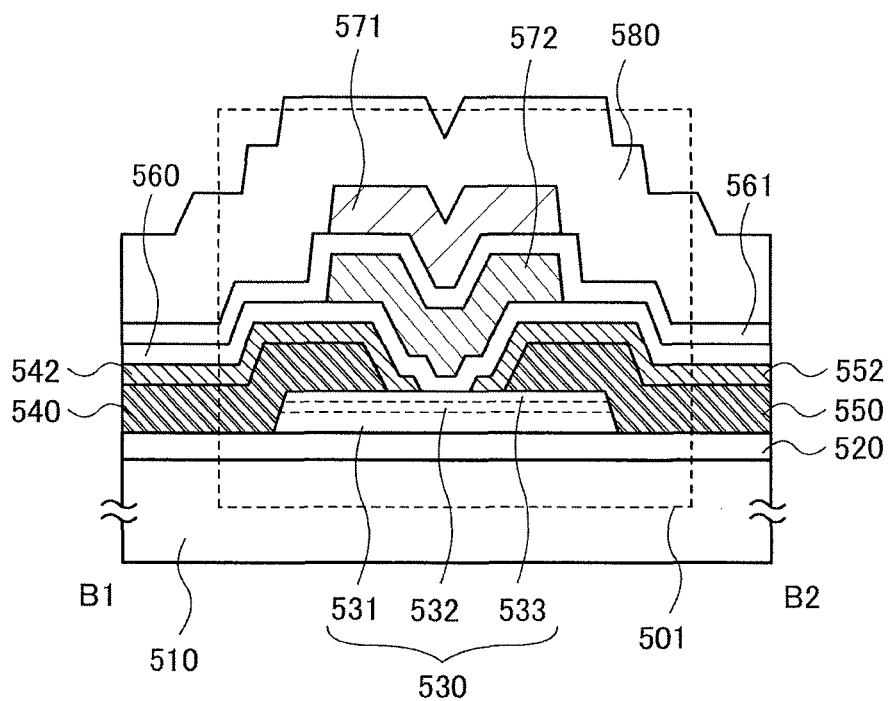

Thus, the source electrode and the drain electrode may have a stacked structure. In this case, as in a structure of a transistor 501 illustrated in FIGS. 18A and 18B, to cover the source electrode 540 and the drain electrode 550 a second source electrode 542 and a second drain electrode 552 may be formed using a conductive material that is not easily bonded to oxygen. FIG. 18A is a top view, and a cross section taken along a dashed-dotted line B1-B2 in FIG. 18A is illustrated in FIG. 18B. Note that for simplification of the drawing, some components in the top view in FIG. 18A are not illustrated.

For example, the titanium film can be used for the source electrode 540 and the drain electrode 550, and a material including tantalum nitride, titanium nitride, or ruthenium can be used for the second source electrode 542 and the second drain electrode 552. Note that the conductive material which is not likely to be bonded to oxygen includes, in its category, a material to which oxygen is not easily diffused.

By the use of the above conductive material which is not easily bonded to oxygen for the second source electrode 542 and the second drain electrode 552, generation of oxygen vacancies in the channel formation region of the oxide semiconductor layer can be suppressed, so that change of the channel to an n-type can be suppressed. In this manner, even a transistor with an extremely short channel length can have favorable electrical characteristics.

Note that when the source electrode and the drain electrode are formed by using only the conductive material which does not easily react with oxygen, the contact resistance to the oxide semiconductor layer 530 is excessively high. Therefore, as illustrated in FIGS. 18A and 18B, it is preferable that the source electrode 540 and the drain electrode 550 are formed over the oxide semiconductor layer 530 and the second source electrode 542 and the second drain electrode 552 are formed to cover the source electrode 540 and the drain electrode 550.

In this case, it is preferable that contact areas of the source electrode 540 and the drain electrode 550 with the oxide semiconductor layer 530 are made to be large and contact resistance is reduced by a region which becomes an n-type region due to generation of oxygen vacancies. It is preferable that contact areas of the second source electrode 542 and the second drain electrode 552 with the oxide semiconductor layer 530 are made to be small. When the contact resistance of the second source electrode 542 and the second drain electrode 552 with the oxide semiconductor layer 530 is large, electrical characteristics of the transistor are degraded in some cases.

Note that the stack does not necessary have the above structure in the case where a nitride such as tantalum nitride or titanium nitride is used for the second source electrode 542 and the second drain electrode 552. This is because when nitrogen in the nitride is slightly diffused to a vicinity of the oxide semiconductor layer 530, nitrogen effects formation of a donor level and forms an n-type region in the oxide semiconductor layer 530; accordingly, the contact resistance can be reduced.

The distance between the source electrode 540 and the drain electrode 550 is set to 0.8 μm or longer, preferably 1.0 μm or longer. In the case where the distance is shorter than 0.8 μm, influence of oxygen vacancies generated in the channel formation region cannot be eliminated, which causes deterioration of the electrical characteristics of the transistor.

Even when the distance between the second source electrode layer 542 and the second drain electrode 552 is, for example, 30 nm or shorter, the transistor can have favorable electrical characteristics.

Each of the gate insulating film 560 and the insulating film 561 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 560 may be a stack of any of the above materials.

For the first gate electrode 571 and the second gate electrode 572, a conductive film formed using Al, Ti, Cr, Co, Ni, Cu, Y, Zr, Mo, Ru, Ag, Ta, W, or the like can be used. The gate electrode may be a stack of any of the above materials.

Over the insulating film 561 and the first gate electrode 571, the oxide insulating layer 580 may be formed. The oxide insulating layer can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating layer may be a stack of any of the above materials.

Here, the oxide insulating layer 580 preferably contains excess oxygen. The oxide insulating layer having excess oxygen means an oxide insulating layer from which oxygen can be released by heat treatment or the like. The oxide insulating layer is preferably such a film that the amount of released oxygen converted into oxygen atoms is $1.0 \times 10^{19}$ atoms/cm$^3$ or more in thermal desorption spectroscopy analysis. Oxygen released from the oxide insulating layer can be diffused to a channel formation region of the oxide semiconductor layer 530 through the insulating film 561 and the gate insulating film 560, so that oxygen vacancies which are undesirably formed can be filled with the oxygen. In this manner, stable electrical characteristics of the transistor can be achieved.

The above is the description of the transistor of one embodiment of the present invention. The transistor has favorable electrical characteristics, so that a semiconductor device having high long-term reliability can be provided.

Figure 19A:
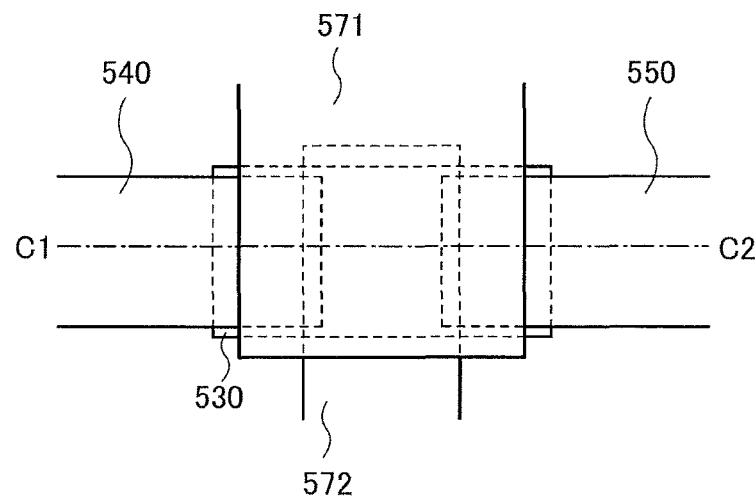
FIGS. 19A and 19B are a top view and a cross-sectional view, respectively, illustrating a transistor.
Figure 19B:
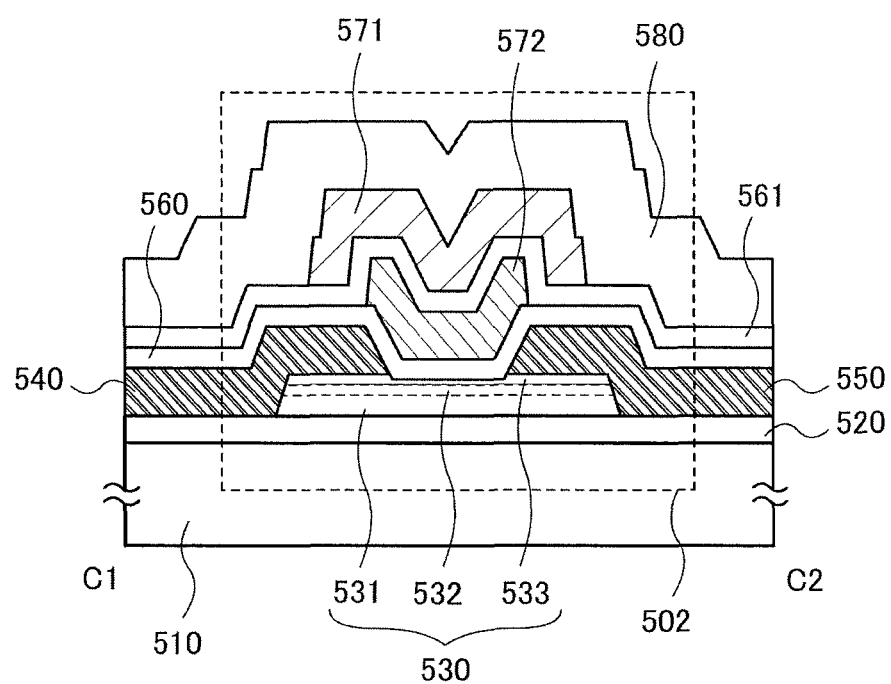

Note that a transistor of one embodiment of the present invention may have a structure illustrated in FIGS. 19A and 19B. FIG. 19A is a top view. A cross section taken along dashed-dotted line C1-C2 in FIG. 19A corresponds to FIG. 19B. Note that for simplification of the drawing, some components in the top view in FIG. 19A are not illustrated. A transistor 502 in FIGS. 19A and 19B is different from the transistor 500 in FIGS. 16A and 16B in the shape of the second gate electrode 572. In the transistor 502, the second gate electrode 572 is formed so as not to overlap with the source electrode 540 and the drain electrode 550 as much as possible. Thus, parasitic capacitance between the second gate electrode 572 and the source electrode 540 and parasitic capacitance between the second gate electrode 572 and the drain electrode 550 can be made small. Accordingly, capacitance of a capacitor formed with the first gate electrode 571 and the second gate electrode 572 is relatively higher than capacitance (parasitic capacitance) of a portion around the capacitor, which leads to an improvement of controllability of the transistor with a gate voltage applied to the first gate electrode 571.

Figure 20A:
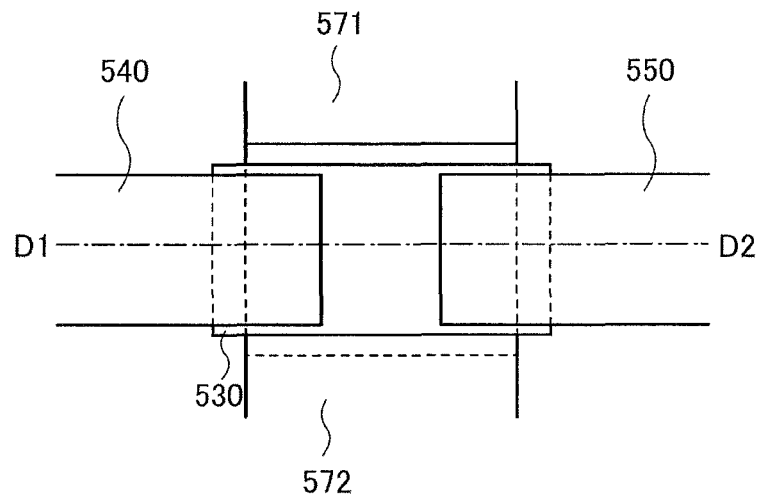
FIGS. 20A and 20B are a top view and a cross-sectional view, respectively, illustrating a transistor.
Figure 20B:
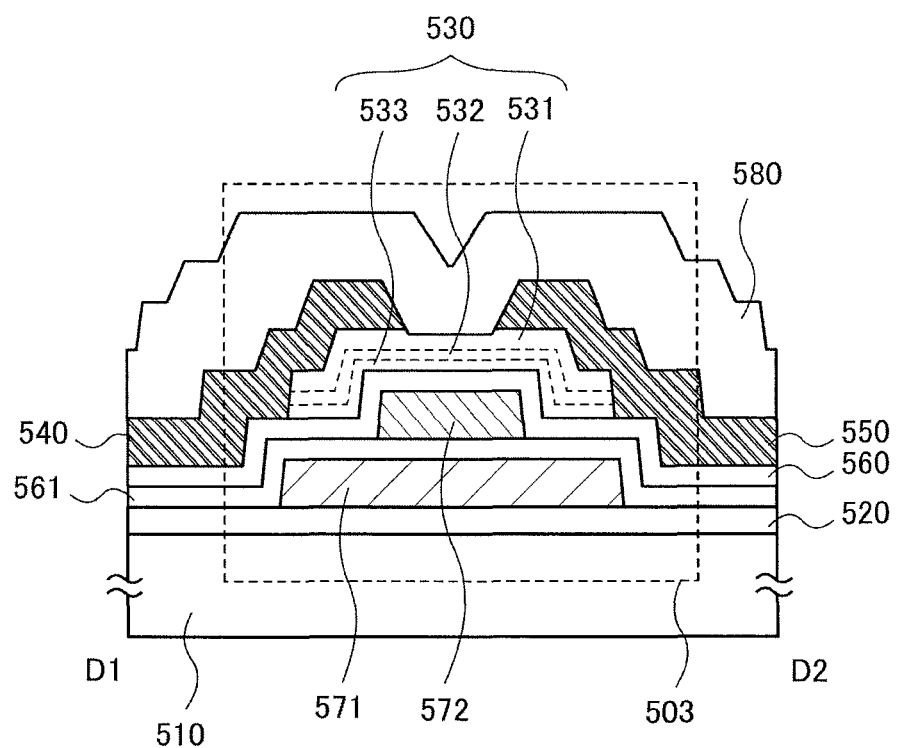

Note that a transistor of one embodiment of the present invention may have a structure illustrated in FIGS. 20A and 20B. FIG. 20A is a top view, and a cross section taken along a dashed-dotted line D1-D2 in FIG. 20A is illustrated in FIG. 20B. Note that for simplification of the drawing, some components in the top view in FIG. 20A are not illustrated.

A transistor 503 in FIGS. 20A and 20B has a channel-etched back-gate structure, and includes the base insulating film 520 over the substrate 510, the first gate electrode 571 over the base insulating film, the insulating film 561 over the base insulating film and the first gate electrode, the second gate electrode 572 that is over the insulating film so as to overlap with the first gate electrode, the gate insulating film 560 over the second gate electrode and the insulating film 561, the oxide semiconductor layer 530 that is over the gate insulating film so as to overlap with the first gate electrode 571 and the second gate electrode 572, and the source electrode 540 and the drain electrode 550 over the oxide semiconductor layer. Further, the oxide insulating layer 580 may be formed over the oxide semiconductor layer 530, the source electrode, and the drain electrode. Note that the oxide insulating layer may be provided as needed and another insulating layer may be further provided thereover.

Like the transistor 502, the transistor 503 preferably has a structure in which the second gate electrode 572 does not overlap with the source electrode 540 or the drain electrode 550 as much as possible in order to make parasitic capacitance small. In the case where the transistor 503 is used in a display device or the like, the first gate electrode 571 serves as a light-blocking layer, whereby light toward the oxide semiconductor layer 530 from a backlight or the like can be blocked. Thus, light deterioration of the transistor 503 can be prevented, and accordingly a high-reliable semiconductor device can be provided.

Note that in the transistor 500 and the transistor 501 each of which have top-gate structure, a light-blocking layer can be provided between the base insulating film 520 and the substrate 510.

Figure 21A:
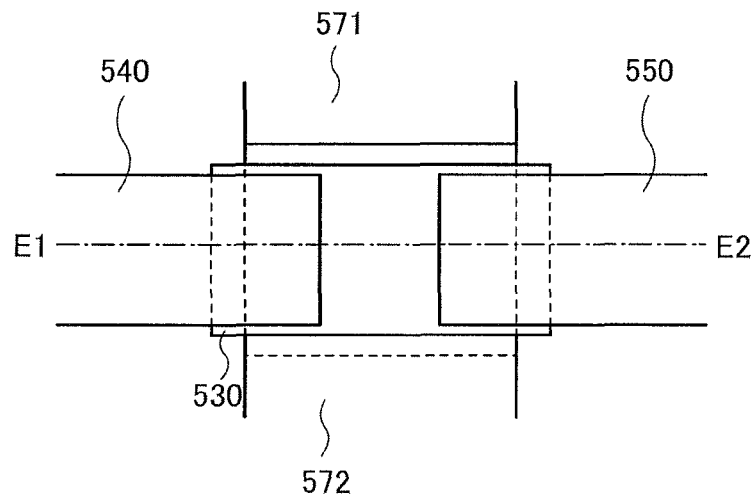
FIGS. 21A and 21B are a top view and a cross-sectional view, respectively, illustrating a transistor.
Figure 21B:
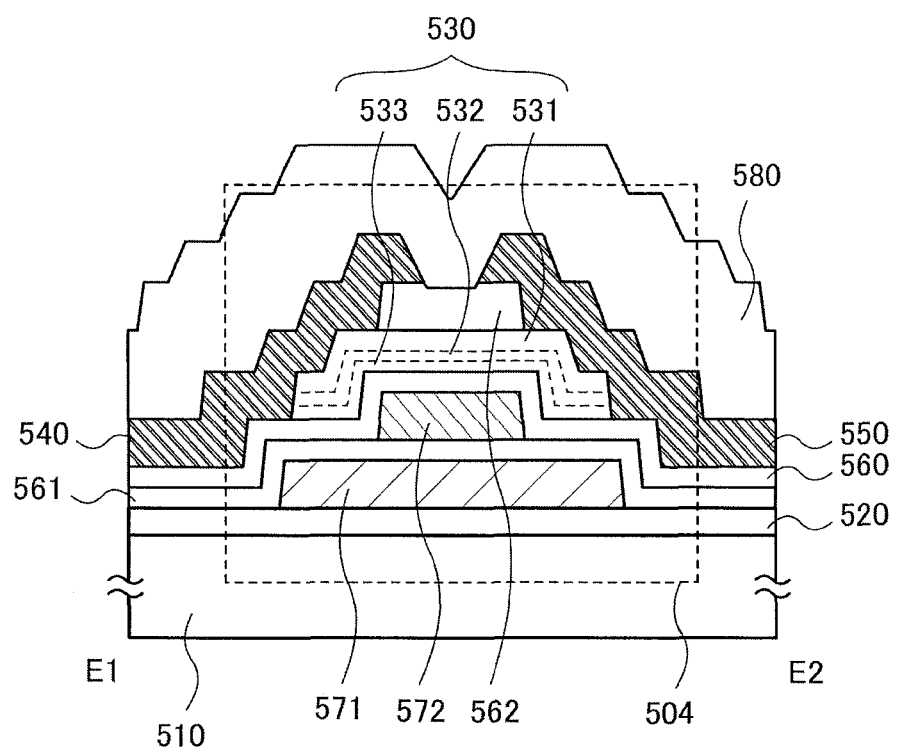

Note that a transistor that is one embodiment of the present invention may have a structure illustrated in FIGS. 21A and 21B. FIG. 21A is a top view, and a cross section taken along a dashed-dotted line E1-E2 in FIG. 21A is illustrated in FIG. 21B. Note that for simplification of the drawing, some components in the top view in FIG. 21A are not illustrated.

A transistor 504 in FIGS. 21A and 21B has a channel-protective back-gate structure obtained by forming a protective film 562 in the structure of the transistor 503. With the protective film 562, the oxide semiconductor layer 530 can be prevented from being over-etched. In the case where dry etching is performed as an etching step, plasma damage on the oxide semiconductor layer 530 can be suppressed. Thus, when a plurality of transistors are formed on a large area, the transistors have less variation in electric characteristics and have high reliability. The protective film 562 can be formed using a material applicable to the base insulating film 520, the gate insulating film 560, the insulating film 561, and the oxide insulating layer 580.

Note that a semiconductor layer that is formed in a manner similar to that of the oxide semiconductor layer 530 can be used for forming a resistor. Further, a protective circuit can be formed using the resistor. The protective circuit protects against damage from static electricity or the like.

In each of the top views showing the structures of the transistors 500 to 504, each of the lengths of the source electrode 540 and the drain electrode 550 is shorter than the length of the oxide semiconductor layer 530 in the channel width direction (in the transistor 501, each of the lengths of the second source electrode 542 and the second drain electrode 552 is also shorter than that of the oxide semiconductor layer 530). In the case where the end of the oxide semiconductor layer 530 along the channel width direction is covered with the source electrode 540 or the drain electrode 550, the electric field from the first gate electrode 571 or the second gate electrode 572 is partly blocked, and accordingly the electric field is less likely to be applied to the oxide semiconductor layer 530.

Figure 22A:
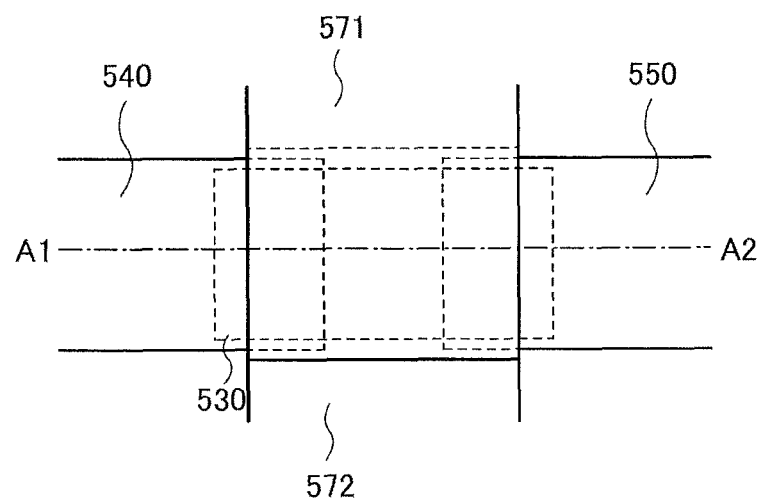
FIGS. 22A and 22B are top views each illustrating a transistor.
Figure 22B:
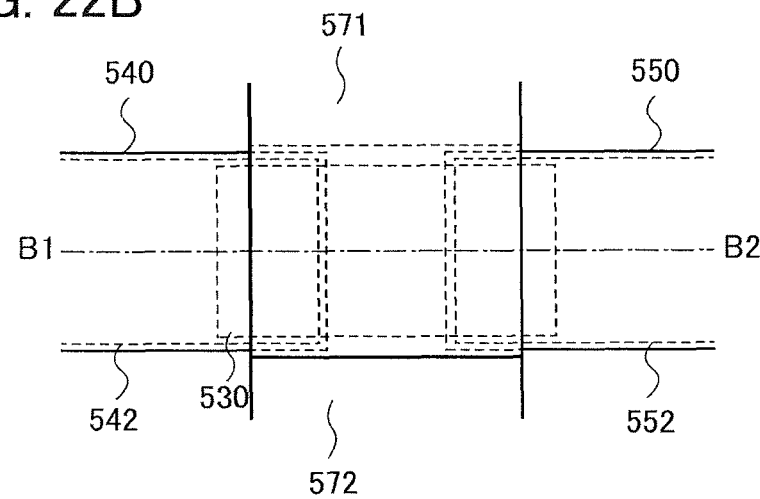
Figure 23A:
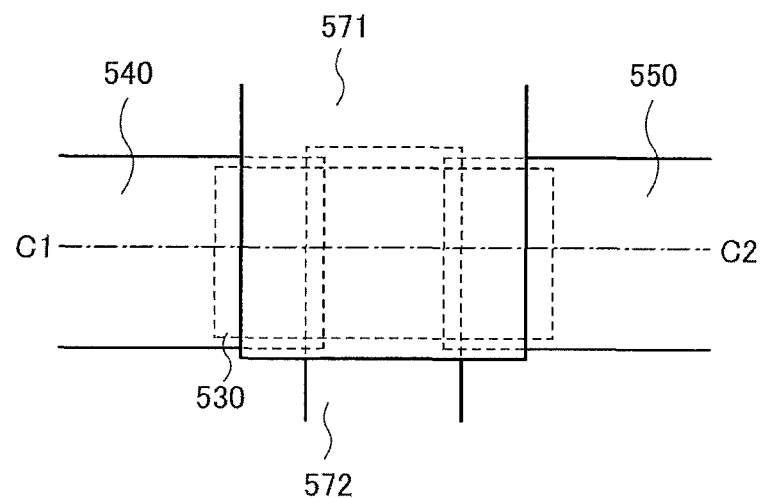
FIGS. 23A and 23B are top views each illustrating a transistor.
Figure 23B:
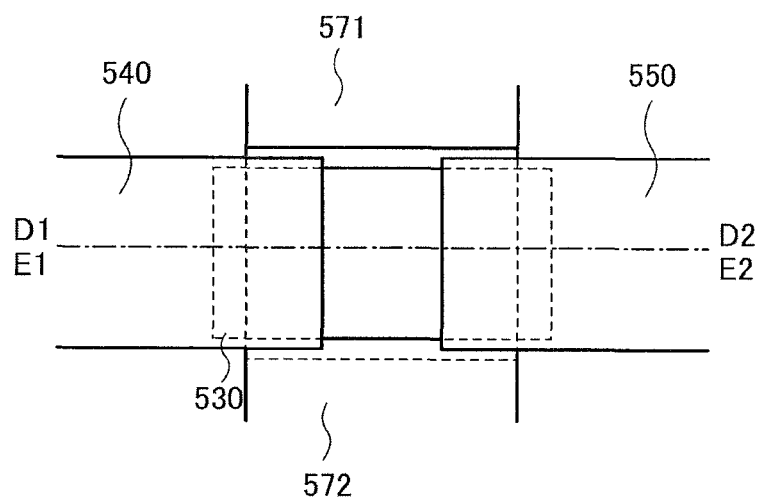

Thus, the source electrode 540 and the drain electrode 550 have preferably the above-described shape; however, the shape thereof is not limited thereto as long as the electric characteristics of the transistor are sufficiently obtained. For example, in the transistor 500 and the transistor 501, each of the lengths of the source electrode 540 and the drain electrode 550 may be longer than that of the oxide semiconductor layer 530 in the channel width direction as illustrated in FIGS. 22A and 22B. Further, for the transistor 502, a structure illustrated in FIG. 23A may be employed. Further, for the transistor 503 and the transistor 504, a structure illustrated in FIG. 23B may be employed. With any of the structures in FIGS. 22A and 22B and FIGS. 23A and 23B, a photolithography process is easily performed.

Figure 31:
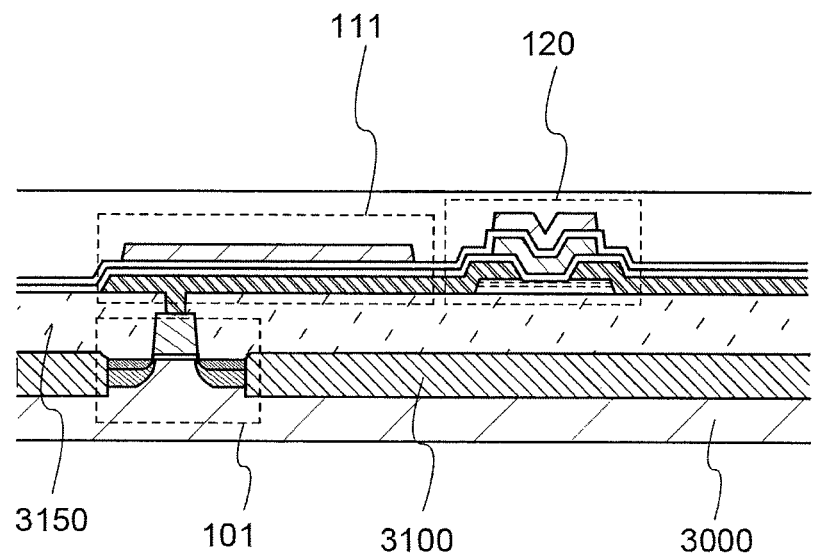
FIG. 31 is a cross-sectional view of a semiconductor device.

FIG. 31 shows an example of a cross section in which the transistor 500 illustrated in FIGS. 16A and 16B is applied to the semiconductor device 100 (FIG. 1) described in Embodiment 1. Note that the transistor 500 corresponds to the circuit 120 in FIG. 1, and the second transistor 102 and the second capacitor 112 in the circuit is included in the transistor 500.

In the semiconductor device in FIG. 31, the first transistor 101 using a first semiconductor material is provided in the lower part, and the circuit 120 (the transistor 500) including the second transistor 102 using a second semiconductor material and the second capacitor 112 is provided in the upper part.

Further, the first capacitor 111 can be formed in the same process as that of the transistor 500 when the first capacitor 111 has such a structure that one of electrodes is formed using the same material as the source or drain electrode of the transistor 500, the other electrode is formed using the same material as the first gate electrode of the transistor 500, and the dielectric is formed using the same material as the gate insulating film and the insulating layer of the transistor 500. Note that the first capacitor 111 can have such a structure in which the other electrode is formed using the second gate electrode of the transistor 500, and the dielectric is formed using only the gate insulating film.

The first transistor 101 in FIG. 31 includes a channel formation region provided in a substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode provided over the gate insulating film. Note that a transistor whose source electrode and drain electrode are not illustrated explicitly in a drawing may be referred to as a transistor for the sake of convenience. Further, in such a case, in description of connection relation of a transistor, a source region and a source electrode are collectively referred to as a "source electrode," and a drain region and a drain electrode are collectively referred to as a "drain electrode". That is, in this specification, the term "source electrode" may include a source region.

Further, an element isolation insulating layer 3100 is formed on the substrate 3000 so as to surround the first transistor 101, and an insulating layer 3150 is formed so as to cover the first transistor 101. Note that the element isolation insulating layer 3100 can be formed by an element isolation technique such as local oxidation of silicon (LOCOS) or shallow trench isolation (STI).

For example, in the case where the substrate 3000 is formed using a crystalline silicon substrate, the first transistor 101 can operate at high speed. Thus, when the transistor is used as a reading transistor, data can be read at a high speed.

The circuit 120 (transistor 500) is provided over the insulating layer 3150, and one of the source electrode and the drain electrode thereof is extended so as to function as the one electrode of the first capacitor 111. Further, the one electrode of first capacitor 111 is electrically connected to the gate electrode layer of the first transistor 101.

The first transistor 101 can be formed so as to overlap with the transistor 500 or the first capacitor 111 as illustrated in FIG. 31, whereby the area occupied by them can be reduced. Accordingly, the degree of integration of the semiconductor device can be increased.

This embodiment can be combined with any of the other embodiments in this specification as appropriate.

Embodiment 5

In this embodiment, a method for forming the transistor 500 described in Embodiment 4 with reference to FIGS. 16A and 16B will be described with reference to FIGS. 24A to 24C and FIGS. 25A to 25C. Note that for the transistors 501 to 504 illustrated in FIGS. 18A and 18B, FIGS. 19A and 19B, FIGS. 20A and 20B, and FIGS. 21A and 21B, refer to the method for manufacturing a transistor described in this embodiment and the embodiments where the transistors 501 to 504 are described, and the resist mask used in a photolithography process and the order of steps are changed; the transistors can be formed.

The substrate 510 may be a glass substrate, a ceramic substrate, a quartz substrate, a sapphire substrate, or the like. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 520 can be formed by a plasma CVD method, a sputtering method, or the like, using an oxide insulating film, a nitride insulating film, or a mixed material thereof. Examples of oxide insulating films include aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide. Examples of nitride insulating films include silicon nitride, silicon nitride oxide, aluminum nitride, and aluminum nitride oxide. Alternatively, a stack containing any of the above materials may be used, and at least an upper layer of the base insulating film 520, which is in contact with the oxide semiconductor layer 530, is preferably formed using a material containing oxygen that might serve as a supply source of oxygen to the oxide semiconductor layer 530.

In the case where a surface of the substrate 510 is made of an insulator and there is no influence of impurity diffusion to the oxide semiconductor layer 530 to be formed later, the base insulating film 520 is not necessarily provided.

Figure 24A:
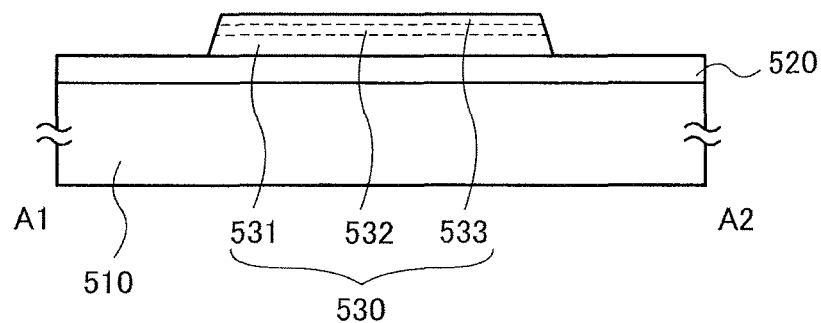
FIGS. 24A to 24C illustrate a method for manufacturing a transistor.

Next, over the base insulating film 520, the first oxide semiconductor layer 531, the second oxide semiconductor layer 532, and the third oxide semiconductor layer 533 are deposited by a sputtering method, a CVD method, an MBE method, an ALD method, a PLD method and then selectively etched, whereby the oxide semiconductor layer 530 is formed (see FIG. 24A). Note that heating may be performed before etching.

For the first oxide semiconductor layer 531, the second oxide semiconductor layer 532, and the third oxide semiconductor layer 533, the material described in Embodiment 4 can be used. For example, the first oxide semiconductor layer 531 can be formed using an In—Ga—Zn oxide whose atomic ratio of In to Ga and Zn is 1:3:2, the second oxide semiconductor layer 532 can be formed using an In—Ga—

Zn oxide whose atomic ratio of In to Ga and Zn is 1:1:1, and the third oxide semiconductor layer 533 can be formed using an In—Ga—Zn oxide whose atomic ratio of In to Ga and Zn is 1:3:2.

An oxide semiconductor that can be used for each of the first oxide semiconductor layer 531, the second oxide semiconductor layer 532, and the third oxide semiconductor layer 533 preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that, for example, an In—Ga—Zn-based oxide means an oxide containing In, Ga, and Zn as its main components and there is no particular limitation on the ratio of In, Ga, and Zn. The In—Ga—Z-based oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used. Note that M represents one or more metal elements selected from Ga, Fe, Mn, or Co. Alternatively, a material represented by $In_2SnO_5(ZnO)_n$ (n>0, n is an integer) may be used.

Note that materials are selected so that the electron affinities of the first oxide semiconductor layer 531 and the third oxide semiconductor layer 533 are lower than that of the second oxide semiconductor layer 532, as described in Embodiment 4.

Note that the oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for each of the first oxide semiconductor layer 531, the second oxide semiconductor layer 532, and the third oxide semiconductor layer 533, a material whose atomic ratio of In to Ga and Zn is any of 1:1:1, 2:2:1, 3:1:2, 1:3:2, 1:4:3, 1:5:4, 1:6:6, 2:1:3, 1:6:4, 1:9:6, 1:1:4, and 1:1:2 is used so that the first oxide semiconductor layer 531 and the third oxide semiconductor layer 533 each have an electron affinity lower than that of the second oxide semiconductor layer 532.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content of the second oxide semiconductor layer 532 is preferably higher than those of the first oxide semiconductor layer 531 and the third oxide semiconductor layer 533. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the second oxide semiconductor layer 532, a transistor having high mobility can be achieved.

An oxide semiconductor may include a non-single-crystal, for example. The non-single-crystal state is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are shown in an electron diffraction pattern of the CAAC-OS in some cases. An electron diffraction pattern obtained with an electron beam having a diameter of 10 nmφ or smaller, or 5 nmφ or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

Figure 26A:
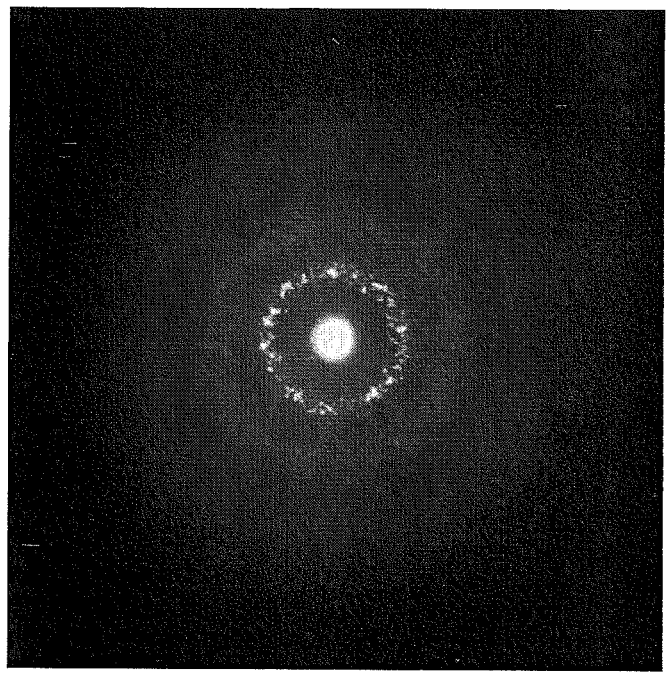
FIGS. 26A and 26B each show a nanobeam electron diffraction pattern of an oxide semiconductor.

FIG. 26A is an example of a nanobeam electron diffraction pattern of a sample including CAAC-OS. Here, the sample is cut in the direction perpendicular to a surface where the CAAC-OS is formed and the thickness thereof is reduced to about 40 nm. Further, an electron beam with a diameter of 1 nmϕ enters from the direction perpendicular to the cut surface of the sample. FIG. 26A shows that spots are observed in the nanobeam electron diffraction pattern of the CAAC-OS.

In each of the crystal parts included in the CAAC-OS, for example, a c-axis is aligned in a direction parallel to a normal vector of a surface where the CAAC-OS is formed or a normal vector of a surface of the CAAC-OS, triangular or hexagonal atomic arrangement that is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 100, preferably from −5° to 5°.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

The CAAC-OS could be obtained by reducing the impurity concentration, for example. The impurity means here an element other than the main components of the oxide semiconductor, such as hydrogen, carbon, silicon, or a transition metal element. In particular, an element such as silicon has a higher strength to bond with oxygen than that of a metal element included in the oxide semiconductor. Therefore, when the element takes oxygen away in the oxide semiconductor, the atomic arrangement in the oxide semiconductor is disrupted, whereby the crystallinity of the oxide semiconductor is lowered in some cases. In addition, a heavy metal such as iron or nickel, argon, carbon dioxide, or the like has a large atomic radius (or molecular radius), and thus disrupts the atomic arrangement in the oxide semiconductor, whereby the crystallinity of the oxide semiconductor is lowered in some cases. Hence, the CAAC-OS is an oxide semiconductor with a low impurity concentration. Note that the impurity included in the oxide semiconductor might serve as a carrier generation source.

In the CAAC-OS, distribution of crystal parts is not necessarily uniform. For example, in the formation process of the CAAC-OS, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is mixed into the CAAC-OS, the crystallinity of the crystal part in a region into which the impurity is mixed is lowered in some cases.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). Further, a highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. A charge trapped by a trap state in the oxide semiconductor takes a long time to be released and may behave like a fixed charge. Thus, the transistor which includes the oxide semiconductor having a high density of trap states in the channel formation region has unstable electrical characteristics in some cases.

With use of the highly purified intrinsic or substantially highly purified intrinsic CAAC-OS in a transistor, variation in the electrical characteristics of the transistor due to irradiation with visible light or ultraviolet light is small.

The CAAC-OS can be formed by a sputtering method using a DC power source, for example.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

In a TEM image of the polycrystalline oxide semiconductor, for example, crystal grains can be found. In most cases, the size of a crystal grain in the polycrystalline oxide semiconductor is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in the TEM image, a boundary between crystal grains can be found in the polycrystalline oxide semiconductor in some cases. Also in the TEM image, a grain boundary can be found in the polycrystalline oxide semiconductor in some cases.

The polycrystalline oxide semiconductor may include a plurality of crystal grains, and the alignment of crystals may be different in the plurality of crystal grains. When a polycrystalline oxide semiconductor is analyzed by an out-of-plane method with use of an XRD apparatus, a peak at 2θ of around 31 degrees which shows alignment or peaks showing plural kinds of alignment appears in some cases. Further, spots are observed in a nanobeam electron diffraction pattern of the polycrystalline oxide semiconductor in some cases.

The polycrystalline oxide semiconductor has high crystallinity and thus has high electron mobility in some cases. Accordingly, a transistor using the polycrystalline oxide semiconductor for a channel formation region has high field-effect mobility. Note that there are cases in which an impurity is segregated at the grain boundary between the crystals in the polycrystalline oxide semiconductor. Moreover, the grain boundary of the polycrystalline oxide semiconductor becomes a defect state. Since the grain boundary of the polycrystalline oxide semiconductor may serve as a carrier trap or a carrier generation source, a transistor using the polycrystalline oxide semiconductor for a channel formation region has larger variation in electrical characteristics and lower reliability than a transistor using a CAAC-OS for a channel formation region in some cases.

The polycrystalline oxide semiconductor can be formed by high-temperature heat treatment or laser light treatment.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than a diameter of a crystal part, a peak which shows alignment does not appear in some cases. Further, for example, a halo pattern is shown in some cases in an electron diffraction pattern of the nc-OS obtained by using an electron beam having a diameter larger than the diameter of a crystal part (for example, a beam diameter of 20 nmϕ or more, or 50 nmϕ or more). For example, spots are shown in some cases in a nanobeam electron diffraction pattern of the nc-OS obtained by using an electron beam having a diameter smaller than or equal to the diameter of a crystal part (for example, a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots are shown in the region in some cases.

Figure 26B:
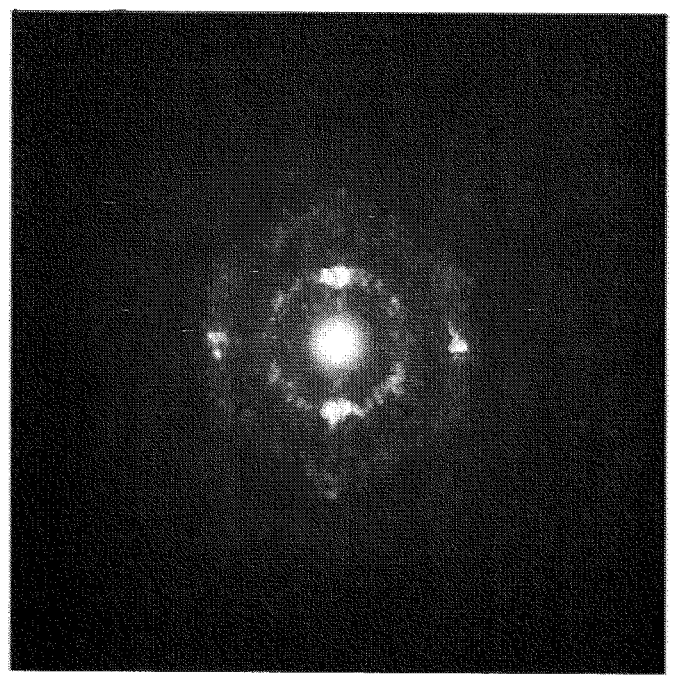

FIG. 26B is an example of a nanobeam electron diffraction pattern of a sample including an nc-OS. Here, the sample is cut in the direction perpendicular to a surface where the nc-OS is formed and the thickness thereof is reduced to about 40 nm. Further, an electron beam with a diameter of 1 nmϕ enters from the direction perpendicular to the cut surface of the sample. FIG. 26B shows that, in the nanobeam electron diffraction pattern of the nc-OS, regions with high luminance in a circular pattern are shown and a plurality of spots is shown in the regions.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Accordingly, the nc-OS has higher carrier density than the CAAC-OS in some cases. An oxide semiconductor with a high carrier density tends to have a high electron mobility. Therefore, a transistor using the nc-OS for a channel formation region has a high field-effect mobility in some cases. On the contrary, the nc-OS has higher density of defect states than the CAAC-OS and thus has higher density of trap states in some cases. Therefore, a transistor using the nc-OS for a channel formation region has larger variation in electrical characteristics and lower reliability than a transistor using the CAAC-OS for a channel formation region. Note that the nc-OS can be obtained even when the amount of impurities contained therein is relatively large; thus, the nc-OS is sometimes preferably used depending on the application. For example, the nc-OS may be formed by a deposition method such as a sputtering method using an AC power supply. The sputtering method using an AC power supply allows a film to be formed with high uniformity over a large substrate, so that a semiconductor device including a transistor using the nc-OS for a channel formation region can be manufactured with high productivity.

The oxide semiconductor may include an amorphous part. Note that an oxide semiconductor including an amorphous part is referred to as an amorphous oxide semiconductor. An amorphous oxide semiconductor, for example, has disordered atomic arrangement and no crystal part. An amorphous oxide semiconductor, for example, does not have a specific shape as in quartz and regularity in atomic arrangement.

In a TEM image of the amorphous oxide semiconductor, for example, crystal parts cannot be found in some cases.

When an amorphous oxide semiconductor is analyzed by an out-of-plane method with an XRD apparatus, a peak which shows alignment does not appear in some cases. Further, a halo pattern is observed in an electron diffraction pattern of an amorphous oxide semiconductor film in some cases. In other cases, a halo pattern is observed instead of a spot in a nanobeam electron diffraction pattern of the amorphous oxide semiconductor film.

The amorphous oxide semiconductor can be formed in some cases, for example, by introducing a high-concentration impurity such as hydrogen. Hence, the amorphous oxide semiconductor is, for example, an oxide semiconductor containing a high-concentration impurity.

When an oxide semiconductor contains a high-concentration impurity, a defect state such as an oxygen vacancy is formed in the oxide semiconductor in some cases. This means that an amorphous oxide semiconductor with a high-concentration impurity has a high density of defect states. In addition, since the amorphous oxide semiconductor has low crystallinity, the density of defect states of the amorphous oxide semiconductor is higher than that of the CAAC-OS or the nc-OS.

Thus, the amorphous oxide semiconductor has a much higher carrier density than the nc-OS in some cases. Therefore, a transistor using the amorphous oxide semiconductor for a channel formation region tends to be normally on. Further, in some cases, such an amorphous oxide semiconductor layer can be applied to a transistor which needs to be normally on. The amorphous oxide semiconductor has a high density of defect states and thus has a high density of trap states in some cases. Therefore, a transistor using the amorphous oxide semiconductor for a channel formation region has larger variation in electrical characteristics and lower reliability than a transistor using the CAAC-OS or the nc-OS for a channel formation region in some cases. Note that the amorphous oxide semiconductor can be formed by a deposition method in which a relatively large amount of impurity is contained, and thus can be easily obtained and preferably used depending on the application. For example, the amorphous oxide semiconductor may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor for a channel formation region can be manufactured with high productivity.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

An oxide semiconductor may include a single crystal, for example. Note that an oxide semiconductor including a single crystal is referred to as a single crystal oxide semiconductor.

The single crystal oxide semiconductor has, for example, a low impurity concentration and a low density of defect states (a small amount of oxygen vacancies), and thus has a low carrier density. Therefore, a transistor using the single crystal oxide semiconductor for a channel formation region is unlikely to be normally on. Further, the single crystal oxide semiconductor has a low density of defect states and thus has a low density of trap states in some cases. Therefore, a transistor using the single crystal oxide semiconductor for a channel formation region has a small variation in electrical characteristics and a high reliability in some cases The oxide semiconductor has a high density when including few defects, for example. The oxide semiconductor has a high density when having a high crystallinity, for example. The oxide semiconductor has a high density when including a low-concentration impurity such as hydrogen. For example, the density of a single crystal oxide semiconductor is higher than that of a CAAC-OS in some cases. For example, the density of a CAAC-OS is higher than that of a microcrystalline oxide semiconductor in some cases. For example, the density of a polycrystalline oxide semiconductor is higher than that of a microcrystalline oxide semiconductor in some cases. For example, the density of a microcrystalline oxide semiconductor is higher than that of an amorphous oxide semiconductor.

For example, a CAAC-OS film can be deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In this case, the pellet-like sputtered particle is electrically charged; without being aggregation in plasma, it reaches the substrate while maintaining its crystal state.

For the deposition of the CAAC-OS film, the following conditions are preferably used.

By reducing the amount of impurities entering the CAAC-OS layer during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As a sputtering target, an In—Ga—Zn—O compound target can be used, for example. The In—Ga—Zn—O compound target is a polycrystalline body which is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The grain size of the polycrystalline body is preferably as small as possible, for example, less than or equal to 1 μm. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor layer 532 can be improved, and in addition, impurities such as hydrogen and water can be removed from the base insulating film 520, the first oxide semiconductor layer 531, and the third oxide semiconductor layer 533. Note that a first heat treatment step may be performed before etching for formation of the oxide semiconductor layer 530.

In the case where the oxide semiconductor layer 530 is a stacked layer and an amorphous layer or a microcrystal layer is formed as a lower layer, a CAAC-OS film can be easily formed thereover. Thus, it is preferable that the first oxide semiconductor layer 531 be an amorphous layer or a microcrystal layer and the second oxide semiconductor layer 532 be a CAAC-OS film.

Next, a first conductive film that is to be the source electrode 540 and the drain electrode 550 in a later step is formed over the oxide semiconductor layer 530. For the first conductive film, Al, Cr, Cu, Ta, Tl, Mo, W, or an alloy material containing any of these as its main component can be used. For example, a 100-nm-thick titanium film is formed by a sputtering method or the like.

Figure 24B:
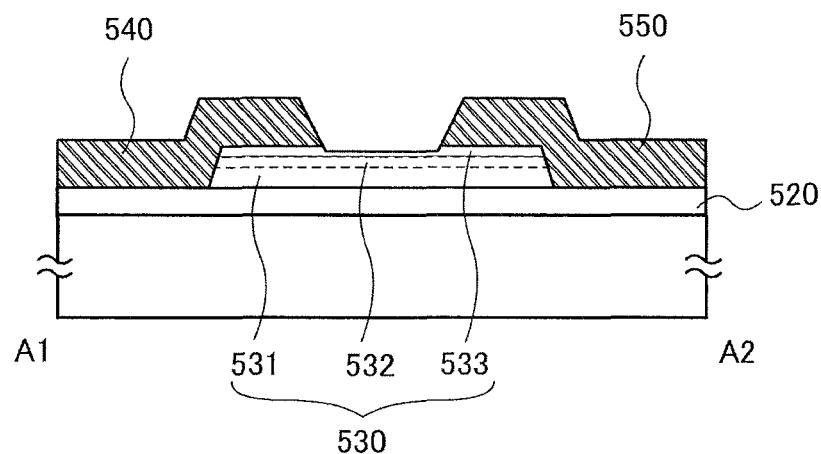

Next, the first conductive film is etched so as to be divided over the oxide semiconductor layer 530, so that the source electrode 540 and the drain electrode 550 are formed (see FIG. 24B).

At this time, the first conductive film is over-etched, so that the oxide semiconductor layer 530 is partly etched as illustrated in FIG. 24B. However, when the etching selectivity of the first conductive film to the oxide semiconductor layer 530 is high, the oxide semiconductor stack 530 is hardly etched.

Next, second heat treatment is preferably performed. The second heat treatment can be performed in a condition similar to that of the first heat treatment. By the second heat treatment, impurities such as hydrogen and water can be further removed from the oxide semiconductor layer 530.

Figure 24C:
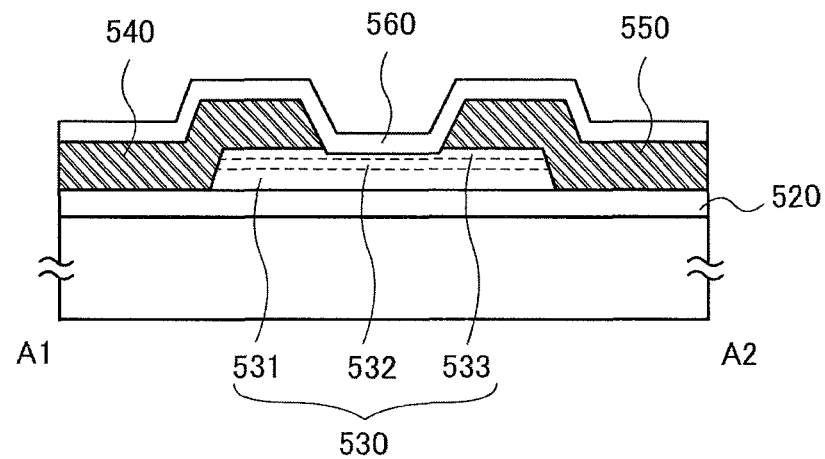

Next, the gate insulating film 560 is formed over the oxide semiconductor layer 530, the source electrode 540, and the drain electrode 550 (see FIG. 24C). The gate insulating film 560 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 560 may be a stack of any of the above materials. The gate insulating film 560 can be formed by a sputtering method, a CVD method, an MBE method, an ALD method, a PLD method, or the like.

Then, a second conductive film is formed over the gate insulating film 560. For the second conductive film, Al, Tl, Cr, Co, Ni, Cu, Y, Zr, Mo, Ru, Ag, Ta, W, or an alloy material containing any of these as its main component can be used. The second conductive film can be formed by a sputtering method or the like. After that, the second conductive film is processed to overlap with the channel formation region, so that the second gate electrode 572 is formed (see FIG. 25A).

Next, the insulating film 561 is formed over the gate insulating film 560 and the second gate electrode 572. The insulating film can be formed using a material applicable to the gate insulating film 560, by a sputtering method, a CVD method, and MBE method, an ALD method, a PLD method, or the like.

After that, a third conductive film is formed over the insulating film 561. The third conductive film can be formed using a material applicable to the second conductive material by a sputtering method or the like. Then, the third conductive film is processed to overlap with the second gate electrode 572, thereby forming the first gate electrode 571 (see FIG. 25B).

Figure 25A:
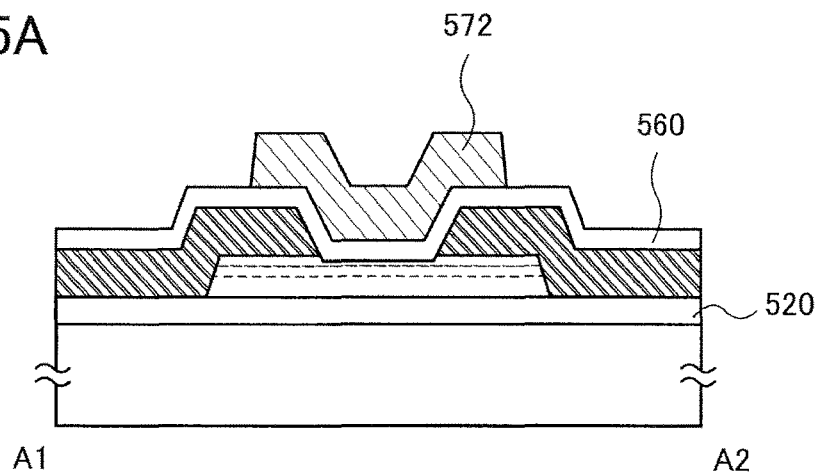
FIGS. 25A to 25C illustrate the method for manufacturing the transistor.
Figure 25B:
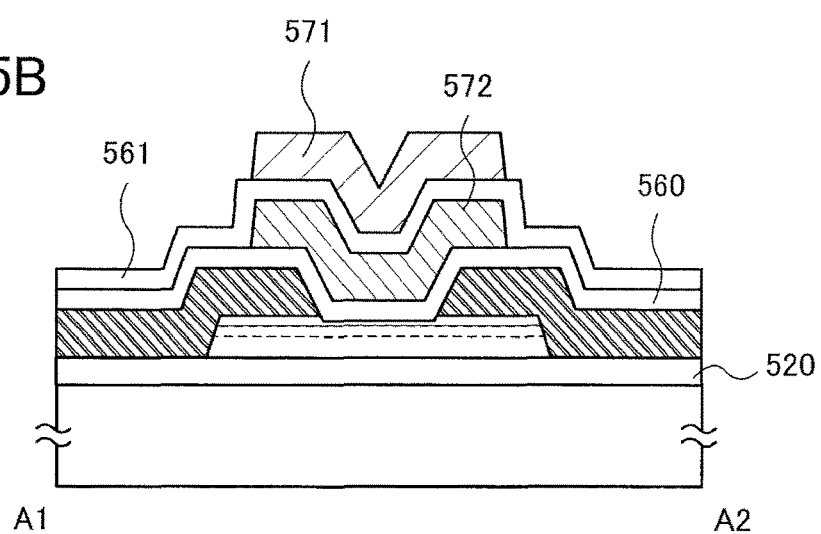
Figure 25C:
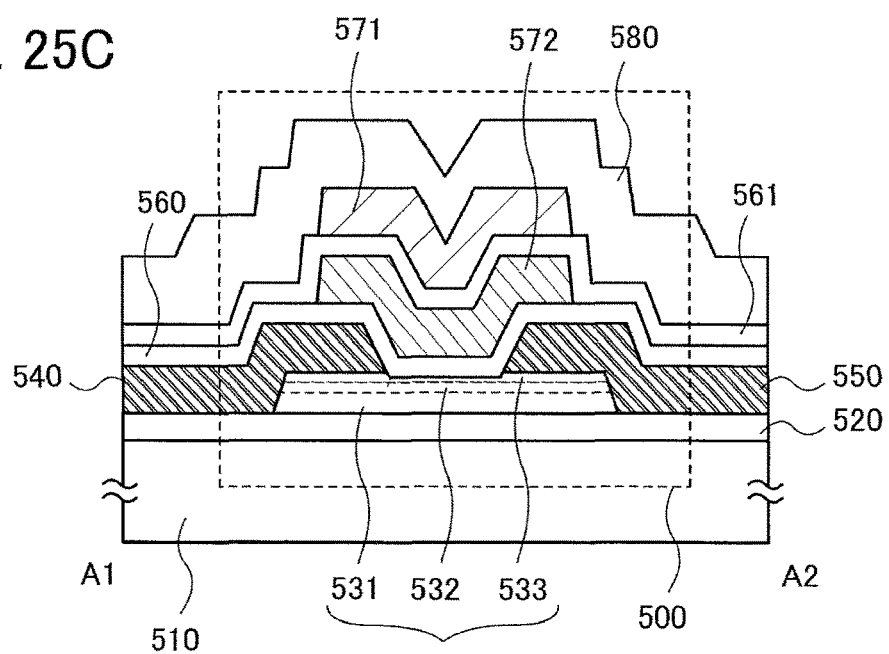

Next, the oxide insulating layer 580 is formed over the insulating film 561 and the first gate electrode 571 (see FIG. 25C). The oxide insulating layer 580 can be formed using a material applicable to the base insulating film 520 or the gate insulating film 560 by a sputtering method, a CVD method, an MBE method, an ALD method, a PLD method, or the like. The oxide insulating layer 580 preferably contains excessive oxygen so as to supply oxygen to the oxide semiconductor layer 530.

Oxygen may be added to the oxide insulating layer 580 by an ion implantation method, an ion doping method, a plasma immersion ion implantation method, or the like. By addition of oxygen, the oxide insulating layer 580 can supply oxygen much easily to the oxide semiconductor layer 530.

Next, third heat treatment is preferably performed. The third heat treatment can be performed under a condition similar to that of the first heat treatment. By the third heat treatment, excess oxygen is easily released from the base insulating film 520, the gate insulating film 560, and the oxide insulating layer 580, so that oxygen vacancies in the oxide semiconductor layer 530 can be reduced.

Through the above process, the transistor 500 illustrated in FIGS. 16A and 16B can be completed.

Various films such as the metal film disclosed in this embodiment can be formed typically by a sputtering method or a plasma CVD method; however, these films may be formed by another method such as a thermal chemical vapor deposition (CVD) method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer, as a result, a second layer is stacked over the first layer, so that a thin film is formed. The sequence of the gas introduction is repeated plural times until a desired thickness is obtained, whereby a thin film with excellent step coverage can be formed.

The thickness of the thin film can be adjusted by the number of repetition times of the sequence of the gas introduction; therefore, an ALD method makes it possible to accurately adjust a thickness and thus is suitable for manufacturing a minute FET.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

This embodiment can be combined with any of the other embodiments in this specification as appropriate.

Embodiment 6

In this embodiment, an CPU including the semiconductor device (memory device) described in Embodiment 1 will be described.

Figure 27:
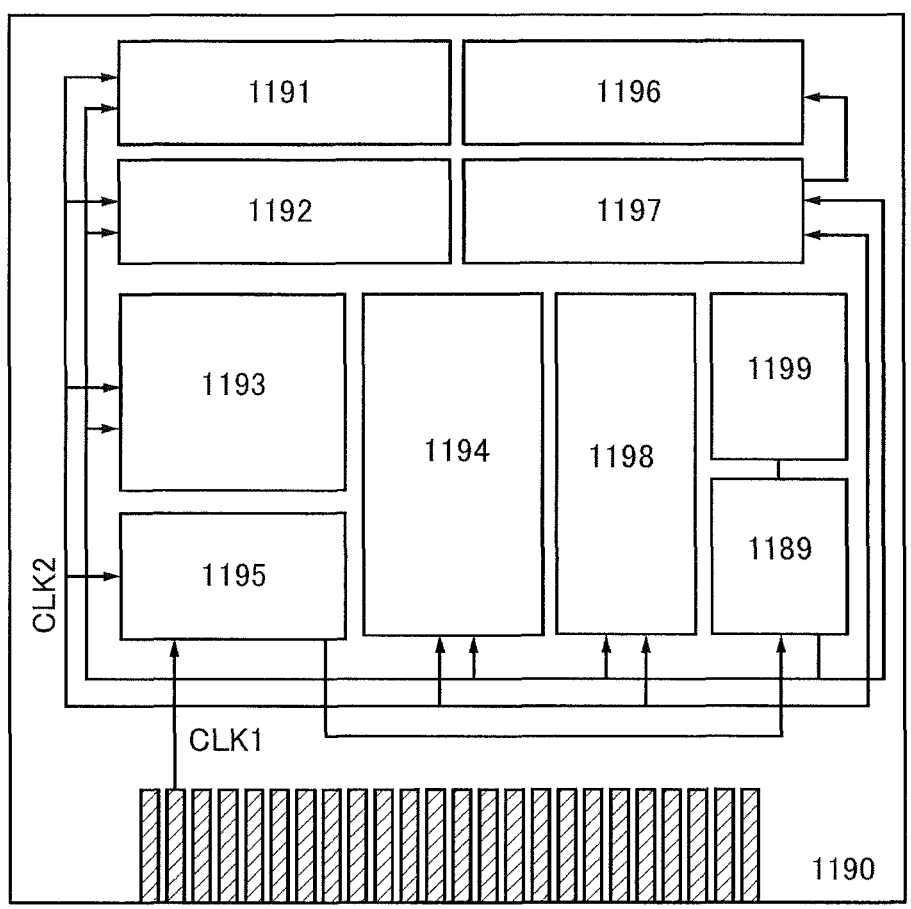
FIG. 27 is a block diagram of a semiconductor device.

FIG. 27 is a block diagram illustrating a configuration example of a CPU at least partly including the circuit 120 (e.g., the transistor 500 in Embodiment 4, or the like) described in Embodiment 1.

The CPU illustrated in FIG. 27 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example of a simplified structure, and an actual CPU may have a variety of structures depending on the application. For example, the CPU may have the following configuration: a structure including the CPU illustrated in FIG. 27 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 27, a memory cell is provided in the register 1196. For the memory cell of the register 1196, any of the transistors described in the above embodiments can be used.

In the CPU illustrated in FIG. 27, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 28:
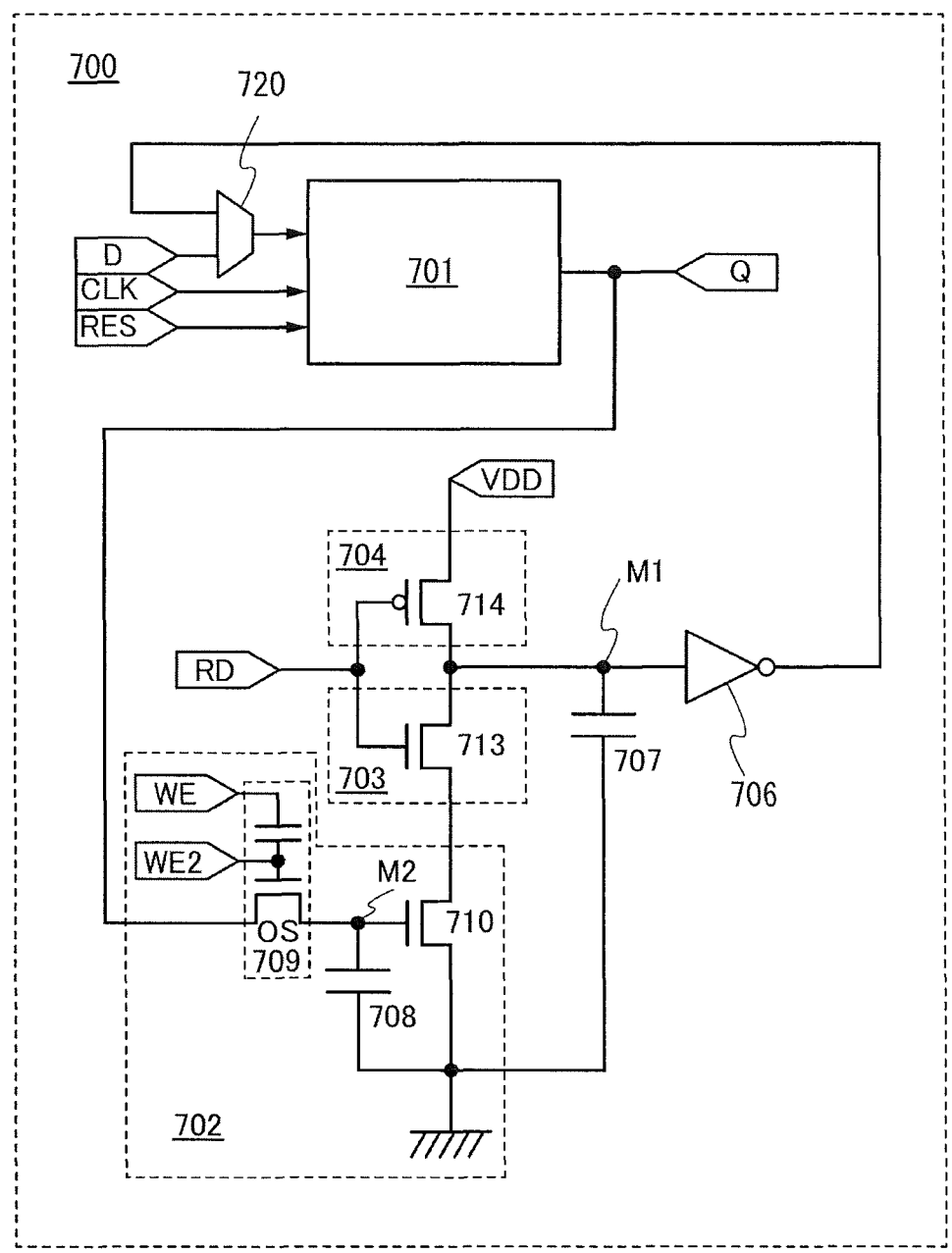
FIG. 28 is a circuit diagram of a memory device.

FIG. 28 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the storage device described in Embodiment 1 can be used as the circuit 702. When supply of the power supply voltage to the memory element 700 is stopped, a ground potential (0 V) or a potential at which the transistor 709 is turned off continues to be input to a first gate (first gate electrode) of the transistor 709. For example, the first gate of the transistor 709 is grounded through a load such as a resistor. Note that for the transistor 709, the transistor 500 described in Embodiment 4 or the like can be used, and a capacitor formed with the first gate (first gate electrode) and a second gate (second gate electrode) is also included in the transistor 709.

FIG. 28 illustrates an example in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential $V_{DD}$ is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., $V_{DD}$). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., $V_{DD}$). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 28 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 28, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 28, any of the transistors described in Embodiment 4 can be used. The control signal WE can be input to the first gate of the transistor 709 and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 can be further reduced. Note that as the transistor 709, the transistor without the second gate can be used.

Further, in FIG. 28, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor layer can be used for all the transistors used for the memory element 700. Further alternatively, in the memory element 700, a transistor in which a channel is formed in an oxide semiconductor layer can be included besides the transistor 709, and a transistor in which a channel is formed in a layer or the substrate 1190 including a semiconductor other than an oxide semiconductor can be used for the rest of the transistors.

As the circuit 701 in FIG. 28, for example, a flip-flop circuit can be used. As the logic element 706, for example, an inverter, a clocked inverter, or the like can be used.

The above is the structure of the memory element 700. Next, a driving method of the memory element 700 will be described.

A driving method of the memory element 700 in the case where the power supply voltage is supplied, the supply is stopped for a reduction in power consumption at the time of data holding, and then supplying power is performed again, is described with reference to a timing chart in FIG. 29. In the timing chart in FIG. 29, reference numeral 701 denotes data held in the circuit 701, reference symbol WE denotes the potential of the control signal WE, reference symbol WE2 denotes the potential of the control signal WE2, reference symbol RD denotes the potential of the control signal RD, reference symbol SEL denotes the potential of the control signal SEL of one path in the circuit 720, and reference symbol $V_{DD}$ denotes the power supply potential $V_{DD}$. Reference symbol M1 denotes the potential of the node M1, and reference symbol M2 denotes the potential of the node M2. Note that the one path in the circuit 720 is a path connecting the output side of the circuit 702 and the input side of the circuit 701.

In the driving method below, an example is described where, in the case of using an n-channel transistor for the switch 703 and a p-channel transistor for the switch 704 in the structure illustrated in FIG. 28, the first terminal and the second terminal of the switch 703 are brought into conduction and the first terminal and the second terminal of the switch 704 are brought out of conduction when the control signal RD has a high-level potential, and the first terminal and the second terminal of the switch 703 are brought out of conduction and the first terminal and the second terminal of the switch 704 are brought into conduction when the control signal RD has a low-level potential. Further, in this example, a first terminal and a second terminal in one path in the circuit 720 are brought into conduction when the control signal SEL has a high-level potential, and the first terminal and the second terminal therein are brought out of conduction when the control signal SEL has a low-level potential.

Furthermore, in the case of using an n-channel transistor for the transistor 709 in this example, the transistor 709 is turned on when the control signal WE has a high-level potential and the transistor 709 is turned off when the control signal WE has a low-level potential.

However, a driving method of the semiconductor device of one embodiment of the present invention is not limited to this, and in the following description, the potential of each control signal can be determined such that the switch 703, the switch 704, the circuit 720, and the transistor 709 are in the same state.

Figure 29:
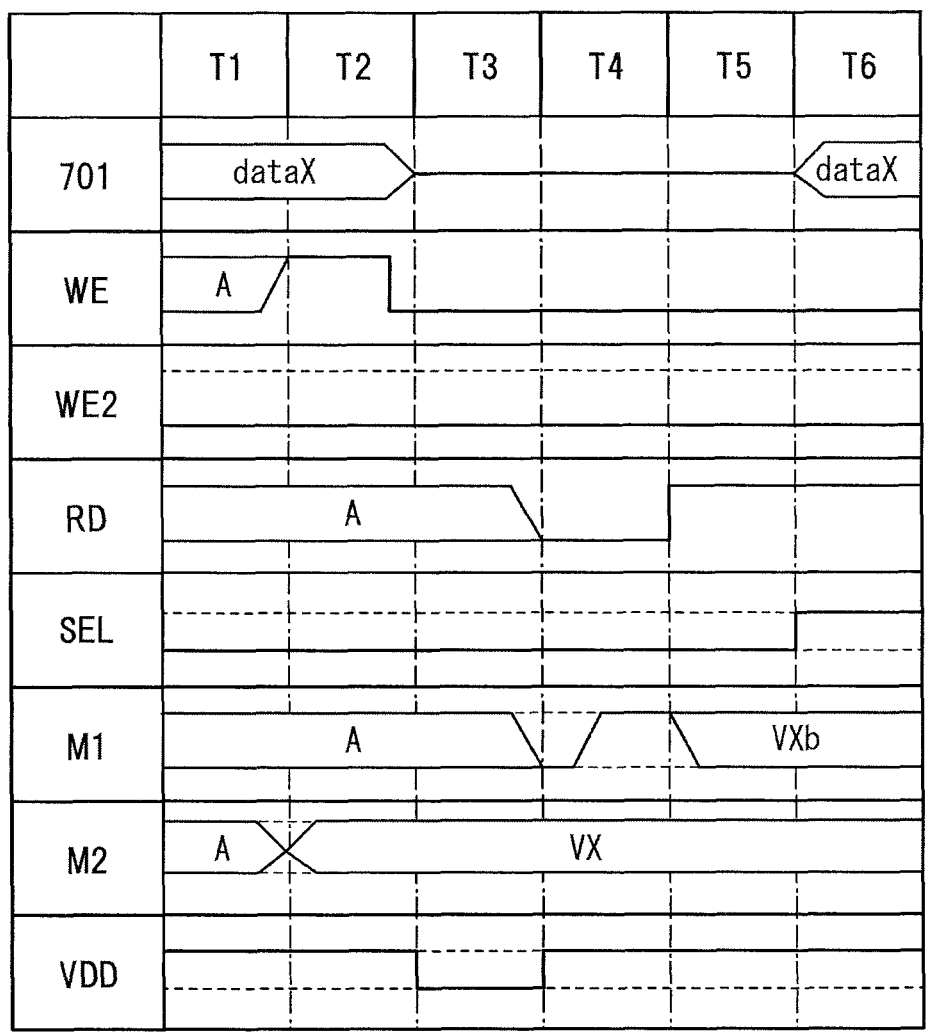
FIG. 29 is a timing chart showing operation of the memory device.

First, the operation in a period T1 in FIG. 29 is described. In T1, the power supply voltage $V_{DD}$ is supplied to the memory element 700. In a period during which the power supply voltage is supplied to the memory element 700, data (referred to as dataX in FIG. 29) is held in the circuit 701. At this time, the control signal SEL has a low-level potential so that the first terminal and the second terminal in the one path in the circuit 720 are out of conduction. Note that the first terminal and the second terminal of each of the switch 703 and the switch 704 may be in either the conduction state or the non-conduction state. That is, the control signal RD may have either a high-level potential or a low-level potential (referred to as A in FIG. 29). Further, the transistor 709 may be either on or off. That is, the control signal WE may have either a high-level potential or a low-level potential (referred to as A in FIG. 29). In T1, the node M1 may have any potential (referred to as A in FIG. 29). In T1, the node M2 may have any potential (referred to as A in FIG. 29). The operation in T1 is referred to as normal operation. The control signal WE2 has a constant potential, for example, a low level potential such as a ground potential in any period.

Next, the operation in a period T2 in FIG. 29 is described. Before supply of the power supply voltage to the memory element 700 is stopped, the control signal WE is set to a high-level potential so that the transistor 709 is turned on. Thus, a signal corresponding to data (dataX) held in the circuit 701 is input to the gate of the transistor 710 through the transistor 709. The signal input to the gate of the transistor 710 is held by the capacitor 708. In this manner, the potential of the node M2 becomes a signal potential (referred to as VX in FIG. 29) corresponding to the data held in the circuit 701. After that, the control signal WE is set to a low-level potential so that the transistor 709 is turned off. Thus, a signal corresponding to the data held in the circuit 701 is held in the circuit 702. Also in T2, the first terminal and the second terminal in the one path in the circuit 720 are kept in the non-conduction state owing to the control signal SEL. Note that the first terminal and the second terminal of each of the switch 703 and the switch 704 may be in either the conduction state or the non-conduction state. That is, the control signal RD may have either a high-level potential or a low-level potential (referred to as A in FIG. 29). In T2, the node M1 may have any potential (referred to as A in FIG. 29). The operation in T2 is referred to as operation before stop of supply of the power supply voltage.

Next, the operation in a period T3 in FIG. 29 is described. The operation before stop of supply of the power supply voltage is performed, and then, the supply of the power supply voltage to the memory element 700 is stopped at the beginning of T3. When the supply of the power supply voltage is stopped, the data (dataX) held in the circuit 701 is lost. However, even after the supply of the power supply voltage to the memory element 700 is stopped, the signal potential (VX) corresponding to the data (dataX) held in the circuit 701 is held in the node M2 by the capacitor 708. Here, as the transistor 709 in which the channel is formed in the oxide semiconductor layer, an n-channel enhancement (normally-off) transistor whose leakage current (off-state current) is extremely small is used. Therefore, since a ground potential (0 V) or a potential at which the transistor 709 is turned off continues to be input to the gate of the transistor 709 when supply of the power supply voltage to the memory element 700 is stopped, the transistor 709 can be kept in the off state even after the supply of the power supply voltage to the memory element 700 is stopped. As a result, a potential held by the capacitor 708 (the potential VX of the node M2) can be held for a long time. In this manner, even after the supply of the power supply voltage to the memory element 700 is stopped, data (dataX) is held. T3 corresponds to a period during which the supply of the power supply voltage to the memory element 700 is stopped.

Then, the operation in a period T4 in FIG. 29 is described. After the supply of the power supply voltage to the memory element 700 is restarted, the control signal RD is set to a low-level potential; thus, the first terminal and the second terminal of the switch 704 are brought into conduction and the first terminal and the second terminal of the switch 703 are brought out of conduction. At this time, the control signal WE is a low-level potential, and the transistor 709 remains off. The control signal SEL is a low-level potential, and thus the first terminal and the second terminal in the one path in the circuit 720 are in the non-conduction state. In this manner, $V_{DD}$ is input to the second terminal of the switch 703 and the first terminal of the switch 704. Therefore, the second terminal of the switch 703 and the first terminal of the switch 704 (the potential of the node M1) can be set to a constant potential (here, $V_{DD}$). The operation in T4 is referred to as pre-charge operation. The potential of the node M1 is held by the capacitor 707.

After the above pre-charge operation, in a period T5, the control signal RD is set to a high-level potential; thus, the first terminal and the second terminal of the switch 703 are brought into conduction and the first terminal and the second terminal of the switch 704 are brought out of conduction. At this time, the control signal WE is kept at a low-level potential, and the transistor 709 remains off. The control signal SEL is a low-level potential, and thus the first terminal and the second terminal in the one path in the circuit 720 are in the non-conduction state. Depending on a signal held in the capacitor 708 (the potential VX of the node M2), the on/off state of the transistor 710 is selected, and the potential of the second terminal of the switch 703 and the first terminal of the switch 704, i.e., the potential of the node M1 is determined. In the case where the transistor 710 is on, the low power supply potential (e.g., GND) is input to the node M1. On the other hand, in the case where the transistor 710 is off, the potential of the node M1 is kept at a constant potential (e.g., $V_{DD}$) which is determined by the above pre-charge operation. In this manner, depending on the on state or the off state of the transistor 710, the potential of the node M1 becomes $V_{DD}$ or GND. For example, in the case where a signal held in the circuit 701 is "1" and corresponds to a high-level signal ($V_{DD}$), the potential of the node M1 becomes a low-level potential (GND) corresponding to a signal "0". On the other hand, in the case where a signal held in the circuit 701 is "0" and corresponds to a low-level potential (GND), the potential of the node M1 becomes a high-level potential ($V_{DD}$) corresponding to a signal "1". That is, an inverted signal of a signal held in the circuit 701 is held in the node M1. This potential is denoted as VXb in FIG. 29. That is, a signal corresponding to the data (dataX) input from the circuit 701 in T2 is converted into the potential of the node M1 (VXb).

After that, in a period T6, the control signal SEL is set to a high-level potential, so that the first terminal and the second terminal in the one path in the circuit 720 are brought into conduction. At this time, the control signal RD is kept at a high-level potential. The control signal WE is kept at a low-level potential, and thus the transistor 709 remains off. Consequently, the phase of a signal corresponding to the potential of the second terminal of the switch 703 and the first terminal of the switch 704 (the potential of the node M1 (VXb)) is inverted through the logic element 706, and this inverted signal can be input to the circuit 701. In this manner, the data which has been held before the stop of supplying the power supply voltage to the memory element 700 (dataX) can be held in the circuit 701 again.

The potential of the node M1 is set to a constant potential ($V_{DD}$ in FIG. 29) by the pre-charge operation in T4, and becomes the potential VXb corresponding to the data (dataX) in T5. Since the pre-charge operation is performed, the time required for the potential of the node M1 to be set to the constant potential VXb can be shortened. In this manner, the time required for the circuit 701 to hold original data again after the supply of the power supply voltage is restarted can be shortened.

The above is the driving method of the memory element.

In the driving method of the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor layer is extremely low. For example, the off-state current of a transistor whose channel is formed in an oxide semiconductor layer is much lower than that of a transistor whose channel is formed in crystalline silicon. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the CPU is given as an example, the transistor can also be applied to an LSI such as a digital signal processor (DSP), a custom LSI, or a field programmable gate array (FPGA).

Embodiment 7

In this embodiment, examples of electronic devices which can use any of the semiconductor devices described in Embodiments 1 to 6 will be described.

The semiconductor devices described in Embodiment 1 to Embodiment 6 can be applied to a wide variety of electronic devices (including amusement machines). Examples of the electronic devices include display devices of televisions, monitors, and the like, lighting devices, personal computers, word processors, image reproduction devices, portable audio players, radios, tape recorders, stereos, phones, cordless phones, mobile phones, car phones, transceivers, wireless devices, game machines, calculators, portable information terminals, electronic notebooks, e-book readers, electronic translators, audio input devices, video cameras, digital still cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipments such as dialyzers and X-ray diagnostic equipments. In addition, the examples of the electronic devices include alarm devices such as smoke detectors, heat detectors, gas alarm devices, and security alarm devices. Further, the examples include industrial equipment such as guide lights, traffic lights, belt conveyors, elevators, escalators, industrial robots, and power storage systems. In addition, moving objects and the like driven by fuel engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Some specific examples of these electronic devices are illustrated in FIGS. 30A to 30C.

Figure 30A:
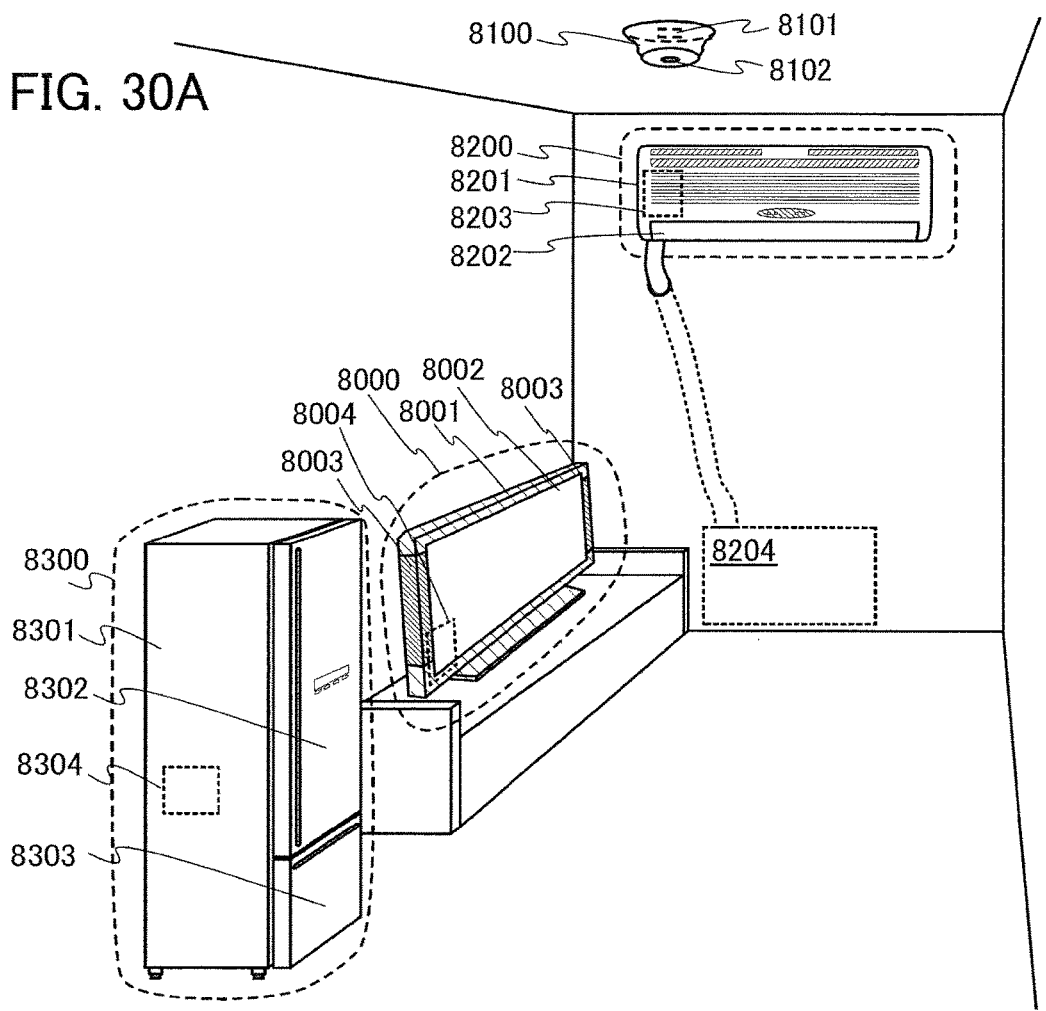
FIGS. 30A to 30C illustrate electronic devices to which semiconductor devices can be applied.
Figure 30B:
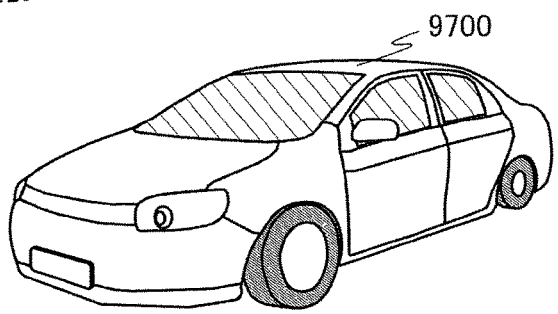
Figure 30C:
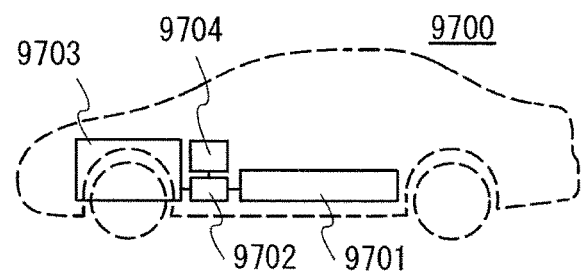

In a television set 8000 illustrated in FIG. 30A, a display portion 8002 is incorporated in a housing 8001. The display portion 8002 can display an image and a speaker portion 8003 can output sound. A memory device including a semiconductor device which is one embodiment of the present invention can be used for a driver circuit for operating the display portion 8002.

In addition, the television set 8000 may include a CPU 8004 for performing information communication or a memory. For the CPU 8004 and a memory, a CPU and a memory each of which includes the semiconductor device of one embodiment of the present invention can be used.

An alarm device 8100 illustrated in FIG. 30A is a residential fire alarm. The alarm device 8100 includes a sensor portion 8102 for smoke or heat and a microcomputer 8101. A CPU or a memory device including the semiconductor device that is one embodiment of the present invention can be used for the microcomputer 8101.

An air conditioner which includes an indoor unit 8200 and an outdoor unit 8204 illustrated in FIG. 30A is an example of an electronic device including the semiconductor device described in any of the above embodiments. Specifically, the indoor unit 8200 includes a housing 8201, an air outlet 8202, a CPU 8203, and the like. Although the CPU 8203 is provided in the indoor unit 8200 in FIG. 30A, the CPU 8203 may be provided in the outdoor unit 8204. Alternatively, the CPU 8203 may be provided in both the indoor unit 8200 and the outdoor unit 8204. By using any of the semiconductors described in the above embodiments for the air conditioner, a reduction in power consumption of the air conditioner can be achieved.

An electronic refrigerator-freezer 8300 illustrated in FIG. 30A is an example of an electronic device including the semiconductor device described in any of the above embodiments. Specifically, the electric refrigerator-freezer 8300 includes a housing 8301, a door for a refrigerator 8302, a door for a freezer 8303, a CPU 8304, and the like. In FIG. 30A, the CPU 8304 is provided in the housing 8301. By using any of the semiconductors described in the above embodiments for the electric refrigerator-freezer 8300, a reduction in power consumption of the electric refrigerator-freezer can be achieved.

FIGS. 30B and 30C illustrate an example of an electronic vehicle which is an example of an electronic device. An electric vehicle 9700 is equipped with a secondary battery 9701. The output of the electric power of the secondary battery 9701 is adjusted by a circuit 9702 and the electric power is supplied to a driving device 9703. The circuit 9702 is controlled by a processing unit 9704 including a ROM, a RAM, a CPU, or the like which is not illustrated. By using any of the semiconductors described in the above embodiments for the electric vehicle 9700, power consumption of the electric vehicle can be reduced.

The driving device 9703 includes a DC motor or an AC motor either alone or in combination with an internal-combustion engine. The processing unit 9704 outputs a control signal to the circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments in this specification as appropriate.

This application is based on Japanese Patent Application serial no. 2013-030587 filed with Japan Patent Office on Feb. 20, 2013, the entire contents of which are hereby incorporated by reference.

What is claimed is:

1. A semiconductor device comprising:
a first transistor comprising a first gate electrode, a first semiconductor layer, a first source electrode, and a first drain electrode, the first transistor being diode-connected; and
a second transistor comprising a second gate electrode, a third gate electrode, a second semiconductor layer between the second gate electrode and the third gate electrode, a second source electrode, and a second drain electrode;
wherein each of the first gate electrode and one of the first source electrode and the first drain electrode is electrically connected to the second gate electrode,
wherein the first semiconductor layer is an oxide semiconductor layer,
wherein the second semiconductor layer is formed using silicon, and
wherein the first transistor has a smaller off current than the second transistor.

2. A semiconductor device comprising:
a first transistor comprising a first gate electrode, a first semiconductor layer, a first source electrode, and a first drain electrode, the first transistor being diode-connected, and
a second transistor comprising a second gate electrode, a third gate electrode, a second semiconductor layer between the second gate electrode and the third gate electrode, a second source electrode, and a second drain electrode;
wherein each of the first gate electrode and one of the first source electrode and the first drain electrode is directly connected to the second gate electrode,
wherein the first semiconductor layer is an oxide semiconductor layer,
wherein the second semiconductor layer is formed using silicon, and
wherein the first transistor has a smaller off current than the second transistor.

3. A semiconductor device comprising:
a first transistor comprising a first gate electrode, a first semiconductor layer, a first source electrode, and a first drain electrode, the first transistor being diode-connected;
a second transistor comprising a second gate electrode, a third gate electrode, a second semiconductor layer between the second gate electrode and the third gate electrode, a second source electrode, and a second drain electrode;
a third transistor comprising a fourth gate electrode, a third source electrode, a third drain electrode, and a third semiconductor layer; and
a capacitor comprising a first capacitor electrode and a second capacitor electrode,
wherein each of the first gate electrode and one of the first source electrode and the first drain electrode is electrically connected to the second gate electrode,
wherein one of the second source electrode and the second drain electrode, the fourth gate electrode, and the first capacitor electrode are electrically connected to each other,
wherein the first semiconductor layer is an oxide semiconductor layer,
wherein the second semiconductor layer is formed using silicon, and
wherein the first transistor has a smaller off current than the second transistor.

4. The semiconductor device according to claim 3,
wherein the one of the second source electrode and the second drain electrode, the fourth gate electrode, and the first capacitor electrode form a node.

5. The semiconductor device according to claim 3,
wherein the first gate electrode and one of the first source electrode and the second drain electrode are each directly connected to the second gate electrode.

6. The semiconductor device according to claim 3,
wherein the other one of the second source electrode and the second drain electrode and one of the third source electrode and the third drain electrode are electrically connected to a wiring.

7. The semiconductor device according to claim 3,
wherein the other one of the second source electrode and the second drain electrode and one of the third source electrode and the third drain electrode are directly connected to a wiring.

8. The semiconductor device according to claim 3,
wherein both the second semiconductor layer and the third semiconductor layer are formed using silicon.

9. The semiconductor device according to claim 1, wherein the second transistor is comprised in a memory cell.

10. The semiconductor device according to claim 2, wherein the second transistor is comprised in a memory cell.

11. The semiconductor device according to claim 3, wherein the second transistor, the third transistor, and the capacitor are comprised in a memory cell.

12. The semiconductor device according to claim 1, the semiconductor device being part of a CPU.

13. The semiconductor device according to claim 2, the semiconductor device being part of a CPU.

14. The semiconductor device according to claim 3, the semiconductor device being part of a CPU.

* * * * *